(12) United States Patent
Toda

(10) Patent No.: US 7,545,693 B2
(45) Date of Patent: Jun. 9, 2009

(54) SEMICONDUCTOR MEMORY DEVICE

(75) Inventor: Haruki Toda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 148 days.

(21) Appl. No.: 11/832,987

(22) Filed: Aug. 2, 2007

(65) Prior Publication Data

US 2008/0037328 A1    Feb. 14, 2008

(30) Foreign Application Priority Data

Aug. 14, 2006   (JP) ............................ 2006-221195

(51) Int. Cl.
*G11C 7/00* (2006.01)
(52) U.S. Cl. ...................... 365/205; 365/154
(58) Field of Classification Search ................. 365/205, 365/154, 207
See application file for complete search history.

(56) References Cited

U.S. PATENT DOCUMENTS

| | | | | |
|---|---|---|---|---|
| 5,963,495 A * | 10/1999 | Kumar | .................... | 365/207 |
| 6,195,289 B1 | 2/2001 | Pasotti et al. | | |
| 6,438,035 B2 | 8/2002 | Yamamoto et al. | | |
| 6,862,208 B2 * | 3/2005 | Palmer et al. | ................ | 365/154 |
| 7,136,308 B2 * | 11/2006 | Kant et al. | ............. | 365/189.16 |
| 2006/0050562 A1 | 3/2006 | Cernea et al. | | |
| 2006/0239073 A1 | 10/2006 | Toda | | |
| 2007/0019467 A1 | 1/2007 | Toda | | |
| 2007/0121376 A1 | 5/2007 | Toda | | |
| 2007/0147112 A1 | 6/2007 | Edahiro et al. | | |
| 2007/0165473 A1 | 7/2007 | Suzuki et al. | | |

* cited by examiner

*Primary Examiner*—Anh Phung
(74) *Attorney, Agent, or Firm*—Oblon, Spivak, McClelland, Maier & Neustadt, P.C.

(57) ABSTRACT

A memory device including a memory cell array with information cells and reference cells arranged and a sense amplifier configured to sense data stored in the memory cell array, wherein the sense amplifier has a latch-type of differential amplifier configured to detect a current difference between a selected information cell and a selected reference cell, a pair of transistors attached to the differential amplifier, the pair of transistors being on-driven to keep the differential amplifier inactive in a stationary state and off-driven to make the differential amplifier active at a sensing time, whereby the current difference is amplified as a drain voltage difference of the pair of transistors, and a pair of capacitors hold voltages corresponding to the respective currents of two current paths of the differential amplifier prior to inputting the current difference, and apply a certain offset voltage to the pair of transistors at the sensing time.

20 Claims, 66 Drawing Sheets

| Level | (HB, LB) | T1 | T2 | T3 |
|---|---|---|---|---|
| L3 | (0, 0) | 0 | 0 | 0 |
| L2 | (0, 1) | 0 | 1 | 0 |
| L1 | (1, 1) | 1 | 1 | 0 |
| L0 | (1, 0) | 1 | 1 | 1 |

| WL level | | P2 | P3 |
|---|---|---|---|
| Vth | Pre. DLl | B | B |
| L3 | 0 | 0 | 1 |
| L3 | 1 | 1>0 | 1 |
| L2 | 0 | 1 | 1 |
| L1 | 0 | 1 | 0 |
| L1 | 1 | 1 | 1>0 |
| L0 | 0 | 1 | 1 |

FIG. 43A

State (A) – previous verify data

| DLl | DLr | |
|---|---|---|
| 0 | 0 | } Level C Write |
| 1 | 0 | |
| 0 | 1 | } Level A Write |
| 1 | 1 | |

FIG. 43B

State (B) – reduced verify

| DLl | DLr | |
|---|---|---|
| 0 | 0 | |
| 1 | 0 | |
| 0 | 0 | P3 Verify Pass |
| 0 | 1 | P3* Verify Pass, P3 Verify Fail |
| 1 | 1 | P3* Verify Fail |

FIG. 43C

State (C) – Vdd* to BL

| BL | DLl | DLr |
|---|---|---|
| Vdd* | 0 | 0 |
| Vss | 1 | 0 |
| Vdd* | 0 | 0 |
| Vdd* | 0 | 1 |
| Vss | 1 | 1 |

FIG. 43D

State (D) – Vdd to BL (1st)

| BL | DLl | X | /B | BL | B | X | B | DLr |
|---|---|---|---|---|---|---|---|---|
| Vdd* | 0 → | 0 → | 1 | Vdd ← | 0 ← | 0 ← | 1 ← | 0 |
| Vss | 1 | | | | | | | 0 |
| Vdd* | 0 | | | | | | | 0 |
| Vdd* | 0 | | | | | | | 1 |
| Vss | 1 | | | | | | | 1 |

FIG. 43E

State (E) – Vdd to BL (2nd)

| BL | DLl | X | /B | BL | B | X | B | DLr |
|---|---|---|---|---|---|---|---|---|
| Vdd* | 0 | | | Vdd | | | | 0 |
| Vss | 1 → | 1 → | 1 | Vss ← | 1 ← | 1 ← | 1 ← | 0 |
| Vdd* | 0 | | | | | | | 0 |
| Vdd* | 0 | | | | | | | 1 |
| Vss | 1 | | | | | | | 1 |

FIG. 43F

State (F) – Vdd to BL (3rd)

| BL | DLl | X | /B | BL | B | X | B | DLr |
|---|---|---|---|---|---|---|---|---|
| Vdd* | 0 | | | Vdd | | | | 0 |
| Vss | 1 | | | Vss | | | | 0 |
| Vdd* | 0 → | 0 → | 1 | Vdd ← | 0 ← | 0 ← | 1 ← | 0 |
| Vdd* | 0 | | | | | | | 1 |
| Vss | 1 | | | | | | | 1 |

FIG. 43G
State (G) – Vdd to BL (4th)

| BL | DLl | X | /B | BL | B | X | B | DLr |
|---|---|---|---|---|---|---|---|---|
| Vdd* | 0 | | | Vdd | | | | 0 |
| Vss | 1 | | | Vss | | | | 0 |
| Vdd* | 0 | | | Vdd | | | | 0 |
| Vdd* | 0 → | 0 → | 1 | Vdd* ← 1 | ← 1 | ← 0 | ← 1 | |
| Vss | 1 | | | | | | | 1 |

FIG. 43H
State (H) – Vdd to BL (5th)

| BL | DLl | X | /B | BL | B | X | B | DLr |
|---|---|---|---|---|---|---|---|---|
| Vdd* | 0 | | | Vdd | | | | 0 |
| Vss | 1 | | | Vss | | | | 0 |
| Vdd* | 0 | | | Vdd | | | | 0 |
| Vdd* | 0 | | | Vdd* | | | | 1 |
| Vss | 1 → | 1 → | 1 | Vss ← 1 | ← 1 | ← 1 | ← 1 | |

FIG. 51A

State (A) – previous verify data

| DLl | DLr | |
|---|---|---|
| 0 | 1 | } Level C Write |
| 1 | 1 | |
| 0 | 0 | } Level A Write |
| 1 | 0 | |

FIG. 51B

State (B) – reduced verify

| DLl | DLr | |
|---|---|---|
| 0 | 0 | P2 Verify Pass |
| 0 | 1 | P2* Verify Pass, P2 Verify Fail |
| 1 | 1 | P2* Verify Fail |
| 0 | 0 | |
| 1 | 0 | |

FIG. 51C

State (C) – Vdd* to BL

| BL | DLl | DLr |
|---|---|---|
| Vdd* | 0 | 0 |
| Vdd* | 0 | 1 |
| Vss | 1 | 1 |
| Vdd* | 0 | 0 |
| Vss | 1 | 0 |

FIG. 51D

State (D) – Vdd to BL (1st)

| BL | DLl | X | /B | BL | B | X | B | DLr |
|---|---|---|---|---|---|---|---|---|
| Vdd* | 0 → | 0 → | 1 | Vdd ← | 0 ← | 0 ← | 1 ← | 0 |
| Vdd* | | | | | | | | |
| Vss | | | | | | | | |
| Vdd* | | | | | | | | |
| Vss | | | | | | | | |

FIG. 51E

State (E) – Vdd to BL (2nd)

| BL | DLl | X | /B | BL | B | X | B | DLr |
|---|---|---|---|---|---|---|---|---|
| Vdd* | | | | Vdd | | | | 0 |
| Vdd* | 0 → | 0 → | 1 | Vdd* ← | 1 ← | 1 ← | 0 ← | 1 |
| Vss | | | | | | | | 1 |
| Vdd* | | | | | | | | 0 |
| Vss | | | | | | | | 0 |

FIG. 51F

State (F) – Vdd to BL (3rd)

| BL | DLl | X | /B | BL | B | X | B | DLr |
|---|---|---|---|---|---|---|---|---|
| Vdd* | | | | Vdd | | | | 0 |
| Vdd* | | | | Vdd* | | | | 1 |
| Vss | 1 → | 1 → | 1 | Vss ← | 1 ← | 1 ← | 0 ← | 1 |
| Vdd* | | | | | | | | 0 |
| Vss | | | | | | | | 0 |

FIG. 51G
State (G) – Vdd to BL (4th)

| BL | DLl | X | /B | BL | B | X | B | DLr |
|---|---|---|---|---|---|---|---|---|
| Vdd* | 0 | | | Vdd | | | | 0 |
| Vss | 0 | | | Vdd* | | | | 1 |
| Vdd* | 1 | | | Vss | | | | 1 |
| Vdd* | 0 → | 0 → | 1 | Vdd ← | 0 ← | 0 ← | 1 ← | 0 |
| Vss | 1 | | | | | | | 0 |

FIG. 51H
State (H) – Vdd to BL (5th)

| BL | DLl | X | /B | BL | B | X | B | DLr |
|---|---|---|---|---|---|---|---|---|
| Vdd* | 0 | | | Vdd | | | | 0 |
| Vss | 0 | | | Vdd* | | | | 1 |
| Vdd* | 1 | | | Vss | | | | 1 |
| Vdd* | 0 | | | Vdd | | | | 0 |
| Vss | 1 → | 1 → | 1 | Vss ← | 1 ← | 1 ← | 1 ← | 0 |

FIG. 59

|    |    | First step |   |   | Second step |   |   |
|----|----|-----|---|---|-----|---|---|
| HB | LB | DLr (R2) | X |   | SD (R3) |   | DLl |
| 0  | 0  | 1 | → | 0 | 0 | → | 0 |
| 0  | 1  | 0 | → | 1 | 0 | → | 1 |
| 1  | 1  | 0 | → | 1 | 0 | → | 1 |
| 1  | 0  | 0 | → | 1 | 1 | → | 0 |

FIG. 60

|    |    | First step |   |   | Second step |   |   |
|----|----|-----|---|---|-----|---|---|
| HB | LB | DLr (R3) | X |   | SD (R2) |   | DLl |
| 0  | 0  | 1 | → | 0 | 0 | → | 0 |
| 0  | 1  | 1 | → | 0 | 1 | → | 1 |
| 1  | 1  | 1 | → | 0 | 1 | → | 1 |
| 1  | 0  | 0 | → | 1 | 1 | → | 0 |

LB Data Page Copy

| Copy Destination Data | | DLI | | | |
|---|---|---|---|---|---|
| HB | LB | (HB+X) | X | | DLr |
| 0 | 0 | 1 | 1 | ← | 0 |
| 0 | 1 | 0 | 0 | ← | 1 |
| 1 | 1 | 1 | 0 | ← | 1 |
| 1 | 0 | 0 | 1 | ← | 0 |

# SEMICONDUCTOR MEMORY DEVICE

CROSS-REFERENCE TO RELATED APPLICATION

This application is based on and claims the benefit of priority from the prior Japanese Patent Application No. 2006-221195, filed on Aug. 14, 2006, the entire contents of which are incorporated herein by reference.

BACKGROUND OF THE INVENTION

1. Field of the Invention

This invention relates to a semiconductor memory device with a current-sensing type of sense amplifier.

2. Description of the Related Art

EEPROM flash memories are classified in general into NAND-type and NOR-type ones. A NAND-type flash memory is formed of NAND strings (i.e., NAND cell units) each having plural memory cells connected in series in such a way that adjacent cells share a source/drain diffusion layer. Therefore, the cell density is made higher than that of a NOR-type one. Besides the NAND-type flash memory has a feature with low power consumption because plural memory cells may be written in a lump by use of FN tunnel current. Considering these features, the NAND-type flash memory is mainly applied to a file memory with a large capacity.

By contrast, since a NOR-type flash memory has, in spite of the large power consumption, a possibility of high speed access, it is mainly applied to mobile apparatuses.

Recently, however, a mobile apparatus tends to deal with an image data and the like with a large quantity of data. Therefore it is required of the mobile apparatus to contain a flash memory which has a high-speed performance and a large capacity with the same level as a file memory. Accordingly, to adapt a NAND-type flash memory to a high-speed system with a buffer memory such as DRAMs, there has been provided a method of improving the data transmission rate, in which, for example, cell data is read out to a page buffer and then serially transferred and output.

Even the above-described method is used, there is a limit for improving the speed of the NAND-type flash memory because cell current thereof is one several tenth of that of a NOR-type flash memory, so that it is difficult to sense data at a high rate as in the NOR-type flash memory with a reference level. The sense amplifier used in a NAND-type flash memory sensing cell data with detecting whether the bit line voltage is discharged or not in accordance with cell data, it takes a time by the micro second for data-sensing.

For the purpose of making possible to store a large quantity of data, there has been provided a flash memory with a multi-value data storage scheme. Further, there has been provided a method of reducing the read time by reducing the read number in the multi-value data storage scheme (for example, refer to JP-P2001-93288A).

Further, there has been provided a memory device with a multi-level data storage scheme, in which two memory cells connected to a pair of bit lines constitute a pair cell, and multi-level data is stored as been defined by a combination of different threshold voltages in the pair cell (for example, refer to JP-P2003-111960A).

SUMMARY OF THE INVENTION

According to an aspect of the present invention, there is provided a semiconductor memory device including: a memory cell array with electrically rewritable memory cells arranged therein, the memory cells being defined as information cells and reference cells in which a data level and a reference level are set, respectively; and a sense amplifier configured to sense data stored in the memory cell array, wherein
the sense amplifier includes:
a latch-type of differential amplifier configured to detect a current difference between a selected information cell and a selected reference cell in the memory cell array;
a pair of transistors attached to the differential amplifier, the pair of transistors being on-driven to keep the differential amplifier inactive in a stationary state and off-driven to make the differential amplifier active at a sensing time, whereby the current difference is amplified as a drain voltage difference of the pair of transistors; and
a pair of capacitors coupled to the pair of transistors to hold voltages corresponding to the respective currents of two current paths of the differential amplifier prior to inputting the current difference, and apply a certain offset voltage to the pair of transistors at the sensing time.

According to another aspect of the present invention, there is provided a semiconductor memory device including: a first and second cell arrays with electrically rewritable memory cells arranged therein, main parts of each cell array being defined as information cells and others as reference cells; a sense amplifier disposed for plural bit line pairs of first and second bit lines in the first and second cell arrays to sequentially sense data of the bit line pairs; first and second data registers configured to store write data to be written into the first and second cell array; and first and second data relaying nodes disposed for serially transferring write data to the first or second data registers from the external, and for serially transferring data sequentially read in the sense amplifier from the bit line pairs to the external, wherein
the sense amplifier includes:
a latch-type of differential amplifier configured to detect a current difference between a selected information cell and a selected reference cell in the memory cell array;
a pair of transistors attached to the differential amplifier, the pair of transistors being on-driven to keep the differential amplifier inactive in a stationary state and off-driven to make the differential amplifier active at a sensing time, whereby the current difference is amplified as a drain voltage difference of the pair of transistors; and
a pair of capacitors coupled to the pair of transistors to hold voltages corresponding to the respective currents of two current paths of the differential amplifier prior to inputting the current difference, and apply a certain offset voltage to the pair of transistors at the sensing time.

BRIEF DESCRIPTION OF THE DRAWINGS

FIGS. 43A to 43H show a data state transition at an LB data write with A-QPW.

FIGS. 51A to 51H show a data state transition at an LB data write time with C-QPW.

FIG. 59 shows a data transition state of the read LB data in case the read voltages are R2 and R3 at the first and second read steps.

FIG. 60 shows a data transition state of the read LB data in case the read voltages are R3 and R2 at the first and second read steps.

DETAILED DESCRIPTION OF THE EMBODIMENTS

Figure 1:
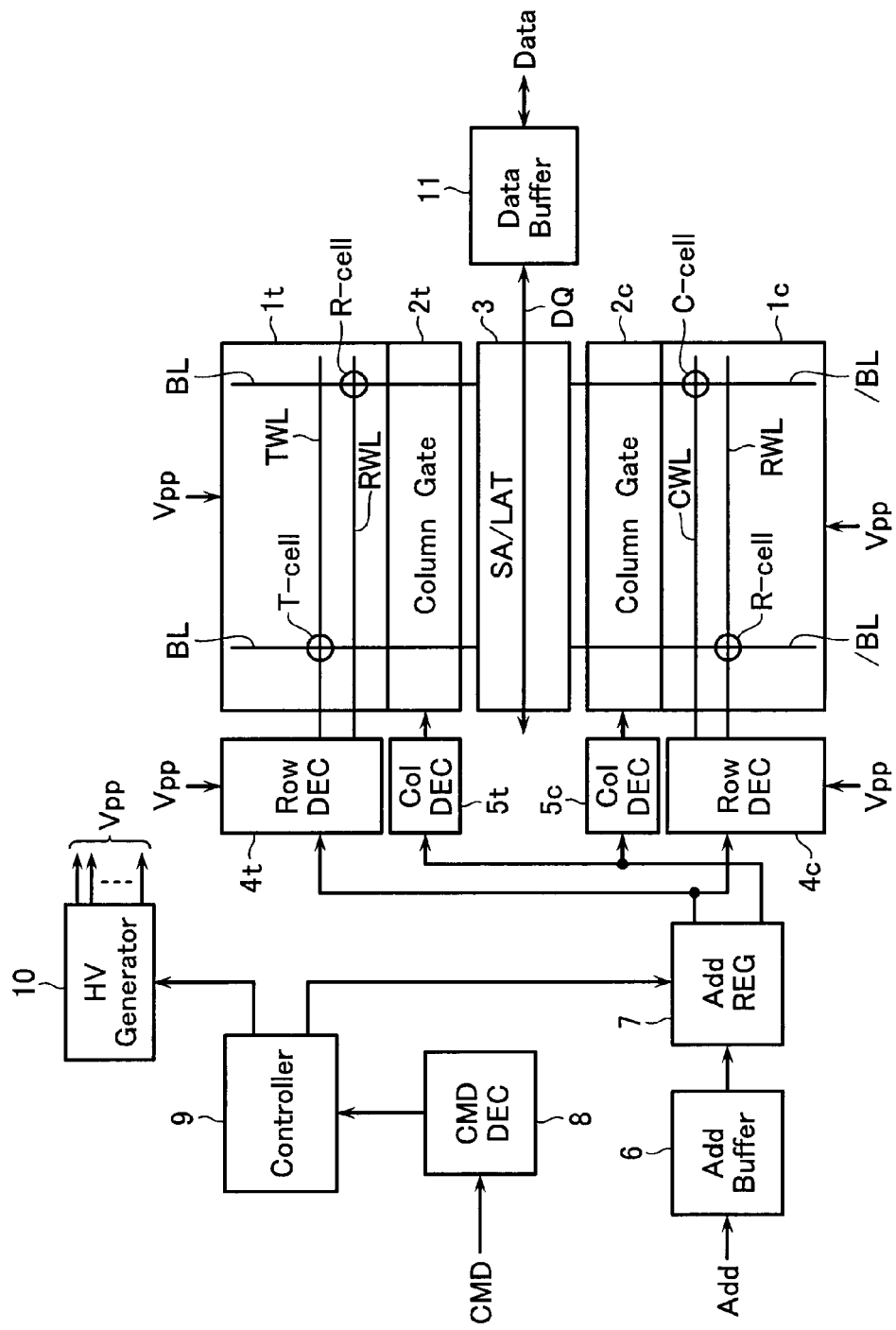
FIG. 1 shows a flash memory chip configuration in accordance with an embodiment of the present invention.

Illustrative embodiments of this invention will be explained with reference to the accompanying drawings below.

In a semiconductor memory device in accordance with this embodiment, the main portion of the memory cell array is set as an area of "information cells", into each of which one of plural physical quantity levels (i.e., data levels) is written while the remaining portion is set as an area of "reference cell(s)", into which a fixed physical quantity level (i.e., reference level) is written for serving for detecting the data levels. In detail, there are provided first and second cell arrays, in each of which plural information cells and at least one reference cell are prepared. At a read time, an information cell is selected from one of the first and second cell arrays while a reference cell is selected from the other.

A sense amplifier, which detects a data level of an information cell with reference to the reference level of a reference cell, is formed as a current-sensing type one. That is, it is a latch type of differential amplifier configured to amplify an unbalance of two current paths thereof due to a current difference between a selected information cell and a selected reference cell in such a way that the unbalance is amplified as a drain voltage difference of a pair of transistors disposed for shutting the two current paths. In the sense amplifier in accordance with the present invention, there are so provided a pair of capacitors coupled to the pair of transistors as to hold voltages corresponding to the respective currents of the two current paths prior to inputting cell currents of the selected information cell and the selected reference cell to the transistors, and apply such an offset voltage to the transistors at a sensing time as to reduce the influence of a current unbalance due to device characteristics in the current paths.

In this embodiment, multiple bit line pairs share one sense amplifier, and there are prepared data registers corresponding to the bit lines, respectively, on which data write operations are performed simultaneously. In detail, first and second data latches are disposed for storing write data on the first and second bit lines of the first and second cell array, respectively, and share a sense amplifier. Further disposed with respect to a sense amplifier are first and second data relaying nodes, which constitute a pair.

At a read time, bit lines are sequentially selected and coupled to the sense amplifier, so that the bit line data are sequentially sensed. The sensed data are sequentially stored in the first, multiple data latches (or the second, multiple data latches) via the first data relaying node (or the second data relaying node), and then serially transferred and output to a data line via the first data relaying node (or the second data relaying node).

At a write time, write data serially supplied from the data line are sequentially loaded in the first, multiple data registers (or the second, multiple data registers) via the first data relaying node (or the second data relaying node). These write data stored in the first data registers (or the second data registers) are collectively written into multiple memory cells via the first, multiple bit lines (or the second, multiple bit lines).

While in the embodiment described below, a four-level data storage scheme is used, the present invention is not limited to it. In case of a four-value data storage scheme, an information cell is set to have a data level selected in L0, L1, L2 and L3 (where L0<L1<L2<L3) while reference level Lr of a reference cell is set preferably as follows: L0<Lr<L1.

In the embodiment described below, cell's threshold voltage levels are used as the physical quantity levels (data levels).

[Flash Memory Configuration]

FIG. 1 shows a NAND-type flash memory configuration in accordance with an embodiment. A memory cell array 1 is divided into two cell arrays 1$t$ and 1$c$, which share a sense amplifier circuit 3. In this cell array configuration, it is used such an open bit line scheme that bit lines BL and /BL are simultaneously selected in the cell arrays 1$t$ and 1$c$, and constitute a pair.

Main memory cells arranged in each cell array 1$t$, 1$c$ are used as "information cells" for storing a data level; and the remaining cell(s) as "reference cell(s)" for storing a reference level used for data-reading. Data in the cell arrays 1$t$ and 1$c$ are reversed in logic. In the below-description, an information cell in the cell array 1$t$ is referred to as "T-cell" while one in the cell array 1$c$ is referred to as "C-cell". There is prepared at least one reference cell, "R-cell", in each cell array 1$t$, 1$c$.

At a data read time, when an information cell T-cell is selected in one cell array 1$t$ with a word line TWL and the bit line BL in a pair of bit lines BL and /BL, a reference cell R-cell is selected in the other cell array 1$c$ with a reference word line RWL, which is selected simultaneously with the word line TWL, and the bit line /BL, and these T-cell and R-cell constitute a pair.

Similarly, when an information cell C-cell is selected in one cell array 1$c$ with a word line CWL and the bit line /BL in a pair of bit lines BL and /BL, a reference cell R-cell is selected in the other cell array 1$t$ with a reference word line RWL, which is selected simultaneously with the word line CWL, and the bit line BL, and these C-cell and R-cell constitute a pair.

There is no difference in structure between the information cells T-cell, C-cell and the reference cell R-cell. One reference cell R-cell is fixedly selected in the cell array 1$c$ in correspondence with plural information cells T-cell in the cell array 1$t$; and one reference cell R-cell is fixedly selected in the cell array 1$t$ in correspondence with plural information cells C-cell in the cell array 1$c$.

A pair of bit lines BL and /BL in the cell arrays 1$t$ and 1$c$ are selected with column gates 2$t$ and 2$c$ to be coupled to the sense amplifier circuit 3. Data transferring between the sense amplifier circuit 3 and external input/output terminals is performed via a data bus DQ disposed on the area of the sense amplifier circuit 3 and a data buffer 11.

The column gates 2$t$ and 2$c$ are controlled with column decoders 5$t$ and 5$c$, respectively. There are prepared word line select/drive circuits (row decoders) 4$t$ and 4$c$ for selectively driving word lines in the cell arrays 1$t$ and 1$c$, respectively.

Address, Add, is supplied to the row decoders 4$t$, 4$c$ and column decoders 5$t$, 5$c$ via address buffer 6 and address register 7.

Command, CMD, supplied from the outside of the chip for defining an operation mode, is decoded in a command decoder 8 and supplied to a controller 9, which controls write and erase sequences and a data read operation.

It is required of the cell arrays 1$t$, 1$c$ and row decoders 4$t$, 4$c$ and so on to be applied with various high voltages Vpp serving as write voltage, verify voltage, pass voltages and the like used in accordance with operation modes. To generate such the high voltages Vpp, there is prepared a high voltage generation circuit 10, which is also controlled with the controller 9.

Figure 2:
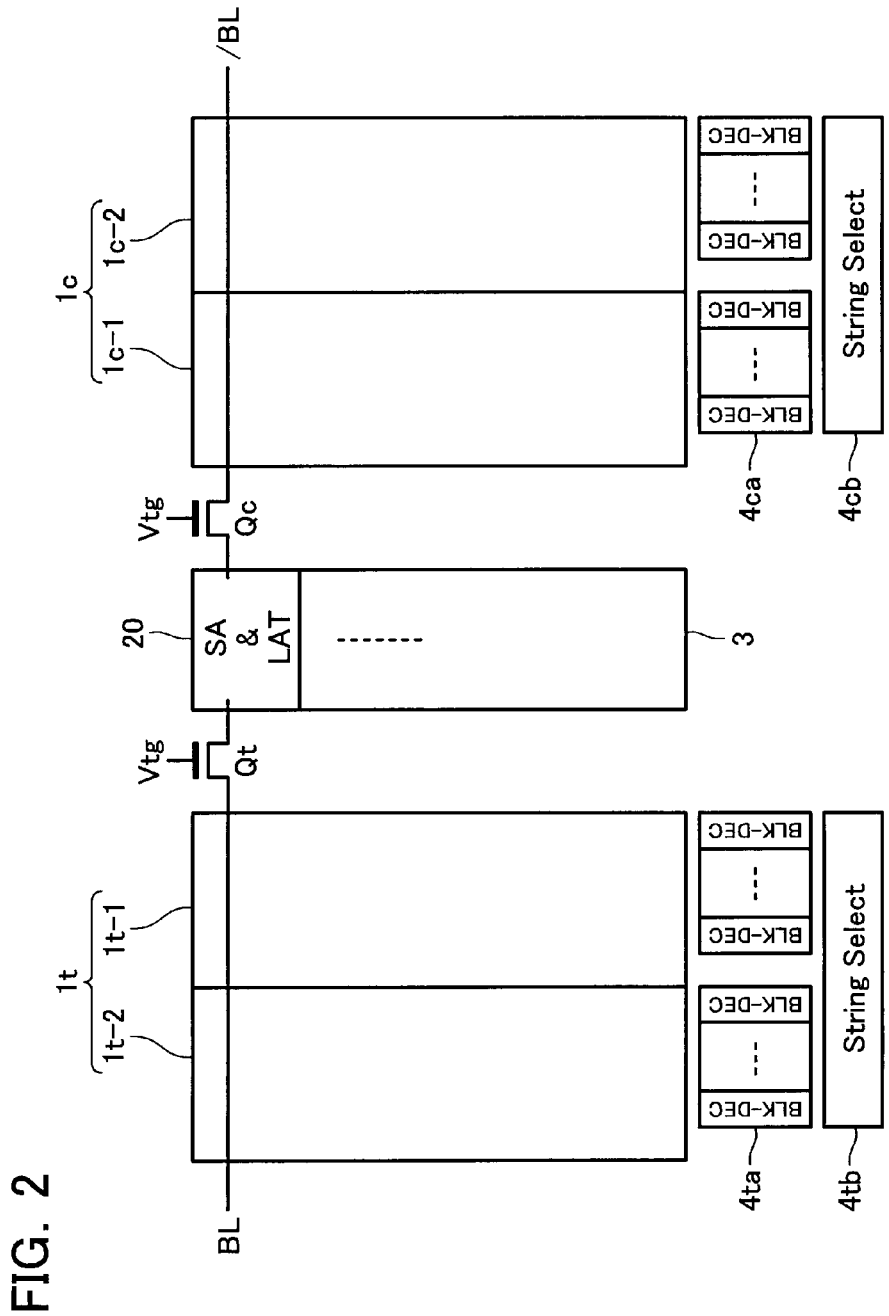
FIG. 2 shows the memory cell array of the flash memory.

FIGS. 2 to 7 show the internal configuration of the cell arrays 1$t$, 1$c$. FIG. 2 shows that each of the two cell arrays 1$t$ and 1$c$ disposed to sandwich the sense amplifier circuit 3 are divided into two areas (1$t$-1, 1$t$-2) and (1$c$-1, 1$c$-2) in the bit line direction.

While a plurality of bit line pairs BL, /BL are disposed in the cell arrays 1$t$ and 1$c$, only one pair is shown in the drawing. The sense unit 20 in the sense amplifier circuit 3 is, as described in detail later, includes sense amplifier SA and latch LAT. Multiple bit line pairs are selectively coupled to a sense unit 20. This will be explained later.

Figure 3:
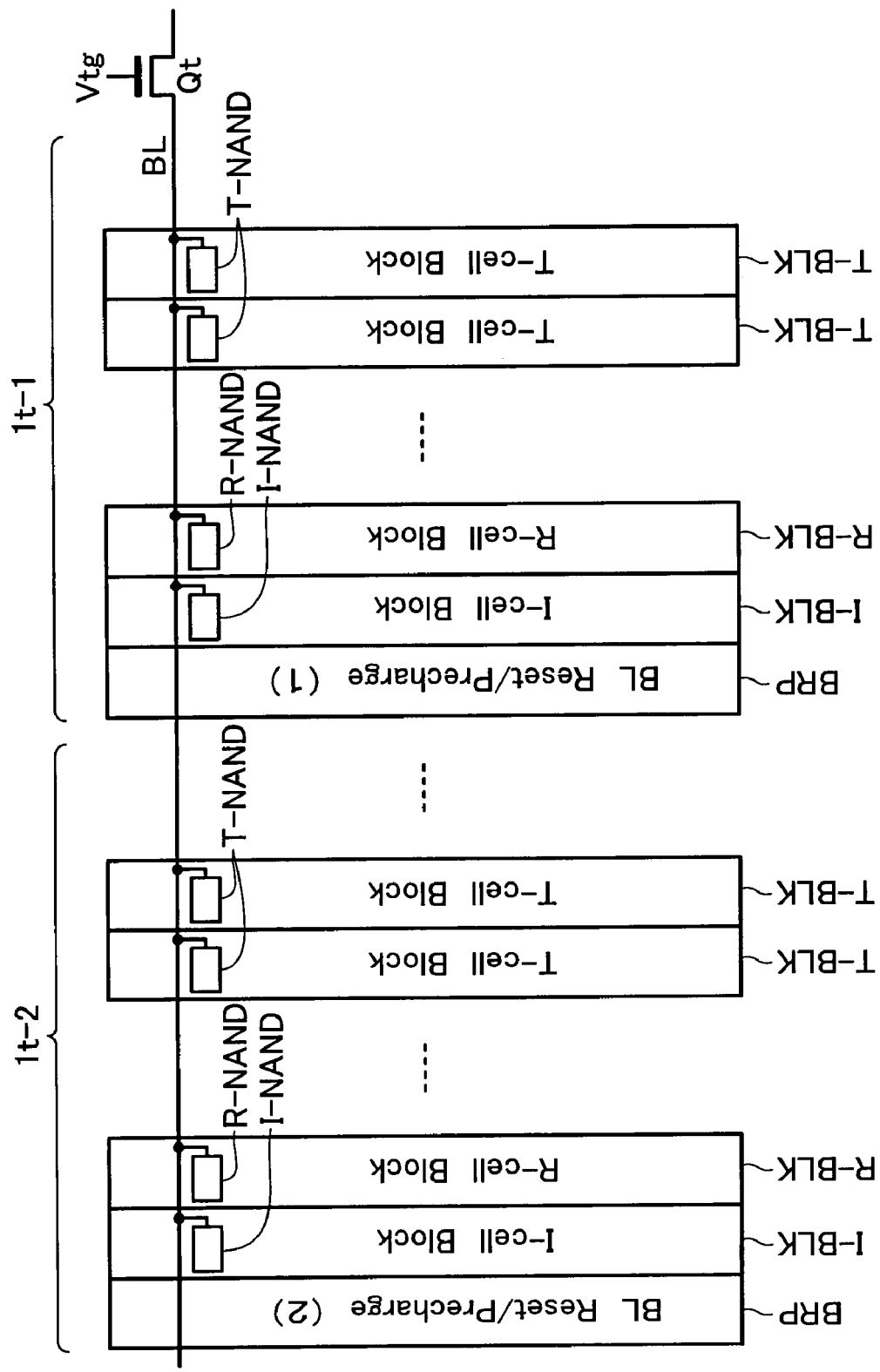
FIG. 3 shows one cell array (T-cell array) of the memory cell array.
Figure 4:
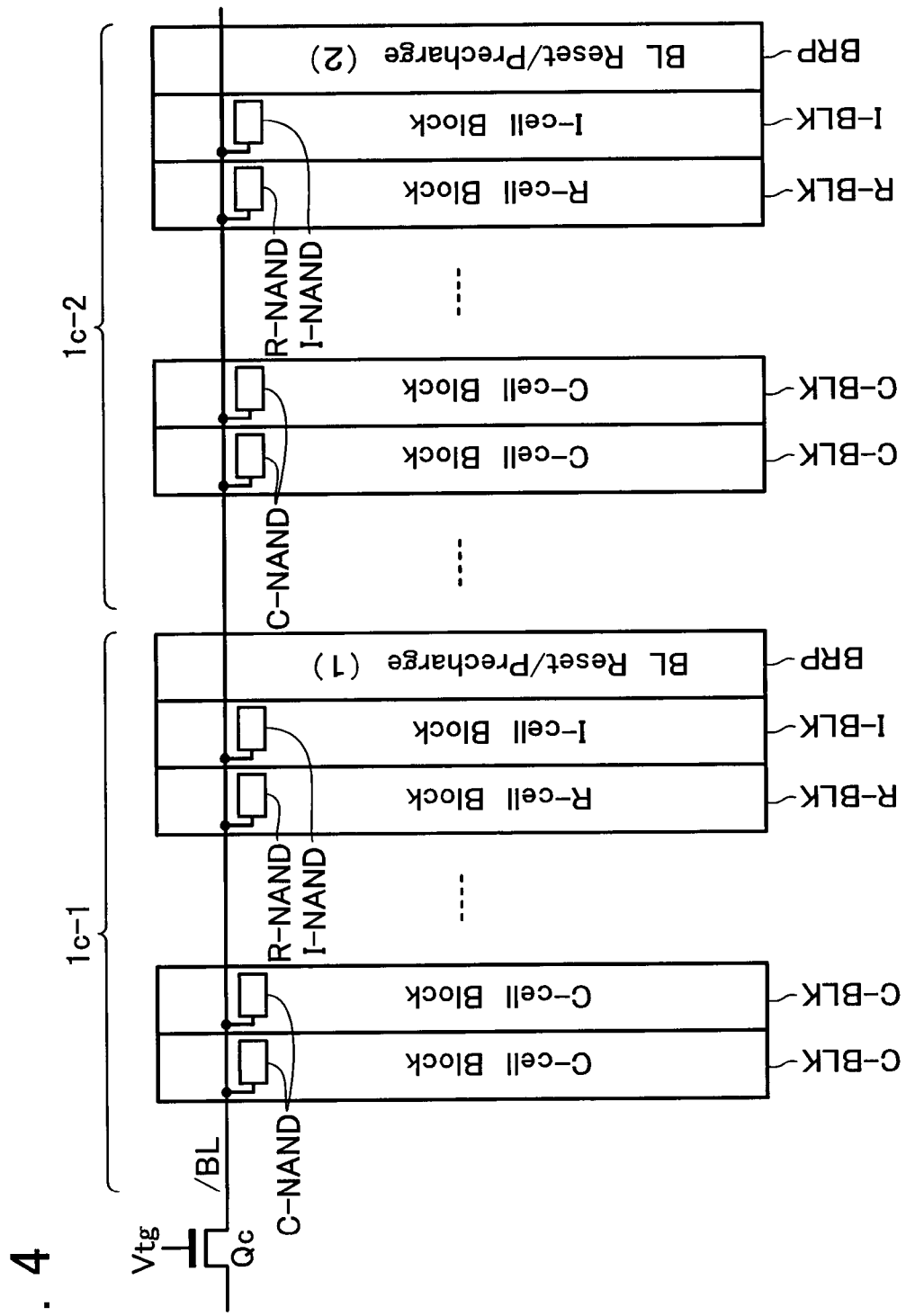
FIG. 4 shows the other cell array (C-cell array) of the memory cell array.

As shown in FIGS. 3 and 4, in each of areas 1$t$-1, 1$t$-2, 1$c$-1 and 1$c$-2, many information cell blocks T-BLK, C-BLK and a reference cell block R-BLK are disposed. In the information cell blocks T-BLK and C-BLK, NAND strings including information cells T-cell and c-cell (refer to as information cell NAND strings T-NAND and C-NAND, hereinafter) are arranged while in the reference cell block R-BLK, NAND strings including reference cells R-cell (refer to as reference cell NAND strings R-NAND, hereinafter) are arranged. In detail in this example, each reference cell block R-BLK is disposed at the end far from the sense amplifier SA in each of the areas 1$t$-1, 1$t$-2, 1$c$-1 and 1$c$-2.

Note here that the number of reference cell blocks is not limited to the above-described example. For example, the cell array has a smaller scale than the above-described example, it is permissible to dispose one reference cell block R-BLK in each cell array. By contrast, if the cell array scale is larger than the above-described example, more reference cell blocks may be disposed.

Row decoders 4t and 4c, which are used for selectively driving word lines in the cell arrays 1t and 1c, include NAND string decoders (i.e., block decoders) 4ta and 4ca disposed in the respective blocks for block-selecting, and string select circuits (i.e., word line drivers) 4tb and 4cb disposed to be shared by blocks in the cell arrays 1t and 1c and drive word lines and select gate lines in a block.

At a normal data read time and write-verify time of verifying data levels L0-L3, while one of the plural information cell blocks T-BLK is selected in the cell array 1t-1 (or 1t-2), reference cell block R-BLK is simultaneously selected in the cell array 1c-1 (or 1c-2). Similarly, while one of the plural information cell blocks C-BLK is selected in the cell array 1c-1 (or 1c-2), reference cell block R-BLK is simultaneously selected in the cell array 1t-1 (or 1t-2).

In each of cell arrays 1t-1, 1t-2, 1c-1 and 1c-2, another reference cell block I-BLK, in which NAND strings (second reference cell NAND strings) I-NAND formed of second reference cells I-cell are arranged, is disposed in addition to the reference cell block R-BLK. This second reference cell block I-BLK is disposed at the end far from the sense amplifier SA in each of areas 1t-1, 1t-2, 1c-1 and 1c-2. This reference cell block I-BLK is used for generating a reference current when the first reference cell R-cell is written into the reference level Lr or the lowest level L0 of the multi-levels is written into the information cell.

When the reference data is written into the first reference cell R-BLK in the cell array 1t-1 (or 1c-1), the second reference cell block I-BLK in the cell array 1c-1 (or 1t-1) is used. When the reference data is written into the first reference cell R-BLK in the cell array 1t-2 (or 1c-2), the second reference cell block I-BLK in the cell array 1c-2 (or 1t-2) is used.

Further disposed in the cell arrays 1t-1, 1t-2, 1c-1 and 1c-2 are bit line reset/precharge circuits BRP with the same configuration as memory cells. These are prepared for resetting the bit line history or setting non-selected bit lines at the power supply voltage Vdd or at more higher voltage of Vdd+α at a write time and disposed at the end farthest from the sense amplifier SA in each area 1t-1, 1t-2, 1c-1, 1c-2. The detail will be explained later. All bit line reset/precharge circuits BRP operate at a time on the both sides of the sense amplifier SA.

Figure 5:
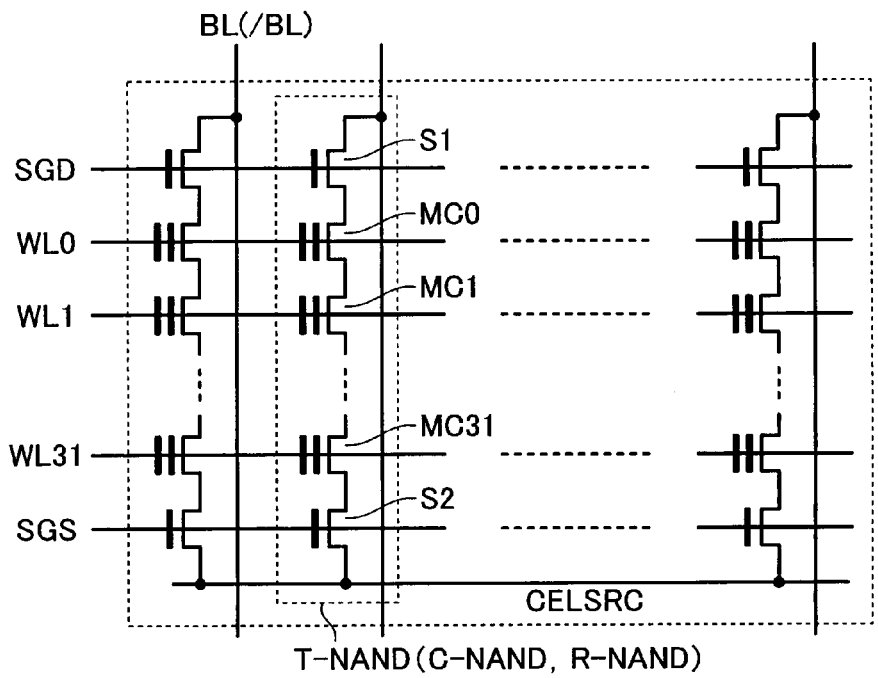
FIG. 5 shows the cell array block (T-cell, C-cell, R-cell block).

FIG. 5 shows a configuration of one NAND string block in detail. The same configuration is used for the information cell T-cell, C-cell and the first reference cell R-cell. That is, plural NAND cell units (i.e., NAND strings, T-NAND, C-NAND or R-NAND) are arranged in a matrix manner.

Each NAND string has a plurality of, thirty two in the example shown in the drawing, electrically rewritable and non-volatile semiconductor memory cells, MC0-MC31, connected in series. Each memory cell is a MOS transistor with a stacked gate structure of a floating gate and a control gate, which stores data in accordance with the carrier storage state of the floating gate in a non-volatile manner.

One end of the NAND string is coupled to a bit line BL (/BL) via a select gate transistor S1; and the other end to a common source line CELSRC via another select transistor S2.

Control gates of the memory cells MC0-MC31 are coupled to different word lines WL0-WL31, respectively. Gates of the select gate transistors S1 and S2 are coupled to select gate lines SGD and SGS, respectively, which are disposed in parallel with the word lines. A set of NAND strings sharing the word lines WL0-WL31 constitutes a "block" serving as a unit of data erase. Usually, there are prepared plural NAND string blocks in the direction of the bit line.

As shown in FIGS. 3 and 4, each two selected in blocks arranged in each of cell arrays 1t and 1c are set as first reference cell (R-cell) NAND string blocks R-BLK. While it is optional which NAND blocks are used as the first reference cell blocks R-BLK, once the first reference cell blocks R-BLK are selected, it should be used fixedly as the first reference cell blocks hereinafter, and others are used as information NAND strings blocks T-BLK and C-BLK.

Further, in each cell array 1t, 1c, two blocks are selected as second reference cell (I-cell) NAND string blocks I-BLK. The second reference cell block I-BLK is basically the same as the information cell block T-BLK, C-BLK and the first reference cell block R-BLK, but the gate connection is modified and different from that in others. The detail will be explained below.

Figure 6:
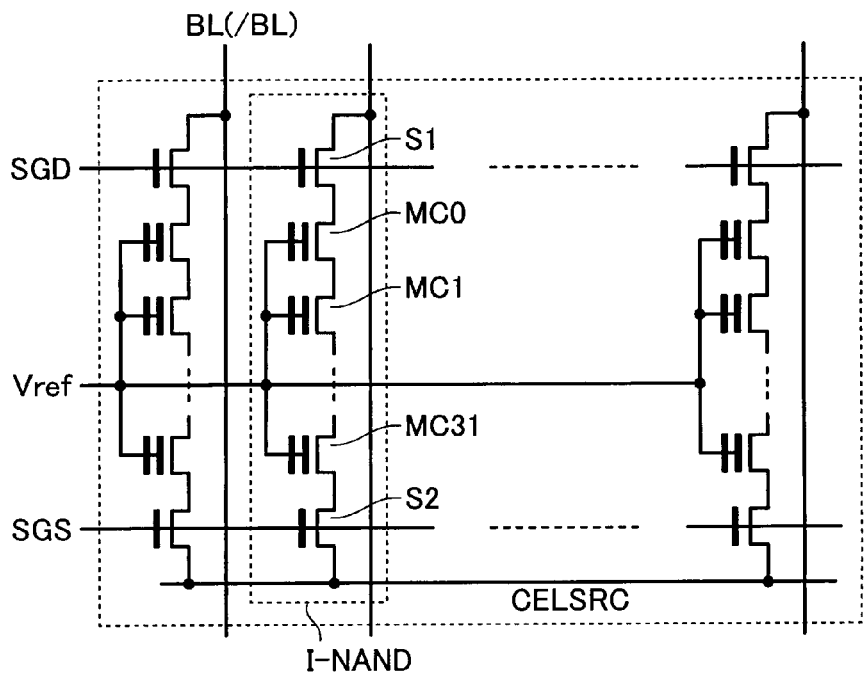
FIG. 6 shows the I-cell block.

FIG. 6 shows the configuration of the second reference cell (I-cell) block I-BLK. This is formed of NAND string I-NAND, which is basically the same as T-cell, C-cell and R-cell blocks. However, in this NAND string I-NAND, the control gates and floating gates of all memory cells MC0-MC31 are coupled to a common gate line, to which reference voltage Vref is applied. That is, the entire memory cells connected in series are operable as a reference current transistor in such a manner that the floating gates are applied with the reference voltage Vref.

The reference current source circuit used for detecting a cell current may be formed and disposed at the input node of the sense amplifier as being separated from the cell array. By contrast, according to this embodiment, in which all reference current sources are formed in the cell array with the same configuration as the cell array, it is unnecessary for using extra transistor areas and possible to obtain a current source with a small variation.

Figure 7:
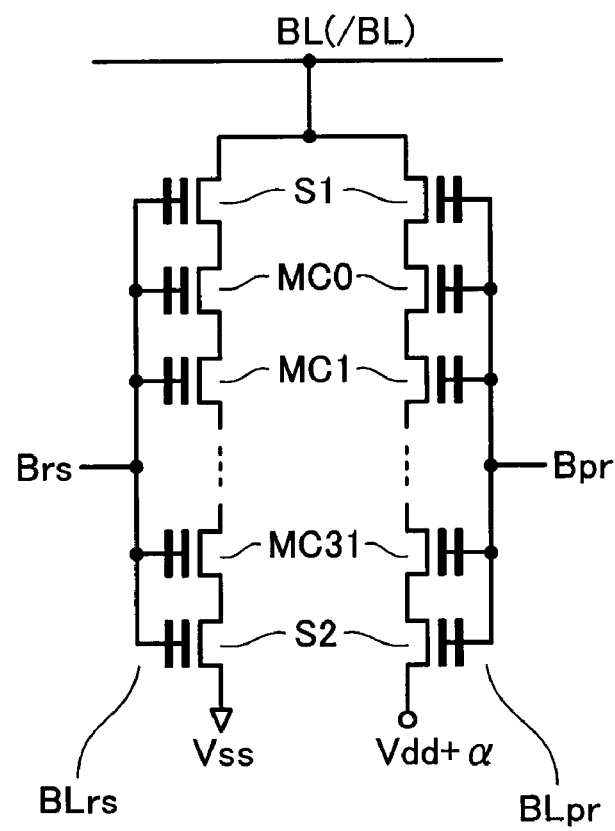
FIG. 7 shows the bit line reset/precharge circuit (BRP).

FIG. 7 shows the detailed configuration of the bit line reset/precharge circuit BRP. This is formed of bit line reset circuit BLrs and bit line precharge circuit BLpr disposed in parallel with the same configuration as memory cells in the cell array.

The bit line reset circuit BLrs is formed as follows: the control gates of memory cells MC0-MC31 and select gate transistors S1 and S2 are coupled to floating gates thereof like the select gate transistors S1 and S2, and these are coupled to a common control node Brs. The drain of select gate transistor S1 is coupled to bit line; and the source of select gate transistor S2 to a reset-use voltage node, for example, Vss node.

The bit line precharge circuit BLpr is formed as follows: the control gates of memory cells MC0-MC31 and select gate transistors S1 and S2 are coupled to floating gates thereof like the select gate transistors S1 and S2, and these are coupled to a common control node Bpr. The drain of select gate transistor S1 is coupled to bit line; and the source of select gate transistor S2 to a precharge-use voltage node, for example, a boost voltage node of Vdd+α. Applying a control voltage corresponding to the read pass voltage Vread to the precharge node Bpr, the bit line will be precharged to Vdd+α.

[Principle of Four-level Data Storage]

Figure 8:
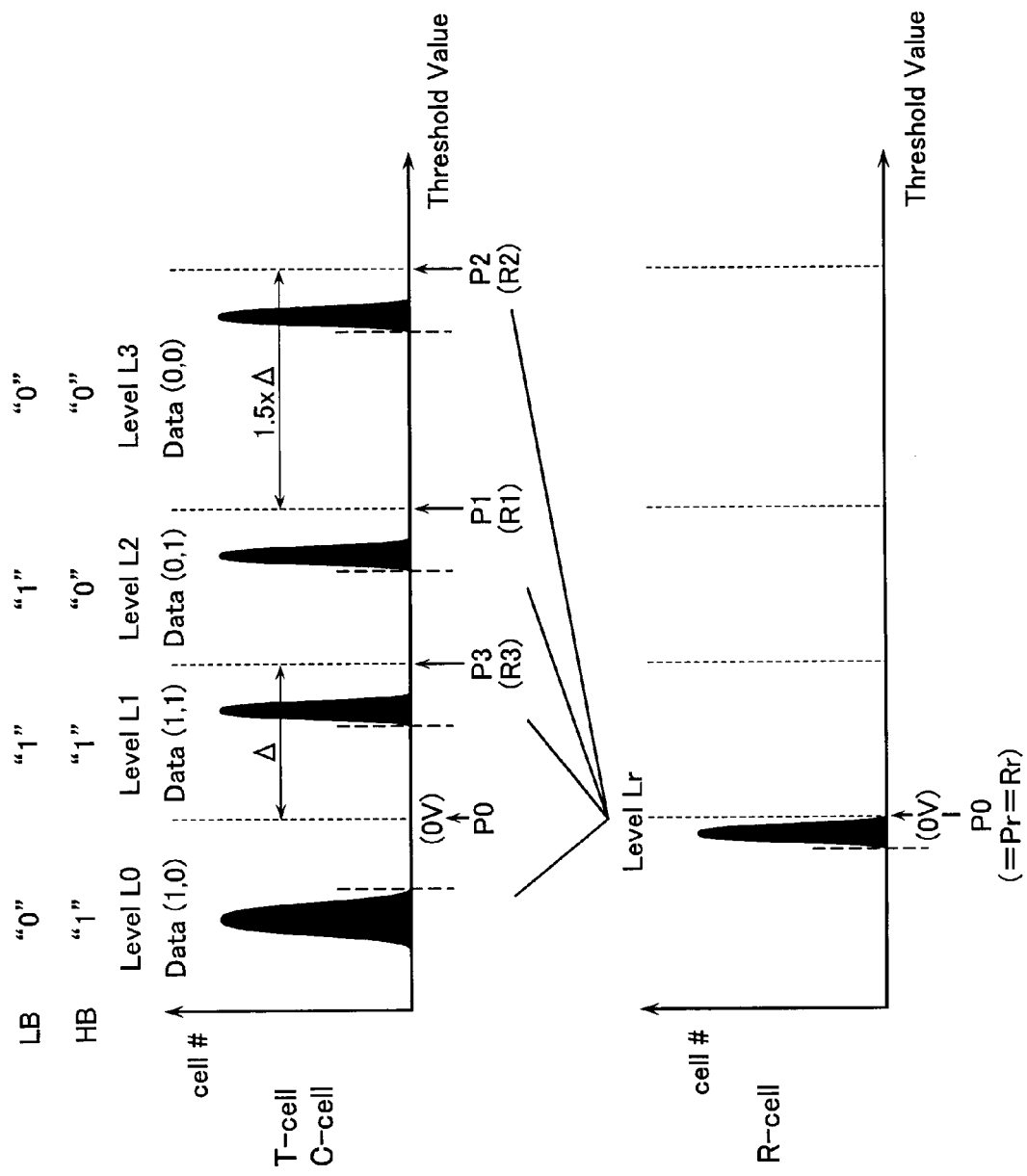
FIG. 8 shows a relationship between four data levels and reference data level, and a data bit assignment.

FIG. 8 show data levels, i.e., threshold distributions of the four-level data, and data bit assignment thereof in accordance with this embodiment.

An information cell T-cell or C-cell is set at one of four data levels (i.e., threshold levels) L0, L1, L2 and L3 (where, L0<L1<L2<L3).

The lowest level L0 is a negative and erased threshold level defined by erase-verify voltage P0 (=0V). An erase level obtained by a block erase performed for a block in a lump may be basically used as this level L0. However, the erase level usually has a wide threshold distribution. Therefore, in this embodiment, to narrow the threshold distribution of the lowest level L0, a preliminary write step is used as explained later.

Data levels L1, L2 and L3 are positive and written threshold levels defined by verify voltages P3 (=P0+Δ), P1(=P0+2Δ) and P2(=P0+3.5Δ), which are applied to a selected word line at write-verify times, respectively.

With the above-described verify voltages P3, P1 and P2, the write data levels L1, L2 and L3 are set to satisfy the relationship of: L1=L2−L1<L3−L2. In other words, the gap between the uppermost data level L3 and the following level L2 is set to be larger than others.

Reference level Lr, that is a data level of the reference cell R-cell, is set at about 0V lower than the secondary data level L1 of the information cell T-cell or C-cell as defined by write-verify voltage Pr(=P0).

As the reference level Lr, it is permissible in principle to use whichever voltage. However, in consideration of the reference word line level setting and write time of the reference cell, it is desirable to set the reference level Lr to be low. The reason is as follows: as the cell array becomes large in capacity and the time constant of the word line becomes large, it takes a long time for setting the word line to be high in its entirety. The reference level Lr being set to be near the lower one of data levels, it is able to make the write time of the reference cell short.

Considering the above-described situation, as shown in FIG. 8, the reference level Lr is set to satisfy the relationship of: L0<Lr<L1, and in detail, for example, set at about 0V or near it.

Supposing that the four-level data is defined as (HB,LB) (where, HB and LB are a higher (or upper) bit and a lower bit, respectively), as shown in FIG. 8, (1,0), (1,1), (0,1) and (0,0) are assigned to the data levels L0, L1, L2 and L3 of the information cell T-cell, respectively.

This four-level data may be judged in such a way as to detect cell current difference between an information cell T-cell (or C-cell) and a reference cell R-cell on a certain bias condition with a sense amplifier. That is, when the information cell T-cell is selected from the cell array 1$t$ at a read time, the reference cell R-cell is selected from the cell array 1$c$ at the same time, and these are coupled to the input nodes of the sense amplifier via a bit line pair to be subjected to current difference detecting. Similarly, when the information cell C-cell is selected from the cell array 1$c$, the reference cell R-cell is selected from the cell array 1$t$, and these are coupled to the input nodes of the sense amplifier.

In FIG. 8, voltages (read voltages) R1, R2, R3 and Rr applied to a selected word line TWL (or CWL) and a reference word line RWL are shown. These read voltages are set at the same values as the verify voltages P1, P2, P3 and Pr, respectively.

As described above, levels L1, L2, L3 and Lr are defined by the verify voltages P3, P1, P2 and Pr, respectively, and threshold distributions thereof have the lowest values, as shown by dotted lines. The reason is, as described in detail later, as follows: a selected information cell's current, which flows when the verify voltage is applied, is compared with a reference cell current, and "write" completion is judged based on that the information cell's current has been detected to be smaller than the reference cell current.

By contrast, the lowest data level L0 has the upper limit value as shown by a dotted line. The reason is as follows: at an erase-verify time, with applying P0=0V to the entire word lines in a NAND cell unit, which has been erased in a lump, the cell unit's current is compared with a reference current, and "erase" completion is judged based on that the cell unit's current has been detected to be larger than the reference current.

[Write Preceding Process]

Figure 9:
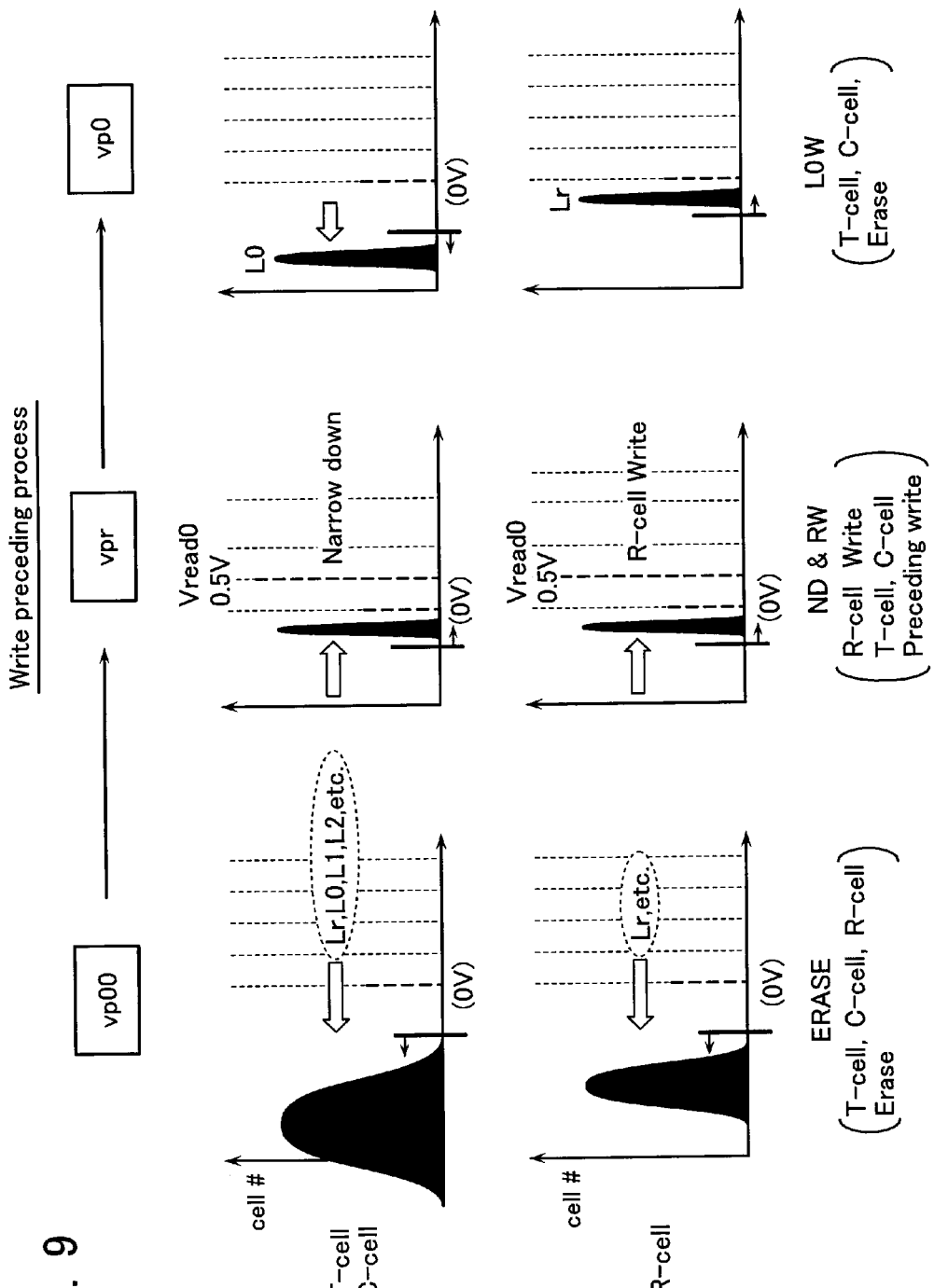
FIG. 9 shows the procedure of the write preceding process.

FIG. 9 shows a write preceding process for four-level data write (or program), in which data erase is performed in a lump, and reference cells and information cells are written into the reference level Lr and the lowest level L0, respectively, from the erase state.

The initial step "vp00" in FIG. 9 is an erase step "ERASE". It is shown here such a state that erase-verify has been completed. Erase operation is usually performed by a block with respect to information cell blocks T-BLK and C-BLK with information cells T-cell and C-cell, and reference cell block R-BLK with reference cells R-cell. In detail, the erase operation is performed in such a way as to apply 0V to the entire word lines and erase voltage Vera to the p-type well, on which the cell array is formed, thereby discharging electrons in the floating gates. Note here that it is possible to erase multiple blocks at a time.

Figure 10:
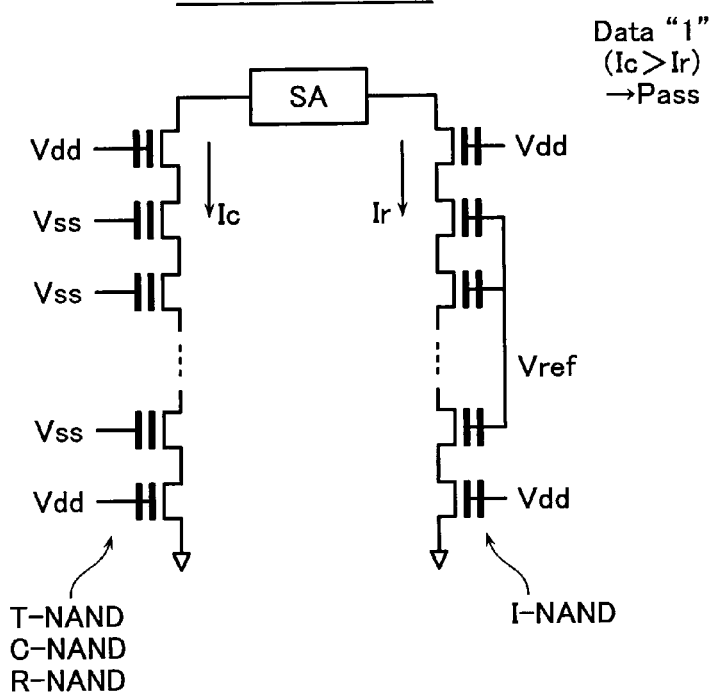
FIG. 10 shows the erase-verify operation at step vp00 in the write preceding process.

Erase-verify is, as shown in FIG. 10, performed by comparing the cell current Ic of information cell NAND string T-NAND (or C-NAND) or reference cell NAND string R-NAND, the entire word lines of which are applied with 0V, with the reference current Ir of the second reference cell NAND string I-NAND with a sense amplifier SA. Detecting data "1" (i.e., Ic>Ir), the erase-verify will be passed.

The information cell T-cell or C-cell is subjected to the ease-verify after having erased from various data threshold levels, so that the threshold distribution is wide. By contrast, the reference cell R-cell is lowered in threshold level from a constant level Lr, the threshold distribution is narrower than that of the information cell. However, even if a part of NAND strings have been erased, the erase operation is continued until the entire NAND strings have been erased. Therefore, the threshold distribution becomes wide.

Step "vpr" is a preliminary write step "ND&RW", in which data write of the reference level Lr of the reference cell R-cell and data write of the information cells T-cell and C-cell are performed. The data write of T-cell and C-cell is performed for the purpose of narrowing down the threshold distribution (i.e., narrowing down, "ND") under the same condition as the reference cell write. In the drawing, the write completion states are shown.

The preliminary write operation is performed in such a manner that write voltage Vpgm is applied to a sequentially selected word line to cause electron injection into the floating gate like in the normal data write operation.

Figure 11:
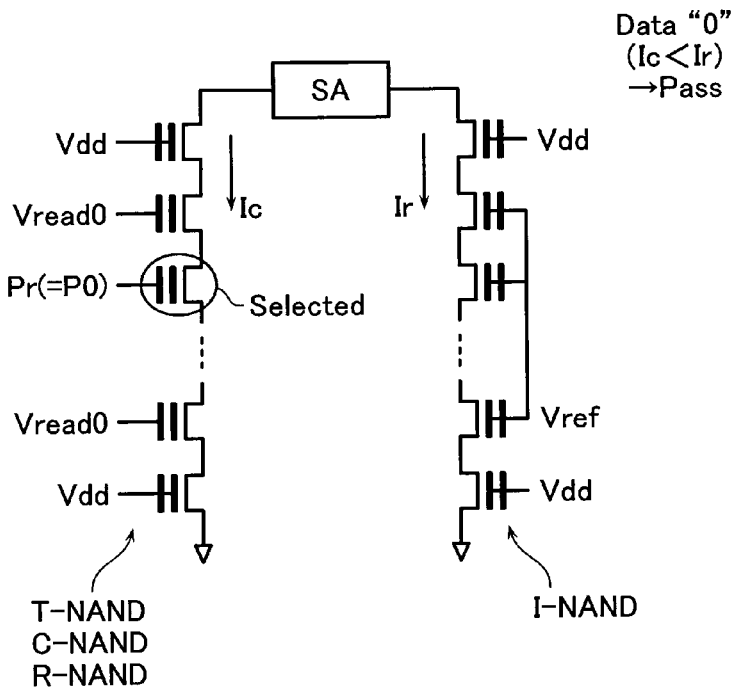
FIG. 11 shows the write-verify operation at step vpr in the write preceding process.

Write-verify is, as shown in FIG. 11, performed by comparing the cell current Ic of information cell NAND string T-NAND (or C-NAND) or reference cell NAND string R-NAND, the selected word line and non-selected word lines of which are applied with verify voltage P0 (=Pr, e.g., 0V) and pass voltage Vread0 (e.g., 0.5V), respectively, with the reference current Ir of the second reference cell NAND string I-NAND with a sense amplifier SA. Detecting data "0" (i.e., Ic<Ir), the write-verify will be passed. Therefore, the lowest value of the threshold distribution is defined.

As described above, all information cells and first reference cells are set at the reference level Lr. Since the verify-write is performed cell by cell in the NAND string, the threshold distribution becomes narrow after verify completion.

Step "vp0" is a data level L0 setting step "L0W" with respect to the information cells in within the information cells and reference cells, which have been set at the reference level Lr. In detail, except the reference cells R-cell, the information cells T-cell and C-cell are subjected to verify-erase again.

Figure 12:
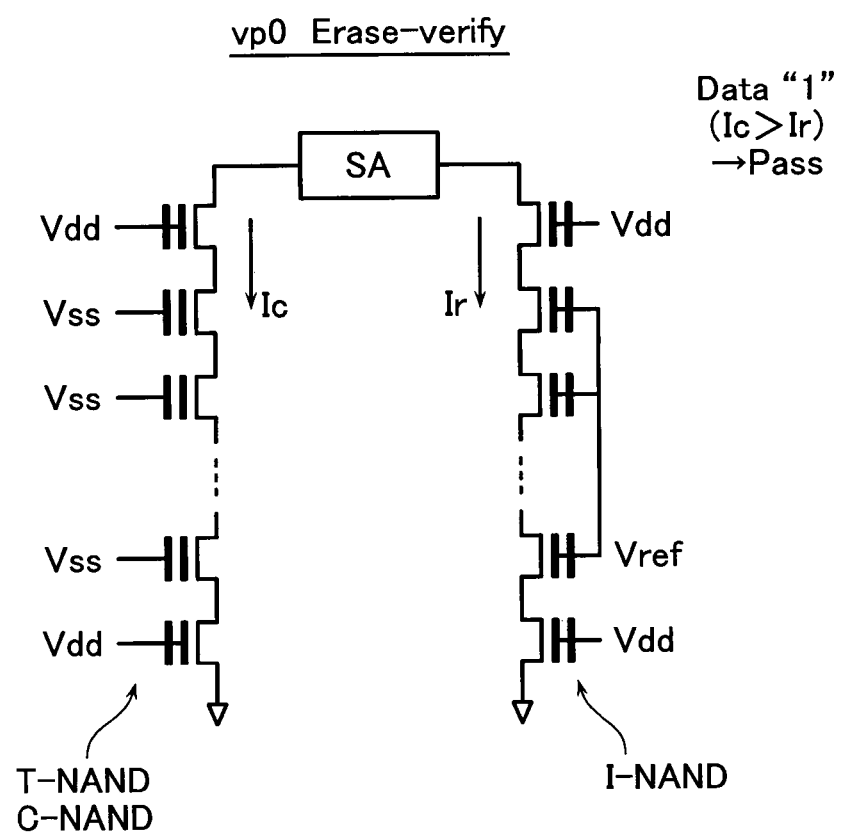
FIG. 12 shows the erase-verify operation at step vp0 in the write preceding process.

The erase-verify is the same as in the erase step "vp00". That is, as shown in FIG. 12, compare the cell current Ic of the information cell NAND string T-NAND (or C-NAND), the entire word lines of which are applied with 0V, with the reference current Ir of the second reference cell NAND with the sense amplifier. When data "1" (i.e., Ic>Ir) is detected, the erase-verify will be passed.

As a result, the lowest level L0 of the information cells T-cell and C-cell is decided. Although the threshold distribution is slightly widened at this step, the level L0 is defined to be narrower than that of the initial erase state because the distribution is narrowed via the preliminary write step "vpr". The lowest data level L0 is defined by the upper limit of the threshold distribution.

Performing the above-described write preceding processes, "vp00", "vpr" and "vp0", the reference level Lr of the reference cell R-cell and the lowest level L0 of the information cells T-cell and C-cell are set.

[Data Write]

After having performed the above-described write preceding processes, levels L1, L2 and L3 in four levels are written. The write procedure will be explained with reference to FIG. 13 below.

Figure 13:
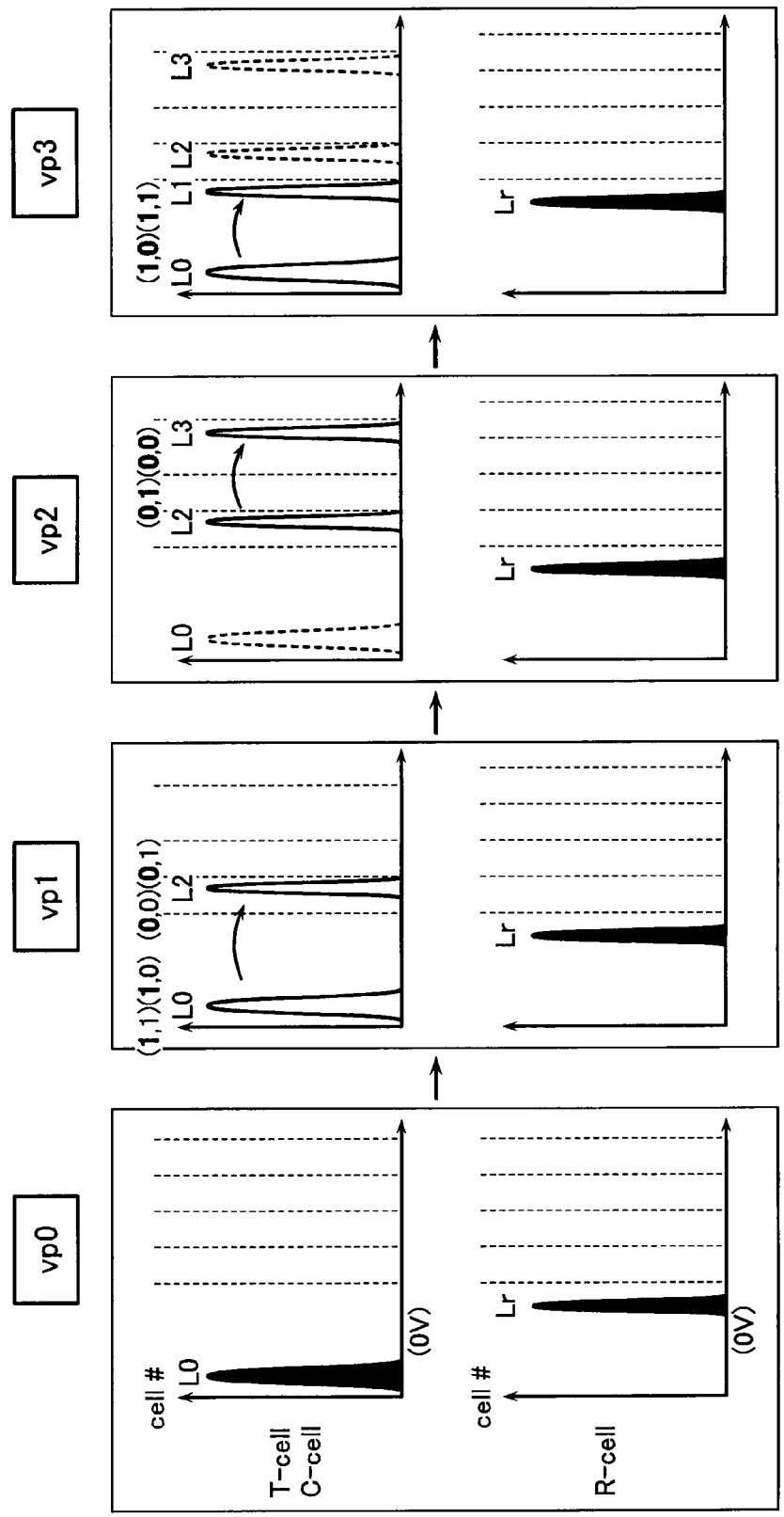
FIG. 13 shows the write procedure of four data levels.

"vp0" in FIG. 13 is the final step in the preceding processes for data write as shown in FIG. 9. In the verify-write steps "vp1", in accordance with the higher bit HB supplied, the cell threshold voltage(s) of a part of the information cells in a state of level L0 (i.e., cells, to which HB="0" is applied) are increased to the third write level L2.

In the following verify-write step "vp2", in accordance with the higher bit HB, which has been written, and the lower bit LB supplied from the external, the cell threshold voltage(s) of a part of the information cells in a state of level L2 (i.e., cells of LB="0"), is increased to the highest write level L3.

Note here that it is able to interpose a read mode between the write steps "vp1" and "vp2". To restart the suspended write operation, it is necessary for reading out the written HB data in the cell array and externally loading the LB data into the data latch of the sense amplifier.

In the next verify-write step "vp3", in accordance with the higher bit HB, which has been written, and the lower bit LB supplied from the external, the cell threshold voltage(s) of a part of the information cells (i.e., cells of LB="1"), which are in the erase level L0, is increased to the second write level L1.

It is also able to interpose a read mode between the write steps "vp2" and "vp3". To restart the suspended write operation, it is necessary for reading out the higher bit data HB of to-be-written cells and externally loading the lower bit data in the data latch of the sense amplifier.

Figure 14:
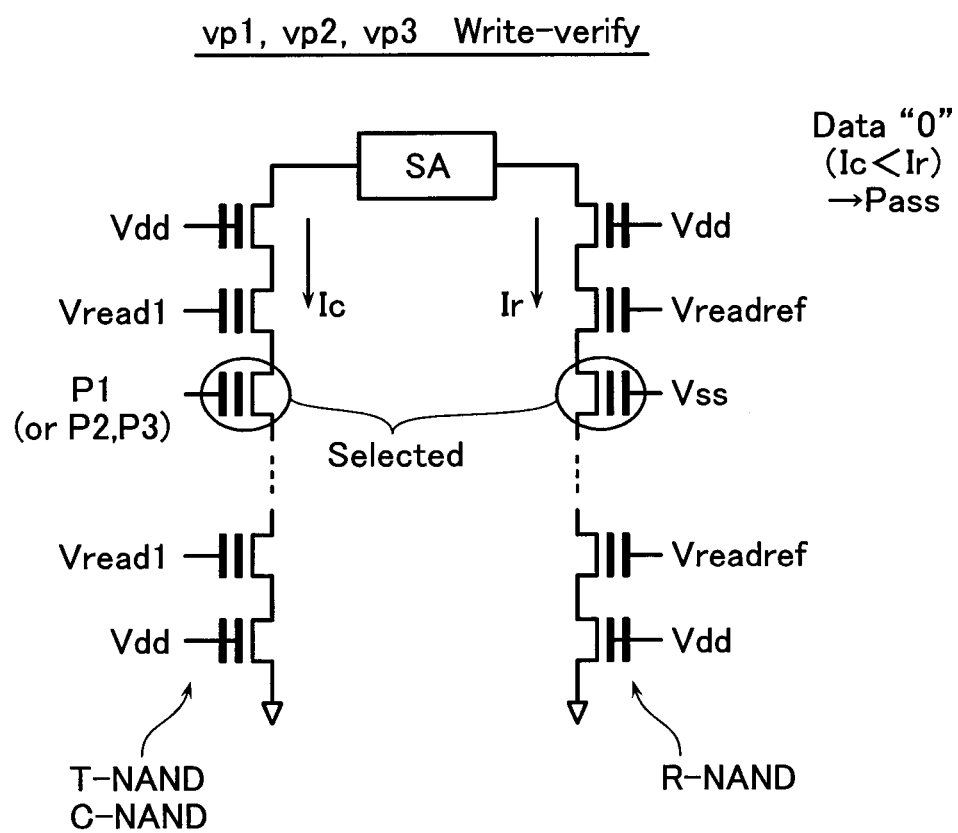
FIG. 14 shows the write-verify operation at each write step.

FIG. 14 shows the write-verify operation in the above-described write steps "vp1", "vp2" and "vp3". At the write-verify operation, the reference cell NAND string R-NAND, in which the reference level Lr has already been written, is used for cell current comparing.

That is, an information cell NAND string T-NAND (or C-NAND) with the information cells T-cell (or C-cell) selected from one cell array, and a reference cell NAND string R-NAND selected from the other cell array are coupled to the sense amplifier SA. The selected word line on the information cell side, which corresponds to a selected cell surrounded by a circle in FIG. 14, is applied with verify voltage P1 (e.g., 2V) at step "vp1"; and the remaining non-selected word lines with pass voltage Vread1 (e.g., 5V). On the reference cell side, the selected word line is applied with Vss=0V; and the remaining non-selected word lines with pass voltage Vreadref (e.g., 0.5V).

At the steps "vp2" and "vp3", the verify voltage applied to the selected word line is set at P2 (e.g., 3.5V) and P3 (e.g., 1V), respectively.

Under the above-described conditions, the sense amplifier SA compares the cell current Ic flowing in the information cell NAND string with the reference current Ir flowing in the reference cell NAND string. If data "0" (i.e., Ic<Ir) is detected, the data write will be completed. In practice, write and write-verify are repeated until the write completion is judged in the entire amplifiers arranged in a range where data write operations are performed at a time.

[Data Read]

Figure 15:
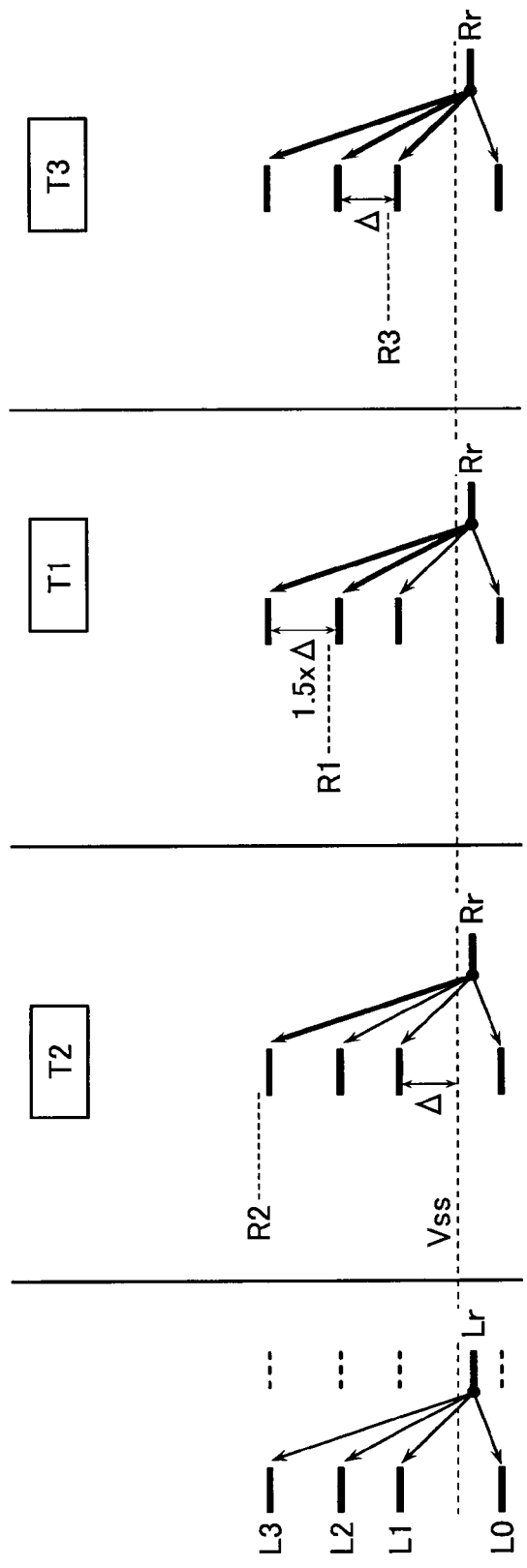
FIG. 15 shows the read procedure of four data levels.

FIG. 15 shows the level relationships between information cells T-cell, C-cell and reference cell R-cell for three read steps T1, T2 and T3 used in a data read cycle, which are shown in comparison with a basic level defined by the ground potential Vss. Data levels in the information cell are set to satisfy the following relationships: the difference between Vss and L1 and that between L1 and L2 are substantially equal to each other, and set to be about $\Delta$; the difference between L2 and L3 is set at $1.5 \times \Delta$.

At step T1, to read data level L2 or higher levels as data "0" (i.e., information cell current is smaller than reference cell current), the read voltage (word line level) R1 is set to be slightly higher than the data level L2. At step T2, to read only data level L3 as data "0", the word line level R2 is set to be slightly higher than the data level L3. At step T3, to read data level L1 or higher levels than it as data "0", the word line level R3 is set to be slightly higher than data level L1.

Word line level Rr of the reference cell is set at the same as verify voltage P0 at level Lr write time, i.e., at Vss or near it. This read voltage Rr of the reference cell is kept constant through the read steps.

Figures 16, 17:
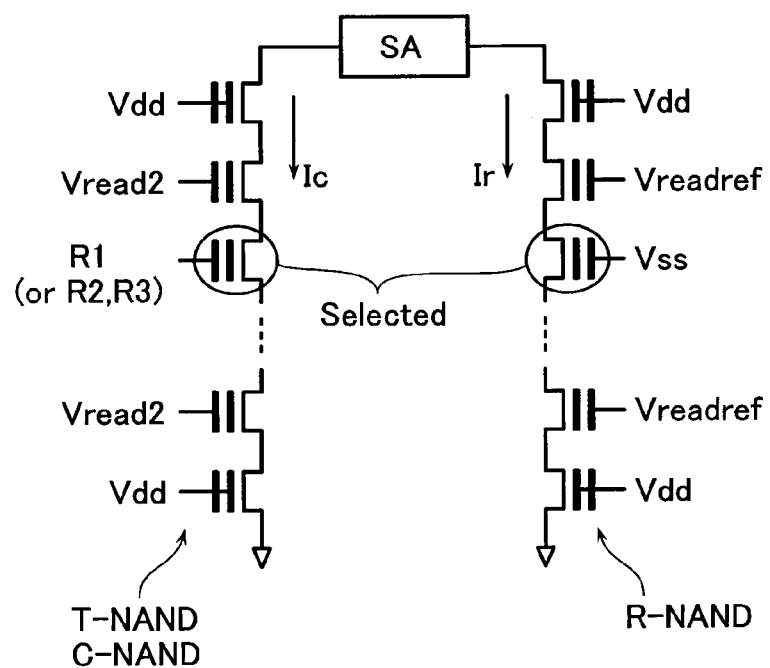
FIG. 16 shows read data at each read step.
FIG. 17 shows the bias condition at a read time.

As described above, data read is performed with three read steps T1, T2 and T3, in which word line level is set at R1, R2 and R3, respectively. FIG. 16 shows the sense results of the information cells T-cell with the respective data levels at the respective read steps. The sense result at step T1 shows the upper bit HB while the lower bit LB is read out through steps T2 and T3.

FIG. 17 shows the detailed word line setting examples at the read steps. In the higher bit (HB) read cycle T1, in the information cell NAND string T-NAND (or C-NAND), a selected word line is set at R1 (e.g., 1.5V); and non-selected word lines at pass voltage Vread2 (e.g., 5.5V). In the reference cell NAND string R-cell NAND, a selected word line is set at Vss; and non-selected word lines at pass voltage Vreadref (e.g., 0.5V).

The lower bit (LB) read is performed with two cycles of T2 and T3. In the information cell NAND string T-NAND (or C-NAND), a selected word line is set at R2 (read voltage, e.g., 2.5V) at step T2, and at R3 (e.g., 0.5V) at step T3; and non-selected word lines at pass voltage Vread2 (e.g., 5.5V). In the reference cell NAND string R-cell NAND, a selected word line is set at Vss; and non-selected word lines at pass voltage Vreadref (e.g., 0.5V).

[Sense-Latch System]

So far, the brief of the flash memory in accordance with this embodiment has been explained. Next, it will be explained a sense-latch system, i.e., sense unit 20, used for data reading and writing.

Figure 18:
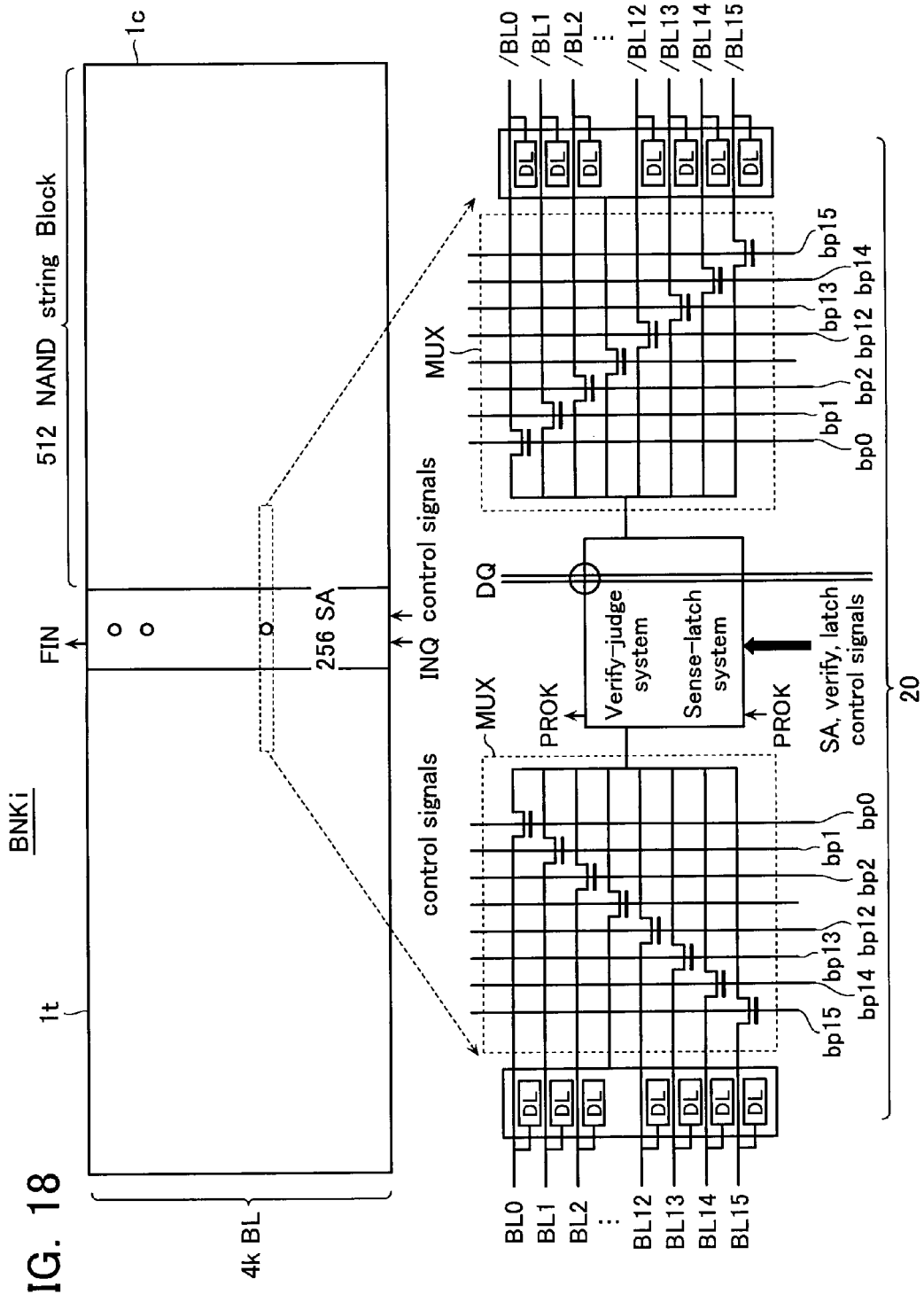
FIG. 18 shows one cell array bank and a sense unit thereof.

FIG. 18 shows one page bank BNKi and one of sense units 20 prepared therein. The page bank BNKi is formed of cell arrays 1t and 1c, each of which has 512 information NAND string blocks (T-BLK, C-BLK) and 4 k bit lines are arranged (where, one NAND string contains 32 cells).

Supposing that one sense unit 20 is, for example, shared by 16 bit line pairs, 256 (=4 k/16) sense units are disposed in one page bank BNK as being simultaneously activated.

Which bit line pair is selected in 16 pairs to be coupled to the sense amplifier is selected by multiplexers MUX, selection signals of which are bp0-bp15. The sense unit has a sense amplifier-latch system and a verify result judge system as described in detail later.

In correspondence with the respective bit lines BL, /BL, data registers DL are disposed for storing write data. Although data registers are disposed one by one for every bit line in this example shown in FIG. 18, it is permissible in general to dispose data resisters each shared by plural bit lines. For example, in such a scheme that simultaneously selected bit lines are only even numbered ones or odd numbered ones, each data resister is disposed for two bit lines.

The number of cells to be simultaneously written is defined by the number of data registers disposed on the bit line BL side or on the bit line /BL side defines. That is, write data are sequentially loaded in the data latches disposed on the bit line BL or /BL side, and then written in cells in a lump.

Signal PROK is used for judging the verify result. The sense-latch systems are formed to be selectively coupled to global data lines DQ, /DQ.

Figure 19:
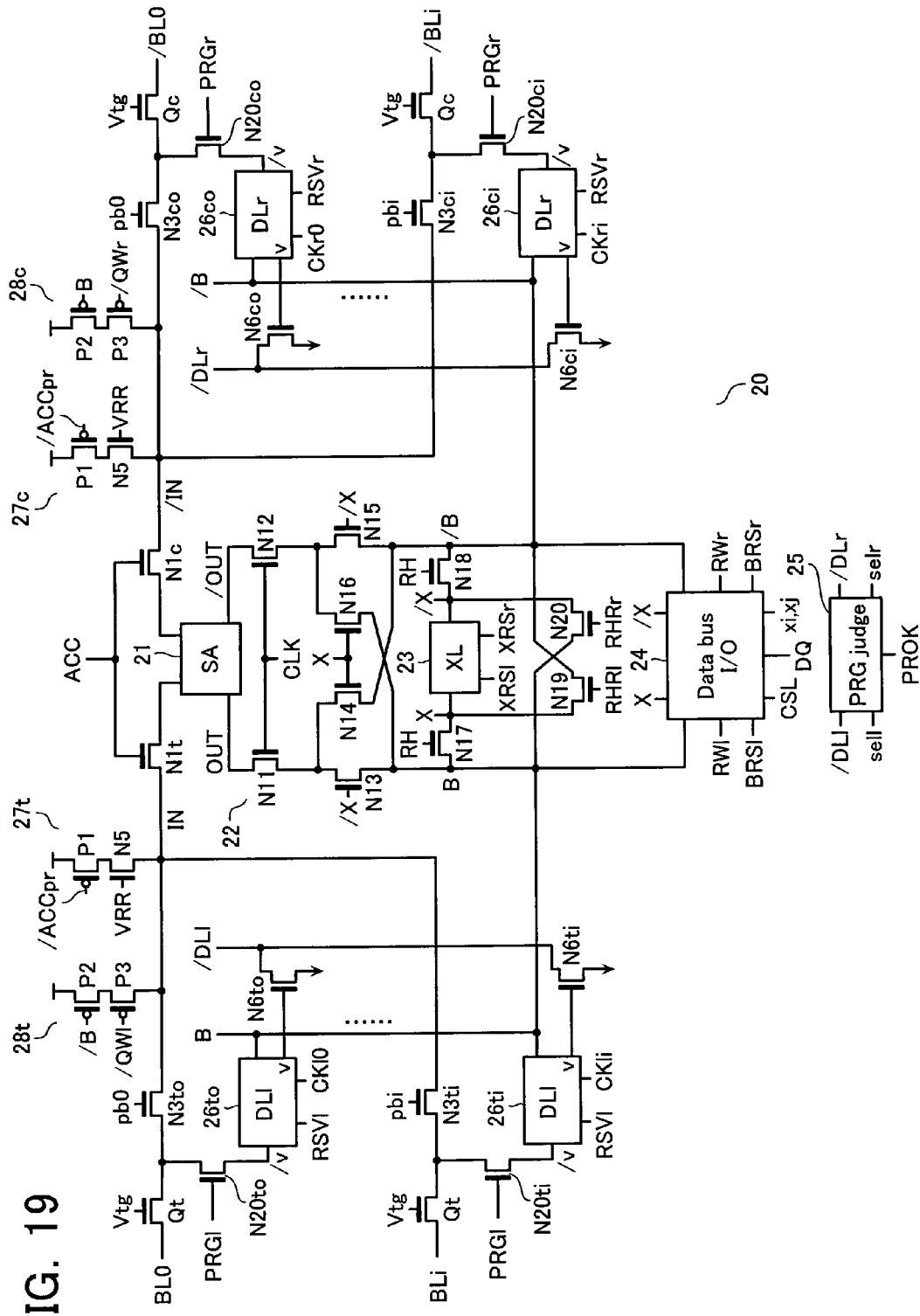
FIG. 19 shows a detailed configuration of the sense unit.

FIG. 19 shows a detailed configuration of the sense unit 20, which covers a range of bit line pairs BL0, /BL0 to BLi, /BLi. That is, to hold write data, data registers (data latches DLl) 26t(0-i) are disposed for the respective bit lines BL(0-i); and data registers (data latches DLr) 26c(0-i) for the respective bit lines /BL(0-i).

At a read time, data on the bit line pairs are sequentially selected to be input to a current-detecting type of sense amplifier 21. The connection between the bit lines and sense amplifier is selected with selection transistors N3t(0-i) and N3c(0-i), and selected pair of bit lines BL, /BL are coupled to input nodes IN, /IN of the sense amplifier 21. Transistors Qt, Qc driven by gate signal Vtg are high-voltage ones for preventing the sense amplifier 21 from being applied with a high voltage generated on the bit lines BL, /BL side.

Disposed at the input nodes IN and /IN are NMOS transistors N1t and N1c, which supply cell currents on the bit lines to the sense amplifier 21 only at an activation time. Output nodes OUT and /OUT are coupled to data relaying nodes B and /B via data transfer circuit 22. The relaying nodes B and /B serve for relaying data between sense amplifier 21 and data line DQ, and between data registers 26t, 26c and data line DQ.

Data transfer between sense amplifier 21 and relaying nodes B and /B is controlled with data register 23 (data latch XL). That is, data transfer circuit 22 and data register 23 constitute a transfer control circuit.

Sense amplifier output nodes OUT and /OUT are coupled to data relaying nodes B and /B via NMOS transistors N11 and N12 driven by clock signal CLK. Output nodes OUT and /OUT are also coupled respectively to relaying nodes B and /B via NMOS transistors N13 and N15 driven by one node signal /X of the data register 23, and coupled respectively to relaying nodes /B and B via NMOS transistors N14 and N16 driven by the other node signal X. In other words, the sense amplifier data may be transferred to data relaying node B and /B as it is or as being inverted in accordance with data stored in data register 23.

Nodes X and /X of data latch XL are coupled respectively to relaying nodes B and /B via NMOS transistors N17 and N18 driven by pulse signal RH. That is, in response to signal RH, data of the relaying nodes B and /B may be input to data nodes X and /X, respectively, as it is. Further, data nodes X and /X are coupled respectively to relaying nodes /B and B via NMOS transistors N19 and N20 driven by signals RHRl and RHRr, respectively. Therefore, in response to these signals RHRl and RHRr, data of relaying nodes B and /B may be input to data nodes /X and X, respectively.

When relaying nodes B or /B is in a state of "1", it will be discharged with a "0" node of data latch XL, and set at "0". The initial state of data latch XL is set with signal XRSl or XRSr.

Relaying nodes B and /B are coupled to data bus DQ via data bus I/O circuit 24. That is, at a read/write time, data transfer between data bus DQ and relaying nodes B, /B is controlled via data bus I/O circuit 24. In detail, at a read time, bit line data are sequentially sensed by sense amplifier 21, and sequentially stored in data latches 26t or 26c via relaying nodes B, /B, and these stored data are sequentially output to data bus DQ via relaying nodes B, /B again.

Data bus I/O circuit 24 sets the data state of relaying nodes B and /B in accordance with data state of nodes X, /X of data latch XL and signals RWl, RWr, BRSl and BRSr, and selectively couples data bus DQ to relaying node B or /B in accordance with signals CSL, xi and xj.

One data node V of data latch DLl or DLr is coupled to relaying node B or /B under the control of clock CKl or CKr. That is, data latches DLl or DLr store write data in data nodes V, which are sequentially transferred via I/O circuit 24 and via relaying node B or /B at a write time, and store sensed data in data nodes V, which are sequentially transferred via transfer circuit 22 and via relaying node B or /B at a read time. Data on the other data nodes /V of data latches DLl or DLr are supplied to bit lines BL or /BL simultaneously via NMOS transistors N20t(0-i) or N20c(0-i) driven by signal PRGl or PRGr.

Data nodes V are coupled to gates of verify-judge NMOS transistors N6t(0-i) and N6c(0-i). The drains of transistors N6t and N6c are coupled in common to judge-use signal lines /DLl and /DLr, respectively. Write completion judgment circuit 25 judges write completion based on data on the judge-use signal lines /DLl and /DLr.

Further disposed at input nodes IN and /IN of the sense amplifier 21 are first bit lie charging circuits 27t and 27c, in which PMOS transistors P1 driven by charging control signal /ACCpr and NMOS transistors driven by adjusting signal VRR are connected in series between Vdd node and input nodes IN and /IN.

Still further disposed at input nodes IN and /IN are second bit line charging circuit 28t and 28c, which serve for charge-up a write completed bit line to Vdd in a quick pass write (QPW) mode described later. In the second bit line charging circuits 28t and 28c, PMOS transistors P2 driven by data relaying node /B and B and PMOS transistors P3 driven by control signal /QWl and /QWr are connected in series between Vdd node and input nodes IN and /IN.

Figure 20:
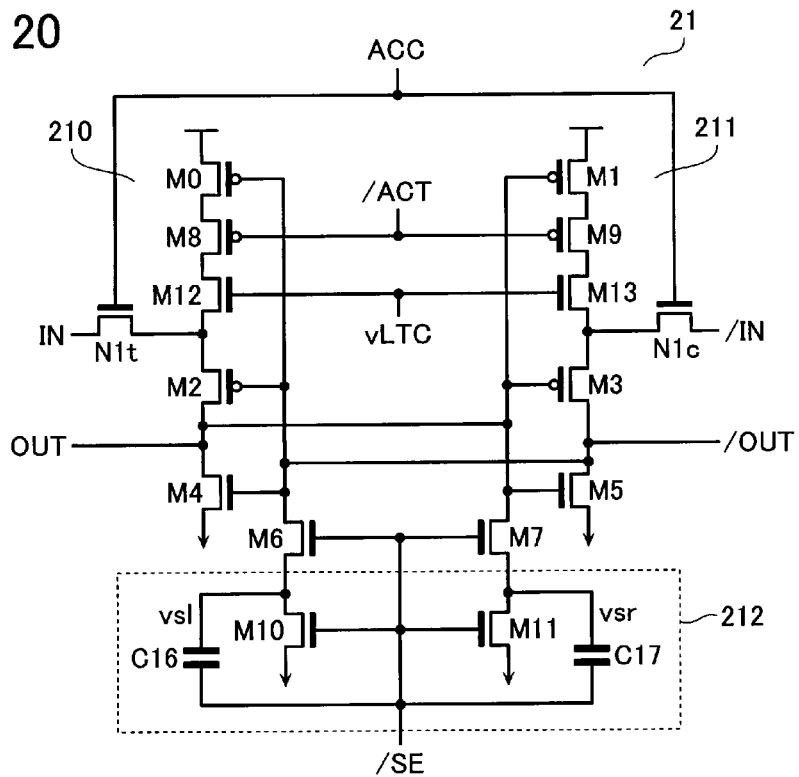
FIG. 20 shows a detailed configuration of a sense amplifier in the sense unit.

FIG. 20 shows the detailed configuration of sense amplifier 21. This is a current-detecting type of sense amplifier for detecting the cell current in comparison with the reference cell current, and a latch type of CMOS differential amplifier. To construct such a sense amplifier that certainly detects a cell current under 1 µA, it is required of the amplifier to sense data with a sufficient margin without regard to variations of the device characteristics.

This sense amplifier 21 is formed under such a concept that even if there are variations for breaking the symmetrical characteristic, the sense amplifier takes in the variations as an offset, thereby making itself possible to sense only data.

Explaining in detail, the sense amplifier 21 has two current paths 210 and 211 formed between Vdd node and Vss node. The first current path 210 has PMOS transistors M0 and M8, NMOS transistor M12, PMOS transistor M2 and NMOS transistor M4 connected in series. The second current path 211 has PMOS transistors M1 and M9, NMOS transistor M13, PMOS transistor M3 and NMOS transistor M5 connected in series.

The source of PMOS transistor M2 serves as one cell current input node, which is coupled to input node IN via NMOS transistor N1t while the source of PMOS transistor M3 serves as the other cell current input node, which is coupled to another input node /IN via NMOS transistor N1c.

A connection node between PMOS transistor M2 and NMOS transistor M4 in the first current path 210 serves as one output node OUT while another connection node between PMOS transistor M3 and NMOS transistor M5 in the second current path 211 serves as the other output node /OUT.

The gates of PMOS transistors M0 and M2 and NMOS transistor M4 are coupled in common to the output node /OUT; and the gates of PMOS transistors M1 and M3 and NMOS transistor M5 to the output node OUT, whereby a CMOS latch is formed. In other words, a CMOS inverter constituting the first current path 210 and another CMOS inverter constituting the second current path 211 have cross-coupled input/output nodes to constitute a latch.

PMOS transistors M8 and M9 serve as activation ones, the gates of which are driven by activation signal /ACT. NMOS transistors M12 and M13 serve as current limiting devices of the current paths 210 and 211. These transistors are driven by signal vLTC to define the sense amplifier current.

The gates of NMOS transistors M4 and M5 in the CMOS latch are coupled to drains of NMOS transistors M6 and M7, respectively, which are driven by sense signal /SE. The pair of transistors M6 and M7 are on-driven by sense signal /SE="H" in a stationary state to make NMOS transistors M4 and M5 in the CMOS latch off, i.e., keep the differential amplifier inactive.

That is, current flowing in the current paths 210 and 211 with the activation signal /ACT="L" will be carried to Vss node via NMOS transistors M6 and M7 until the sense signal /SE becomes "L". After the cell current difference is input to the amplifier, NMOS transistors M6 and M7 are turned off with /SE="L" and pass currents thereof are shut off at a sensing time, thereby resulting in that the CMOS latch is made active, and the current difference in the current paths 210 and 211 is amplified as a drain voltage difference between NMOS transistors M6 and M7 with a positive feedback.

In this embodiment, NMOS transistors M10 and M11, the gates of which are driven by /SE, are disposed between the sources of NMOS transistors M6 and M7 and Vss node, respectively, and capacitors C16 and C17 are disposed between the sources of NMOS transistors M6 and M7 and /SE node, respectively.

The circuit portion of NMOS transistors M10, M11 and capacitors C16 and C17 constitutes an offset circuit for generating an offset voltage, which serves for reducing the influences of current unbalance due to device characteristics on the current paths 210, 211.

The basic operation of this sense amplifier is as follows. While the sense signal /SE is in an "H" state, NMOS transistors M6, M7, M10 and M11 are kept on, and output nodes OUT and /OUT are kept in an "L" level. When the activation signal /ACT becomes "L", current flows in the current paths 210, 211. When cell current and reference cell current are input to the current paths from input nodes IN and /IN in response to a cell current introducing signal ACC, there is generated a small voltage difference between the respective drains of NMOS transistors M6 and M7 in accordance with the cell current difference.

When sensing signal /SE becomes "L", NMOS transistors M6 and M7 are turned off, and drain voltage difference thereof is amplified in accordance with a positive feedback operation of the latch circuit, thereby resulting in that one of NMOS transistors M6 and M7 becomes on; and the other off. That is, when one of NMOS transistors M6 and M7 is changed from on to off, the timing difference of the level-shifts in these NMOS transistors is converted to the drain voltage difference, and it is amplified together with the positive feedback.

In addition to the above-described basic operation, it is used in this embodiment some ideas for effectively preventing the amplifier from erroneously sensing due to variations of device characteristics. One of these ideas is that a large number of devices are used in the current paths 210, 211. In detail, there are disposed NMOS transistors M12 and M13 in the current paths 210 and 211 for controlling their conductance. These NMOS transistors M12 and M13 serve for reducing the influence of characteristic variations between PMOS transistor pairs of M0 and M1, and between PMOS transistor pairs of M8 and M9.

Figure 21:
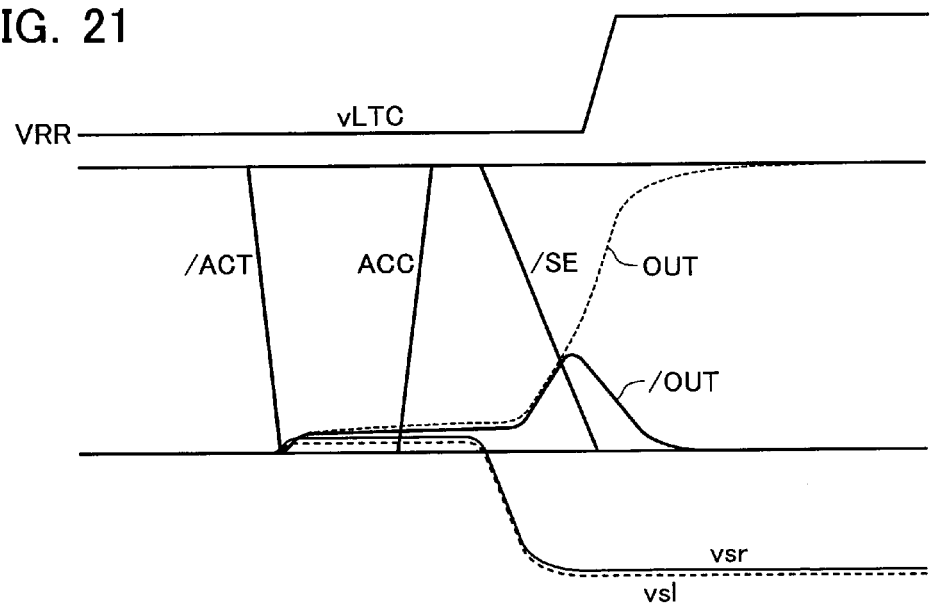
FIG. 21 shows operation waveforms of the sense amplifier.

The function for preventing the erroneous sensing of sense amplifier 21 will be explained in detail with reference to FIG. 21 below. Prior to inputting the cell current to the sense amplifier with cell current catching signal ACC raised, the nodes "vsl" and "vsr" of capacitors C16 and C17 are set at voltage levels, which are boosted from Vss level as being influenced with the variations of device characteristics on the current paths 210 and 211.

When sensing signal /SE is set at "low" (Vss), NMOS transistors M6, M7, M10 and M11 are tuned off. At this time, the sources of NMOS transistors M6 and M7 are set at imaginary Vss, which are lower than Vss and reflected by the voltage difference previously set at nodes "vsl" and "vsr". As a result, an offset voltage is applied to the sources of NMOS transistors M6 and M7, which are going to be off, such as to reduce the influence of device characteristic variations on the current paths 210 and 211.

Further, NMOS transistors M12 and M13 are kept in a low conductance state with the gate control signal vLTC set to be low before stepping-down the sense signal /SE. As a result, the influences of variations between PMOS transistors M0 and M1, and between PMOS transistors M8 and M9, which constitute a feedback loop in the sense amplifier operation, are also reduced. In other words, PMOS transistors disposed on the power supply (Vdd) side in the current paths are set to relatively highly conductive. As a result, the variations of device characteristics on the current paths may be reduced.

Boosting the gate voltage vLTC at the sensing time, NMOS transistors M12 and M13 are made to have a sufficiently high conductance, so that detected data may be latched at a high rate after determining data.

As described above, the sense amplifier in accordance with this embodiment is a current detecting type of one, and has an offset voltage generating circuit for reducing the influences of device characteristic variations. As a result, it becomes possible to sense data at a high speed with a high performance.

Figure 22:
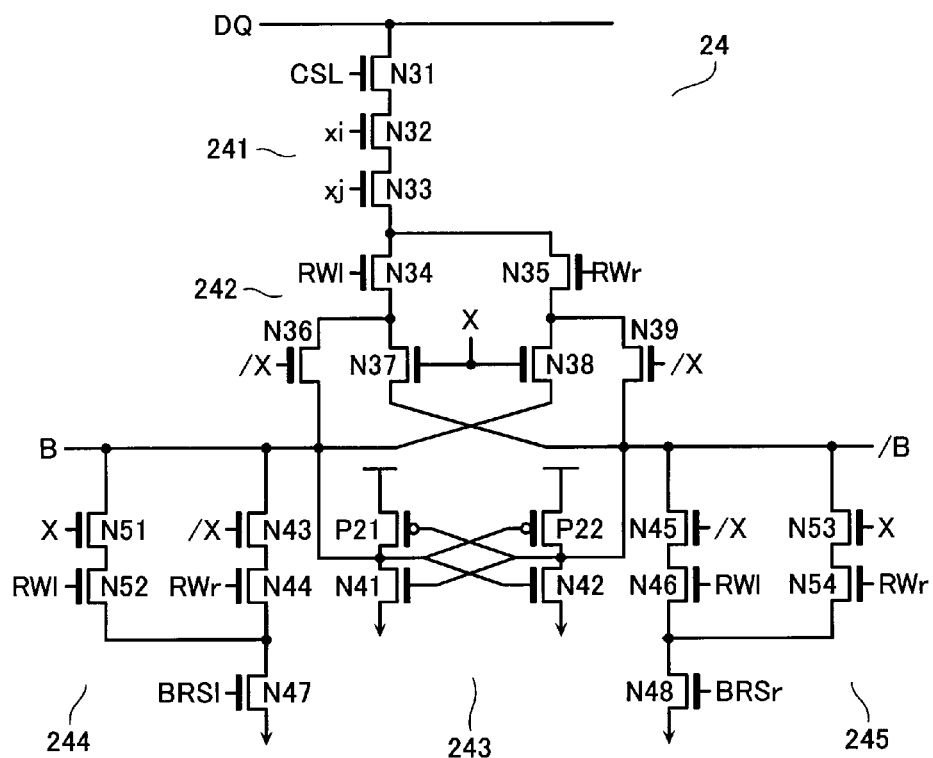
FIG. 22 shows data I/O circuit 24 in the sense unit.

FIG. 22 shows the data bus IO circuit 24, in which NMOS transistors N31, N32 and N33 driven by signals CSL, xi and xj, respectively, constitute a selection gate circuit 241 for selecting sense-latch systems to be coupled to data bus DQ.

It is a switch circuit 242 to select which of data relaying nodes B and /B is to be coupled to data bus DQ. In detail, the switch circuit 242 has: NMOS transistors N34 and N35 selectively driven by signals RWl and RWr, respectively; NMOS transistors N37 and N38 driven by data at node X to couple NMOS transistors N34 and N35 to relaying nodes /B and B, respectively; and NMOS transistors N36 and N39 driven by data at node /X to couple NMOS transistors N34 and N35 to relaying nodes B and /B, respectively.

Latch 243 is a normal CMOS latch, which is constituted by PMOS transistors P21, P22 and NMOS transistors N41, N42 to be coupled to relaying bodes B and /B.

Reset circuits 244 and 245 have NMOS transistors N47 and N48 selectively driven by reset signals BRSl and BRSr, respectively. To selectively couple NMOS transistor N47 to relaying node B, there are provided NMOS transistors N51 and N52 taking AND logic between data at node X and signal RWl; and NMOS transistors N43 and N44 taking AND logic between data at node /X and signal RWr. Similarly, to selectively couple NMOS transistor N48 to relaying node /B, there are provided NMOS transistors N45 and N46 taking AND logic between data at node /X and signal RWl; and NMOS transistors N53 and N54 taking AND logic between data at node X and signal RWr.

With the IO circuit 24, data line DQ and relaying node B or /B are coupled to each other in accordance with a data state of nodes X and /X, and a selection state of signals RWl and RWr. Applying pulse signal BRSl or BRSr, relaying node B or /B may be discharged. Note here that data transfer between data line DQ and relaying node B or /B is performed as "L" level data transfer. Therefore, it is required of the node receiving data to be previously set at Vdd.

Figure 23:
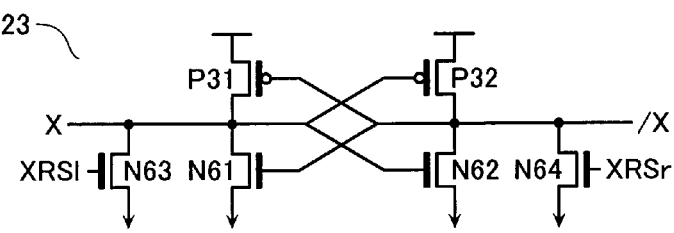
FIG. 23 shows data register XL in the sense unit.

FIG. 23 shows data register 23 (i.e., data latch XL), which is a CMOS latch with PMOS transistors P31, P32 and NMOS transistors N61, N62. Connected to data nodes X and /X thereof are reset-use NMOS transistors N63 and N64, which are driven by signals XRSl and XRSr, respectively.

Therefore, the data register 23 is set to be: in a state of /X="H" in response to signal XRSl="H"; and in another state of X="H" in response to signal XRSr="H". As far as data receiving/transmitting is performed with the transfer gate formed of NMOS transistors N17 and N18 as shown in FIG. 19, this type of data register is able to transfer only "0" data (="L" data) while it is impossible to sufficiently transfer "1" data (="H" data) because there is a voltage drop corresponding the threshold voltage at the transfer gate.

Figure 24:
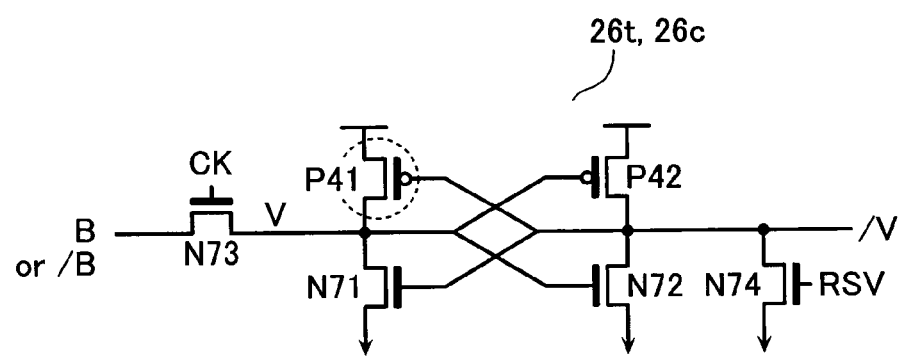
FIG. 24 shows data register 26t, 26c in the sense unit.

FIG. 24 shows the configuration of data register 26t, 26c (i.e., data latch DLl, DLr). This data register is a CMOS latch with PMOS transistors P41, P42 and NMOS transistors N71, N72. One data node V is coupled to relaying node B or /B via NMOS transistor N73 driven by clock CK; and the other node /V has a reset NMOS transistor N74 driven by reset signal RSV.

This data register 26t or 26c is formed as an extremely asymmetric latch for data under the condition that PMOS transistor P41 surrounded by a dotted line is made smaller than PMOS transistor P42 (i.e., the ratio of channel width W to channel length L of P41 is made smaller that that of P42). That is, from relaying node B (or /B) to data register node V, only "0" data is writable while from node V to relaying node B (or /B), only "0" data is transferable. From node /V to bit line BL (or /BL), both of "0" and "1" are transferable.

Explaining in detail, the data register is set at a state of V="H" with signal RSV="H". In case signal CK is "H" and relaying node B or /B is "L", node V is discharged to be "L". That is, "L" data (="0" data) is writable. In case data node V is "L" and relaying node B (or /B) is "H", data node V does not become "H" because the current drivability of PMOS transistor P41 is set to be sufficiently smaller than that of PMOS transistor P42. Therefore, "1" data is not writable. By contrast, "H" data at node /V may be transferred to a destination (i.e., a bit line) without being influenced with "L" data thereof.

Data transfer from relaying node B or /B to plural data latches 26t or 26c is performed in such a manner as follows: data nodes V are set at "H" with pulse signal RSVl or RSVr; pulse signals CKL0-CKLi or CKr0-CKri corresponding to selected bit lines are applied, whereby "L" level data at relaying node B or /B are sequentially transferred to nodes V.

Voltage control of bit line BL or/BL with plural data latches 26t or 26c is performed for all corresponding bit lines at a time. That is, signal PRGl or PRGr being kept at an "H" level state for a certain long time, bit line levels "H" and "L" may be set in accordance with "1" (="H") and "0" (="L") at data node /V. Explaining in detail, if data node /V is "1", the bit line will be set at such an "H" level that is about transistor's threshold voltage lower than the level applied to PRGl or PRGr, while if "0", the bit line will be discharged to be Vss.

At a verify-write time, verify control is performed in such a way that when all data writes have been completed, data registers 26t or 26c become all "L" (=all "1") states at data nodes V thereof. Therefore, in case the judging signal line /DLl or /DLr is kept at the precharged "H" state, it will be judged as write completion.

Figure 25:
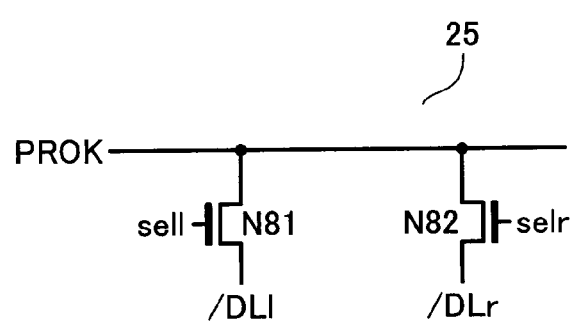
FIG. 25 shows write completion judgment circuit 25 in the sense unit.

FIG. 25 shows the configuration of the write judgment circuit 25. Judging signal line PROK is precharged at "H". Transistors N81 and N82 are disposed to be selected by signals "sell" and "selr" between signal line PROK and signal lines /DLl and /DLr, respectively. Write completion will be detected in accordance with whether signal line PROK is discharged or not with selection signal "sell" or "selr".

In other word, the write judgment circuit 25 serves for transferring data at signal /DLl or /DLr, which is a verify result of data register 26t or 26c, to the signal line PROK in accordance with signal "sell" or "selr", thereby noticing it to the external of the sense-latch system.

In this embodiment, the bit assignment for cell levels on the bit line BL side (i.e., T-cell array side) is the same as that on the bit line /BL side (C-cell array side). In this sense system, information cell levels L0-L3 and reference cell level (reference level) Lr are converted to a cell current difference in accordance with word line potential setting, and it will be sensed with the sense amplifier.

Figure 26:
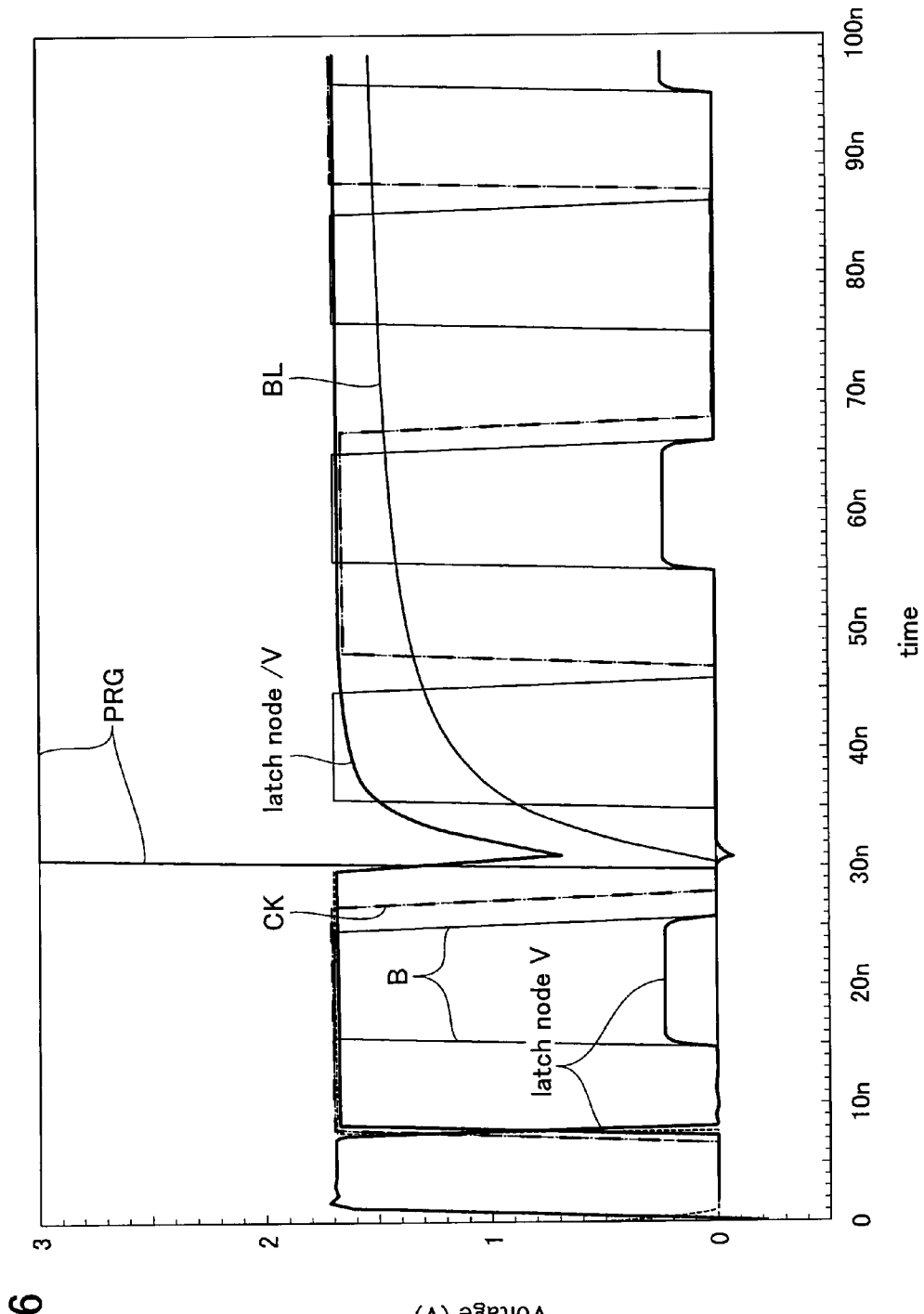
FIG. 26 shows a simulation result for teaching the asymmetric property of data register 26t, 26c

FIG. 26 shows a simulation result of the asymmetric data register 26t, 26c (data latch DLl, DLr). The ratio of channel width W to cannel length L, W/L, of PMOS transistors P41 and P41 are set to be 1/0.5 and 3/0.325, respectively. With respect to NMOS transistors N71, N72 and N73, W/L is set at 1/0.25.

The simulation result has been obtained on the assumption that the power supply voltage is Vdd=1.7V and under the condition of room temperature. It teaches that both of "0" data write from node B and "0" data transfer to node B are possible, and one directional data transfer to the bit line is possible without regard to data stored in the data register.

The initial state is v="H" (="1"); and /v="L" (="0") due to reset signal RSV="H". The level at node B is applied by a clock pulse that shows "1" during ions in 20 ns cycle. CK is applies as a clock pulse that shows "1" during 20 ns in 40 ns cycle.

While CLK="H", even if "H" is applied to the relaying node B, data node "v" is not set at "H". That is, it will be confirmed that when data node "v" is written once at a "0" data state, it is never rewritten to a data "1" state again.

Data transfer to the bit line BL is performed by applying 3V to as signal PRG. When the signal PRG is applied after the node "/v" becoming "H" (=Vdd), the node "/v" is temporally dropped down in potential in response to the bit line potential Vss, but it will be gradually boosted and restored to Vdd, so that the bit line is gradually charged-up from Vss to Vdd. Thereafter, even if node B is set at "H", the data state of the data register is not inverted, and the bit line state also is not changed. The simulation result teaches it.

Next, the procedures of the respective operations will be explained in detail. Although the following description is for such a case that bit line BL side is selected, the access of the bit line /BL is performed as similar to that of the bit line BL together with the following changes: change between DQ and /DQ; change between data register 26t (DL1) and 26c (DLr); and change between suffix "1" and "r" attached to various signals and nodes:

(Verify-Erase)

Figure 27:
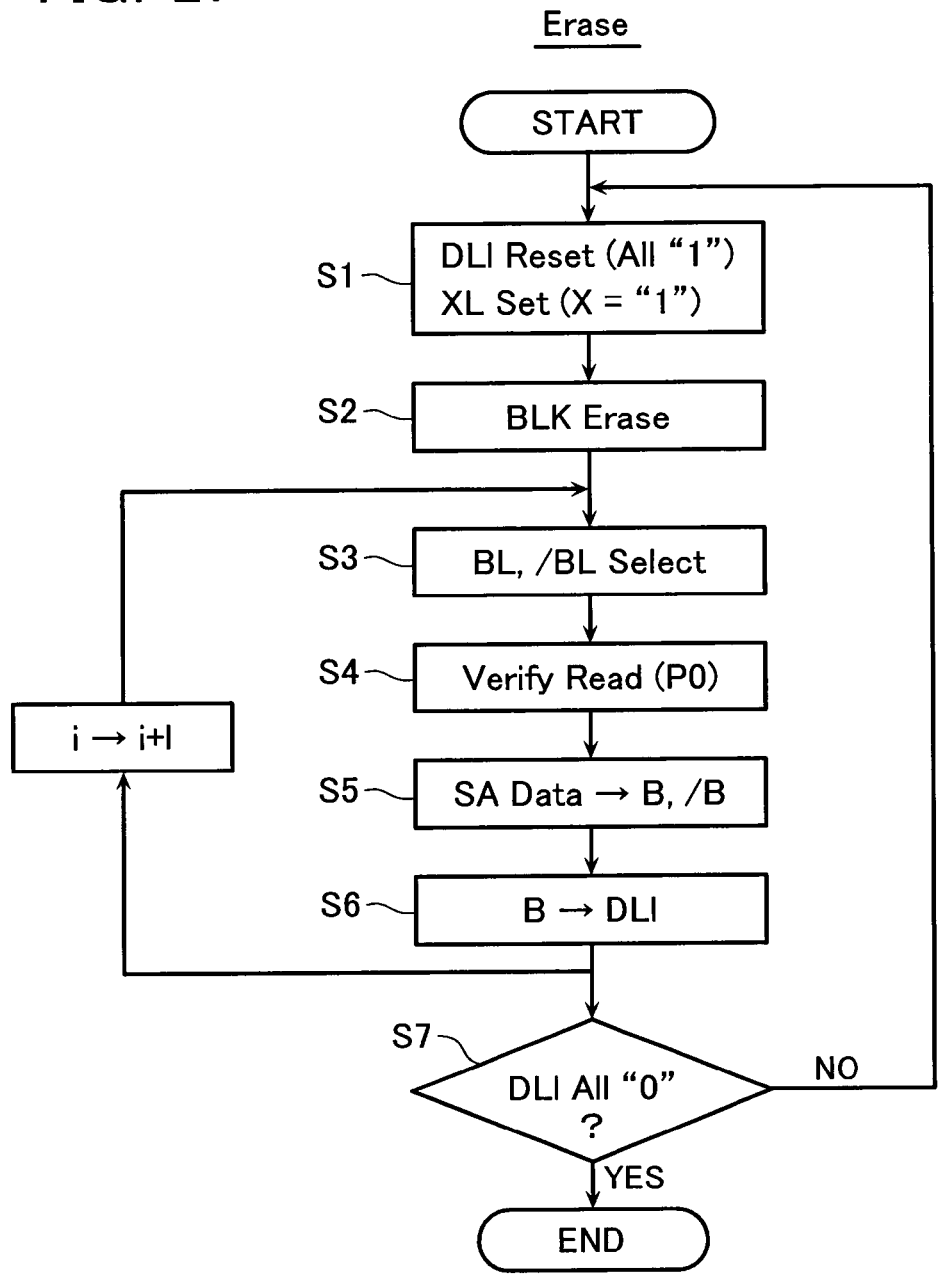
FIG. 27 shows an erase sequence.

FIG. 27 shows a verify-erase sequence. As an initial state, data registers 26t (data latches DL1) on the bit line BL side are reset at an all "1" state (step S1). In the following description, it should be noted that "H" and "L" states at the node "v" are defined as data "1" and "0" respectively, in data latches DLi and DLr.

Further, to set data mode between sense amplifier 21 and relaying nodes B, /B, data register 23 (i.e., data latch XL) is set in a state of X="1" (step S1). This is such a condition that OUT and /OUT are coupled to /B and B, respectively. In detail, this is for verifying erase under the condition that cell threshold voltage decreases as a result of erase, and cell current Ic becomes larger than the reference current Ir of second NAND string I-NAND on the side of the bit line /BL. In other words, this is for the purpose of that when the erase has been sufficiently performed, "0" is written in data latch DL1 as a result of verify-reading.

Next, after transferring all data in data latches DL1 to bit lines, and setting all bit lines to be Vss, a selected block is erased in a lump (step S2). The selected block is an information cell (T-cell) block or a reference cell (R-cell) block.

In detail, erase is performed in such a way that data (i.e., Vss) in data latches DL1 are transferred to bit lines by raising signal PRGl, and then all word lines are set at 0V; and the cell well is applied with the erase voltage.

Then, select a bit line pair BL and /BL (step S3), and activate the sense amplifier 21 to read the erased cell data (step S4). This verify-read is for detecting that the cell current Ic of each NAND cell unit has become larger than the reference current Ir of the reference NAND cell unit under the condition of: all word lines in the selected block are applied with 0V as shown in FIG. 10. If there is at least one cell that is insufficiently erased in a NAND cell unit, Ic<Ir.

The read data in the sense amplifier 21 is transferred to data relaying nodes B and /B (step S5). Further, data in the nodes B and /B will be transferred to data latch DL1 with CKl="1" (step S6). If B="0" (erase is insufficient), data latch DL1 becomes to have "0".

Alter the bit line number to select the following bit line pair (step S3). Similarly, the same read and transfer operations are repeated for all bit line pairs.

At step S7, it is detected with signal PROK whether data latches DL1 have be set in an all "0" state or not. If all "0" is detected, this erase sequence ends. If there is at least one "1" data, return to the initial step, and repeat the same erase and verify as described above.

Figure 31:
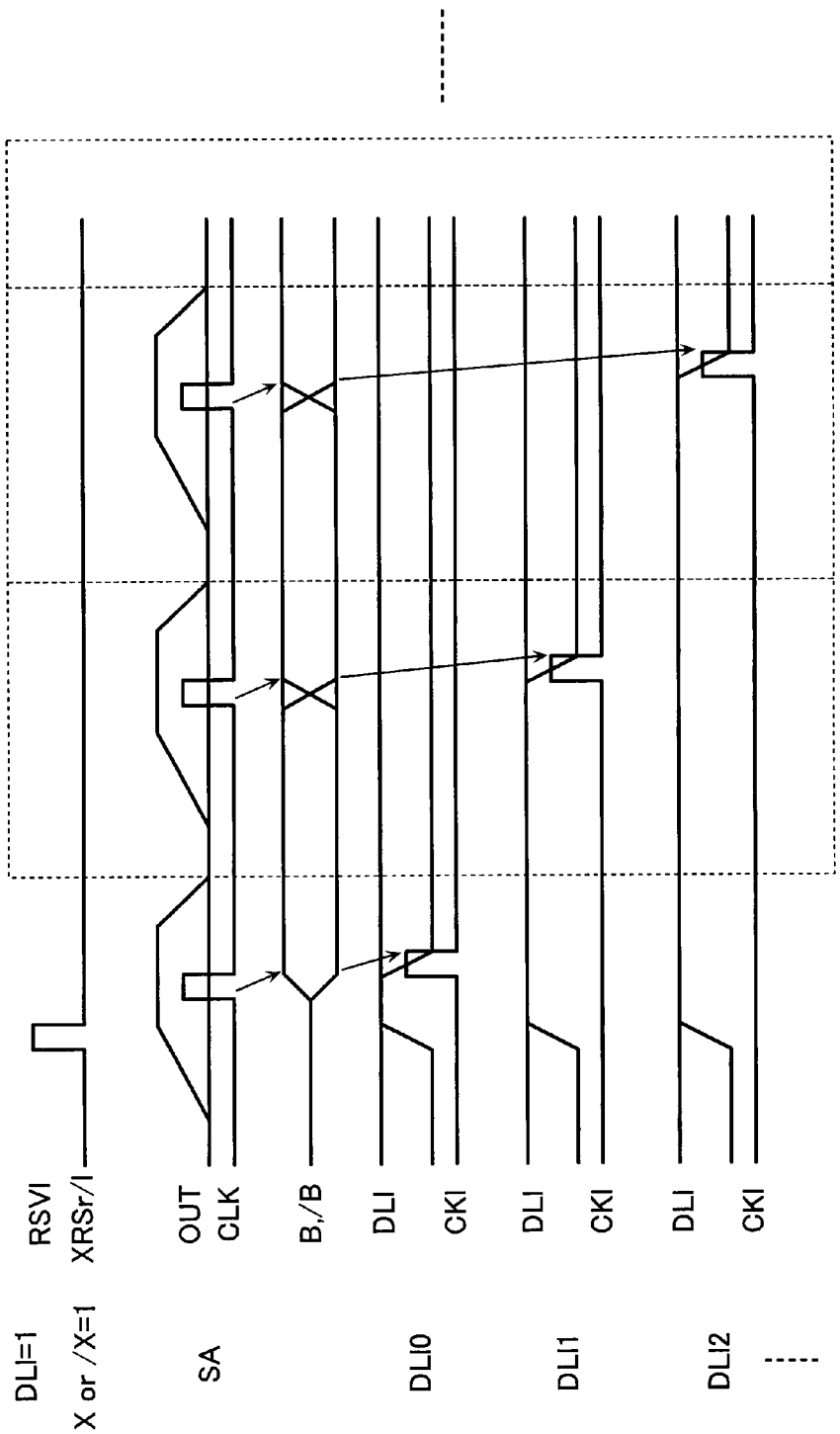
FIG. 31 shows verify-read operation waveforms at erase and reference cell write times.

FIG. 31 shows operation waveforms in the case that read data in the sense amplifier SA are sequentially transferred to data latch DL1 under the condition that DL1="1" and /X="1" are set. In this case, as the connection state between the outputs of the sense amplifier and relaying nodes B and /B, OUT-B and /OUT-/B are selected. With the signal CLK, the sense data are sequentially transferred to relaying nodes B and /B, and then loaded in data latches DL1 (DL10, DL11, . . . ). In case one sense amplifier is disposed for 8 bit line pairs, data transfer operations will be repeated 8 cycles.

(Reference Cell Verify-write)

Figure 28:
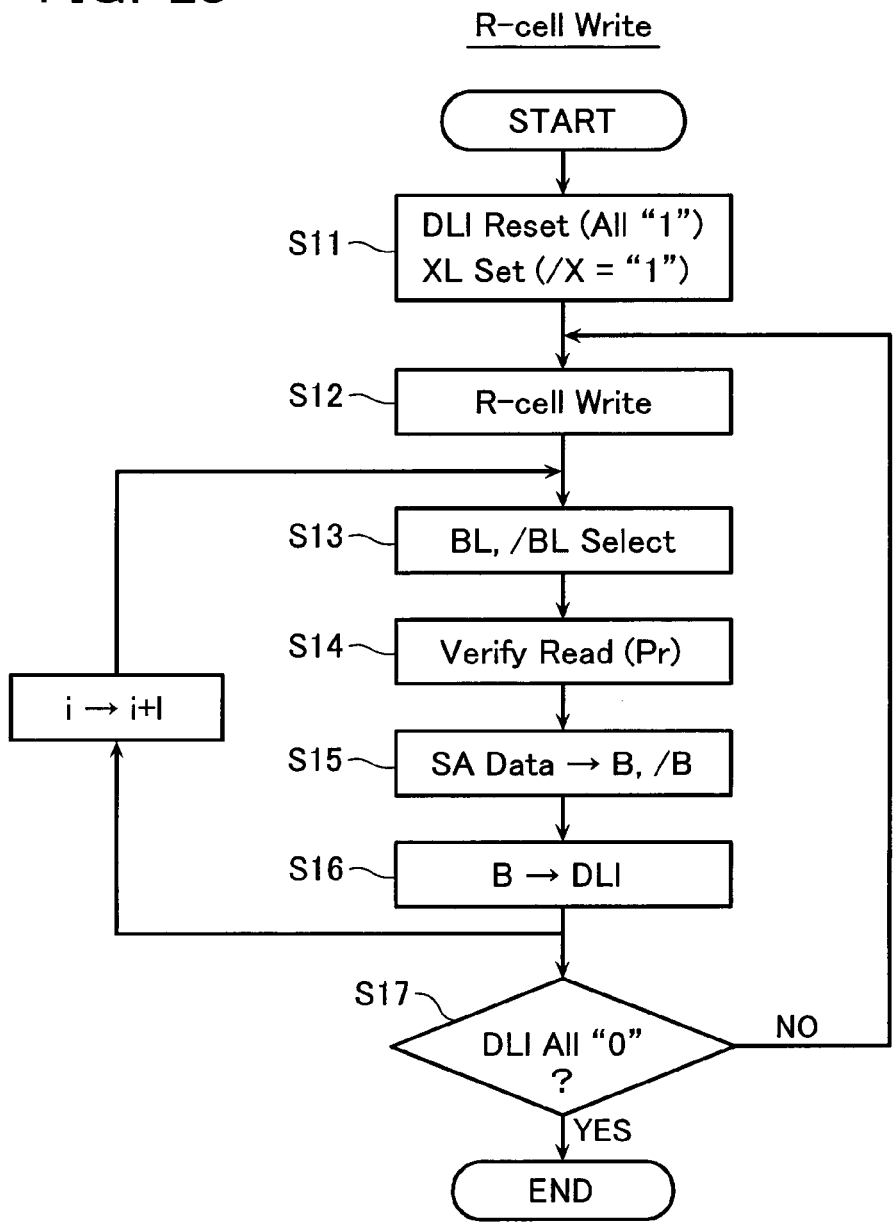
FIG. 28 shows a reference cell write sequence.

FIG. 28 shows a verify-write sequence of the reference cell (R-cell), which is similar to the erase flow. What is different from the erase sequence is as follows: since it is in need of increasing the cell threshold to the reference level Lr, cell current Ic is compared with reference current of the reference cell I-cell for judging Ic<Ir at a verify-read time.

As an initial state, all data registers 26t (data latches DL1) on the bit line BL side are set to be in a "1" state. Further, to set data transfer mode between sense amplifier 21 and relaying nodes B and /B, data register 23 (data latch XL) is set at /X="1" (step S11). This is such a condition that OUT and B, and /OUT and /B are coupled to each other as different from the above-described erase.

At the reference cell writing time, the reference cell threshold increases. Therefore, data write will be verified under the condition that cell current Ic becomes smaller than the reference current Ir of the second reference cell NAND string I-NAND on the bit line /BL side. In other words, if it has been sufficiently written, "0" data is written in data latch DL1 at a verify-read time.

After transferring data in the entire data latches DL1 to bit lines, and setting all bit lines to be Vss, a reference cell selected by a selected reference word line is written (step S12). In detail, data (i.e., Vss) in the data latches DL1 are transferred to bit lines with signal PRGl, and then data write is performed by applying write voltage Vpgm to the selected reference word line.

Then select bit line pairs BL and /BL (step S13), and activate the sense amplifier 21 for reading the reference cell data (step S14). This verify-read is for detecting that the cell current Ic has become smaller than the reference current Ir with the selected reference word line set at Pr as shown in FIG. 11.

The read data in the sense amplifier 21 is transferred to data relaying nodes B and /B (step S15). Further, data in the node B will be transferred to data latch DL1 with CKl="1" (step S16). If B="0" (write is sufficient), data latch DL1 becomes to have "0".

Alter the bit line number to select the following bit line pair (step S13). Similarly, the same read and transfer operations are repeated for all bit line pairs.

At step S17, it is detected with signal PROK whether data latches DL1 have become in an all "0" state or not. If all "0" is detected, this write sequence ends. If there is at least one "1" data, return to the step S12, and repeat the same write and verify as described above. In this case, a cell corresponding to DL1="0" is set in a write inhibit state with the corresponding bit line set at Vdd. Therefore, only an insufficiently written cell(s) will be written again.

Data transfer waveforms from the sense amplifier to data latch DL1 are basically the same as those shown in FIG. 31, but it is used such a connection of OUT-/B and /OUT-B with X="1" in this case.

(HB Data Write)

Figure 29:
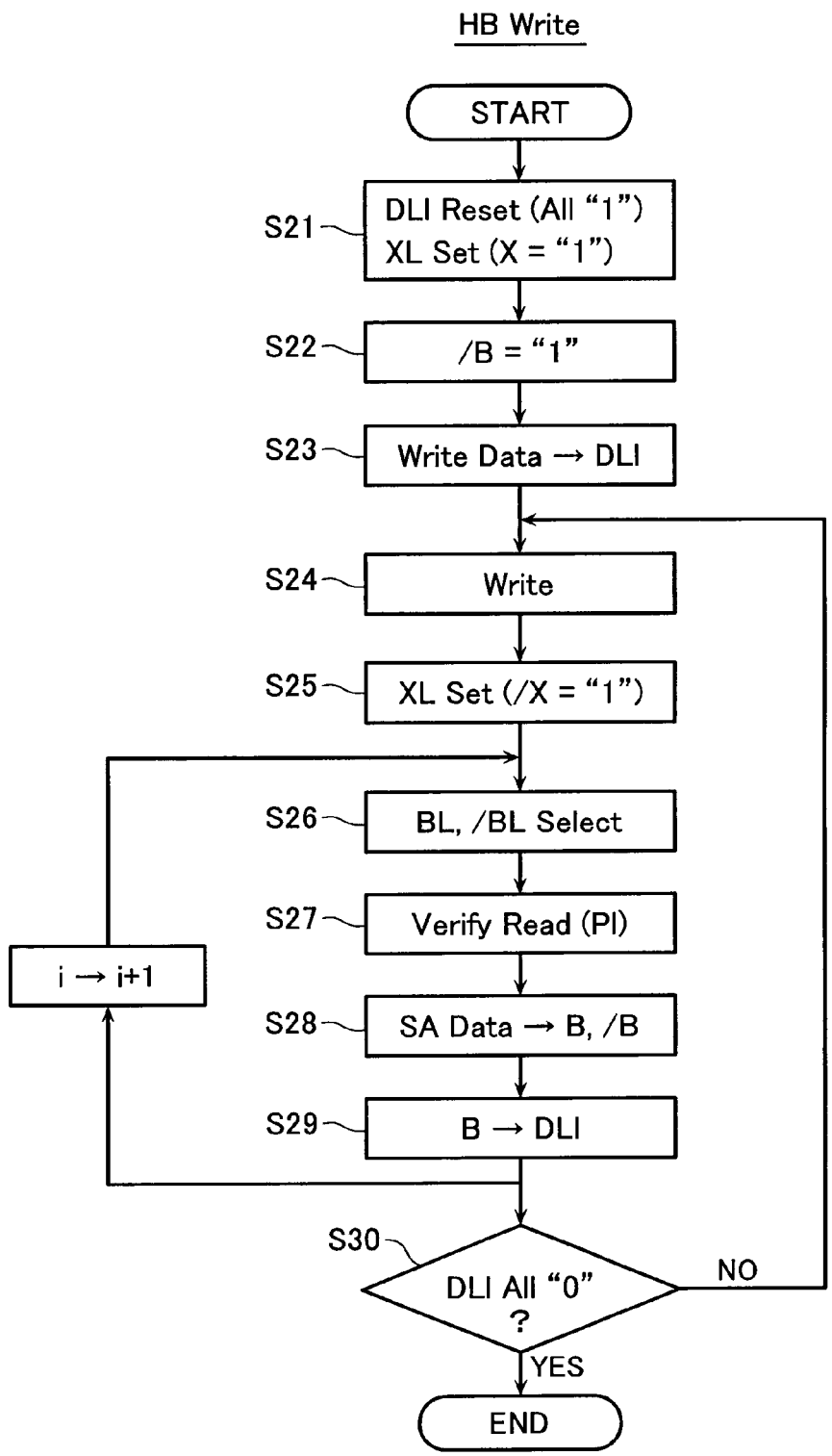
FIG. 29 shows an HB data write sequence.

Next, referring to FIG. 29, the upper (or higher) bit (HB) data write will be explained below. At the HB data write time, write HB data is loaded in data register 26t (data latch DL1) via data line DQ. At this time, it is necessary to invert the data in data latch DL1 to that on the data line DQ. The reason is as follows; although write data for increasing cell threshold voltage is "0", data "1" in data latch DL1 supplies Vss to bit line BL, and this results in "0" data write.

Initially, reset the data latches DL1 to be an all "1" state, and set data register 23 (data latch XL) to be in X="1" state (step S21). This is such a condition that data line DQ is coupled to node /B.

To transfer write data to relaying node /B, it is set at "1" (step S22). For the purpose of this, apply signal RWl="1" to make a path between data line DQ and node /B, and apply BRSl="1". As a result, relaying bode B is discharged while relaying node /B is set at "1", and write data for the respective bit lines are sequentially transferred to node /B via data line DQ with CSL, xi and xj. In case DQ="0", node /B is discharged while in case DQ="1", node /B is not discharged and node B is set at "0".

With this sequence, write data transferred to data node /B are sequentially loaded in data latches DL1 (step S23). That is, sequentially setting signal CKl to be "1", data latches DL1 store write data inverted to those at data line DQ, and HB data write becomes ready.

Data of data latches DL1 are transferred to bit lines, so that bit lines are set at Vss and Vdd in accordance with "0" and "1" write data, respectively. Then write voltage is applied to the selected word line, data write is performed (step S24).

Following it, verify-read is performed by use of data in data latches DL1 as it is. First, data latch XL is set at /X="1" (step S25). This is such a condition that OUT is coupled to node B while /OUT is coupled to node /B.

Then, select bit line (step S26); perform verify-read with verify-voltage P1 (step S27) as shown in FIG. 14; transfer the sense data to nodes B and /B (step S28); and write data at node B into data latch DL1 with clock CKl="1" (step S29).

If a selected cell is sufficiently increased in threshold voltage, the corresponding data in data latch DL1 becomes "0" while data latch DL1 is kept as it is for an insufficiently written cell because of B="1". Bit lines are sequentially selected, and the same verify-read operations are performed for all bit lines as described above.

It is detected whether data latches DL1 become an all "0" state or not (step S30). If YES, write sequence ends while if NO, return to step S24, and repeat the same write operations. With respect to "0" written cells, a write-inhibit state will be set, and only an insufficiently written cell(s) will be written again.

Figure 32:
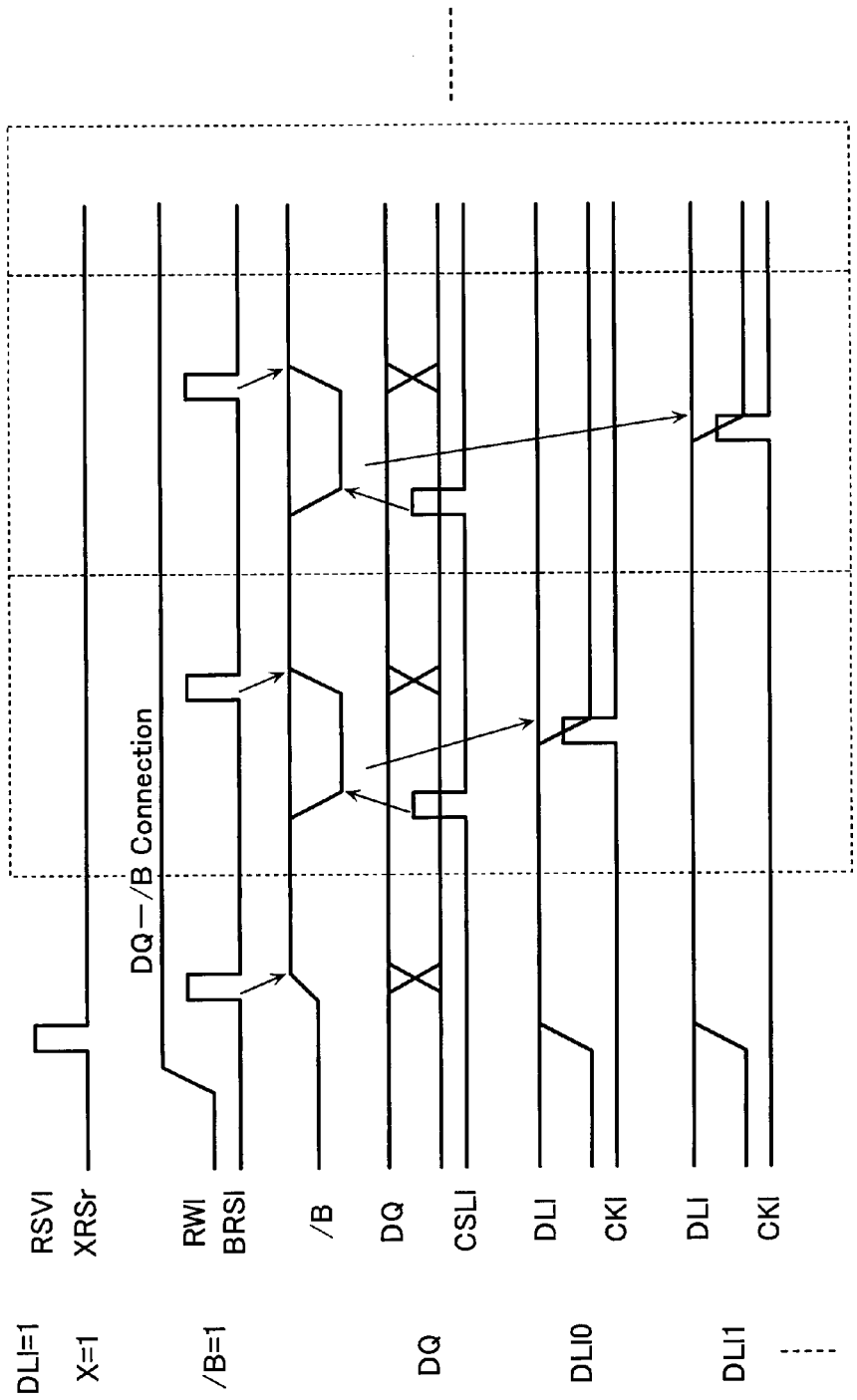
FIG. 32 shows operation waveforms of transferring/loading HB data write data.

FIG. 32 shows operation waveforms, in which write data on data line DQ are transferred to relaying node /B, and then transferred to data latches DL1. With signal RWl="1", data line DQ is coupled to the relaying node /B. At each cycle, CSL="1" is applied, and then pulse signal BRSl="1" is applied, data on the data line DQ is transferred to the relaying node /B.

Transferred Data at relaying node /B are sequentially transferred to data latches DL1 with signal CKl="1". As a result, each write data on the data line DQ is inverted and latched in data latch DL1.

Figure 33:
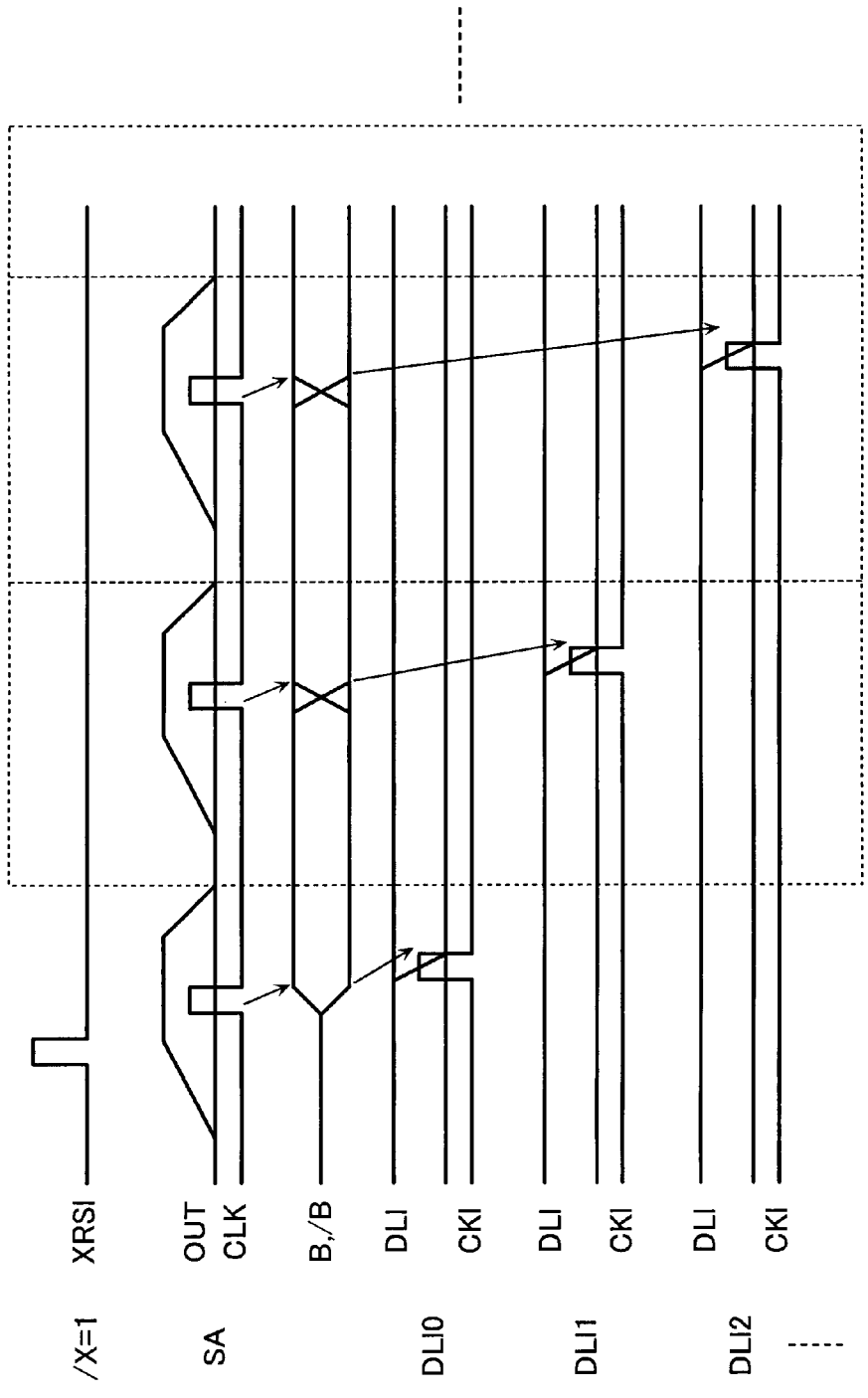
FIG. 33 shows operation waveforms of verify-reading at the HB data write time.

FIG. 33 shows operation waveforms for transferring the sense data to data latches DL1. In this operation, it is selected such a connection of OUT-B and /OUT-/B. The sensed data are sequentially transferred to the relaying nodes B and /B with signal CLK, and the data on node B are sequentially transferred to data latches DL1 with signal CKl.

As described above, according to this embodiment, write data are serially transferred to and loaded in first and second data registers sharing a sense amplifier, and then collective data write is performed. Further, serially performing verify-read for plural bit lines with a sense amplifier, and the results are subjected to feedback to the first and second data latches. With the above-described procedure, it becomes possible to do high-speed data write.

The above-described feature will be obtained in the following LB data write sequence.

(LB Data Write)

Figure 30:
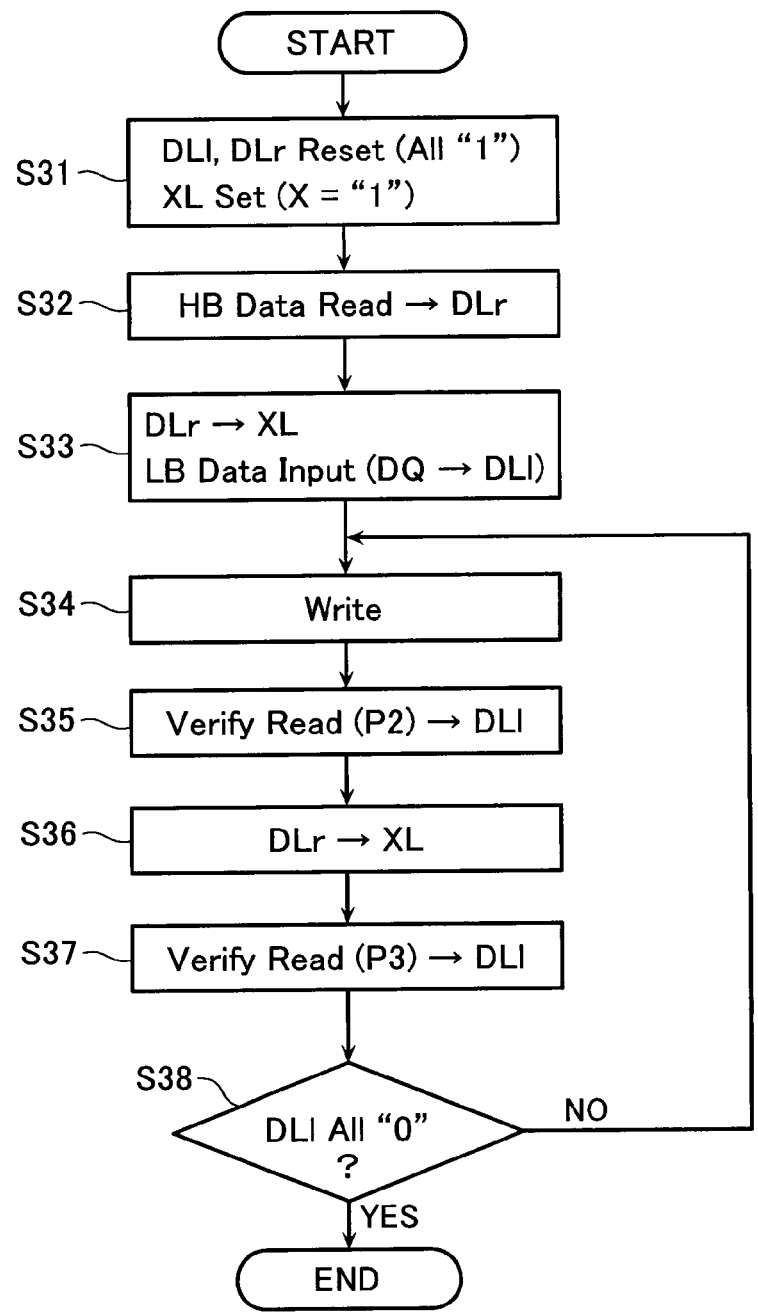
FIG. 30 shows an LB data write sequence.

FIG. 30 shows a lower bit (LB) data write sequence. In case of LB data writing, bit-assigned data and write data are not identical with each other, and LB data writing is over-writing for HB data. Therefore, it is in need of making assigned data for each threshold level based on the HB data of the write destination and write data. For this purpose, even if data write is for a bit line BL side, both data latches DL1 and DLr are used.

Initially, for write preparation, data latches DL1 and DLr are set to be in an all "1" state while data latch XL is set at X="1" (step S31). X="1" is a condition that when read data in the sense amplifier are transferred, connections of OUT-/B and /OUT-B are selected.

Then, HB data of the write destination is read out the cell array and stored in the right side data latch DLr (step S32). Read out HB data in the sense amplifier with bit line selection is inverted and loaded in the corresponding data latch DLr with signal CKr. This operation is repeated together with sequential bit line selections, read HB data on all selected bit lines are stored in data latches DLr.

Following it, HB data in data latch DLr is transferred to data latch XL, and write LB data is transferred from the data line DQ and loaded in data latch DLr under the condition of data in data latch XL (step S33).

Figures 34, 39:
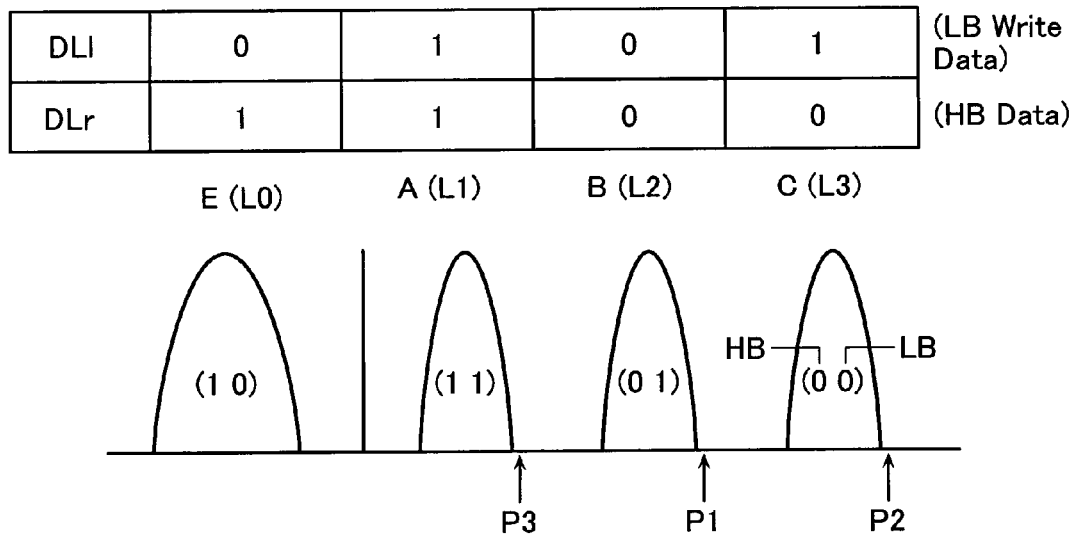
FIG. 34 shows a data storing state of data latches DL1 and DLr at an LB data write time.
FIG. 39 shows a sense data transferring state at an LB data write verify-read time.

As shown in FIG. 34, LB data assigned to four data levels are reverse to each other between a case of HB data="1" and another case of HB data="0". Therefore, to load write data in such a way that write data "0" is used for increasing the threshold voltage, it is in need of inverting LB data transferred from data line DQ in accordance with HB data. That is, as shown in FIG. 34, LB data to be loaded in data latch DL1 is inverted when HB data stored in data latch DLr is "0".

As explained previously, data in data latch DL1 is shown as that at node "v". Therefore, "0" and "1" data in data latch DL1 serve as "1" write (write-inhibit) data and "0" write data, which supply Vdd and Vss to bit lines, respectively.

Explaining in detail with respect to the step S33, to set HB data in the data latch DLr to data latch XL, data latch XL is reset at /X="1". Then, applying RWr="1", and BRSl="1" to data bus 10 circuit 24, relaying node B is discharged, whereby /B="1" is set. Following it, data in data latch DLr is transferred to node /B with CKr="1".

Then, data at node B, /B is transferred to data latch XL with RH="1". Data in data latch XL is set as the state of /X being the same as data latch DLr, i.e., it is inverted to that of data latch DLr.

Next, to load LB data in data latch DL1 from data line DQ, it will be inverted in accordance with HB data, or written as it is. Therefore, in accordance with the data state of data latch XL, data line DQ is selectively coupled to node B or /B.

Setting RWl="1", and simultaneously setting BRSl and BRSr to be "1", node B is discharged to making a path connecting DQ to node /B in the case /X="0" while node /B is discharged to making a path connecting DQ to node B in the case /X="1".

Next, in accordance with LB write data loaded in data latch DL1, bit line voltage control is performed, and then write operation is performed with the write voltage application (step S34).

After writing, verify-read operations are performed with verify voltages P2 and P3. Although which verify-read is to be advanced is not problem, it is shown here that verify-read with verify voltage P2 for verifying the uppermost level L3 is advanced.

That is, performing data read with verify voltage P2 applied to a selected word line, read data is written in data latch DL1 (step S35). Since the uppermost data level L3 is verified at this verify step, other data levels are sensed as data "1". Therefore, other data in data latches DL1 excluding the verify target will not be destroyed.

Explaining in detail this verify-read step, data latch XL is initially set at /X="1", thereby letting the sense data be transferred to data node B, /B as it is. If write is sufficient, the threshold level distribution will be set at data level L3, and sensed as "0" data, so that relaying node B becomes "0".

Then, setting signal CK1 to be "1" for data latch DL1 corresponding to a selected bit line, data in data latch DL1 changes from "1" to "0" only when data latch DL1 stores "1" and the relaying node B is "0". This is such a condition that the corresponding bit line (i.e., cell) is set in a write-inhibit state. As verify-read for data level L3, the above-described procedure will be repeated for all data latches DL1.

Next, verify-read is performed with verify voltage P3 for write-verifying data level L1. At this time, since data levels L2 and L3 are sensed as "0", it is in need of preventing data of data latch DL1 excluding verify target from being destroyed.

To do data transfer control for this purpose, HB data in data latch DLr is transferred to data latch XL (step S36). Explaining in detail, set data latch XL to be /X="1". In addition, apply pulse BRSl with RWl="1" to discharge relaying node B, thereby setting /B="1". Then, applying CKr="1", "0" in data latch DLr may be transferred to node /B, and data at node /B will be latched at node /X with RH pulse.

If HB data is "0", /X="0". At this time, sense amplifier output is inverted to be coupled to node B. By contrast, if HB data is "1", /X="1". Therefore, sense amplifier output is coupled to node B as it is. In case HB data is "0", data level is L2 or L3. This is sensed as "0", and transferred to node B as data "1", so that data latch DL1 is kept as it is. As a result, verify will be performed for only cell(s) with HB data is "1".

That is, verify-read with verify voltage P3 is performed under the transferring control of data latch XL (step S37). The sensed data is transferred to node B, and only "0" data at node B is latched in data latch DL1. As a result, data "1" stored in data latch DL1 is changed to data "0" only in case node B is "0", and it becomes a write-inhibiting state hereinafter.

The procedure described above will be performed for all data latches DL1, and write completion is judged by detecting whether data latches DL1 have become an all "1" state or not (step S38). If write is insufficient, write and write-verify described above will be repeated.

Figure 35:
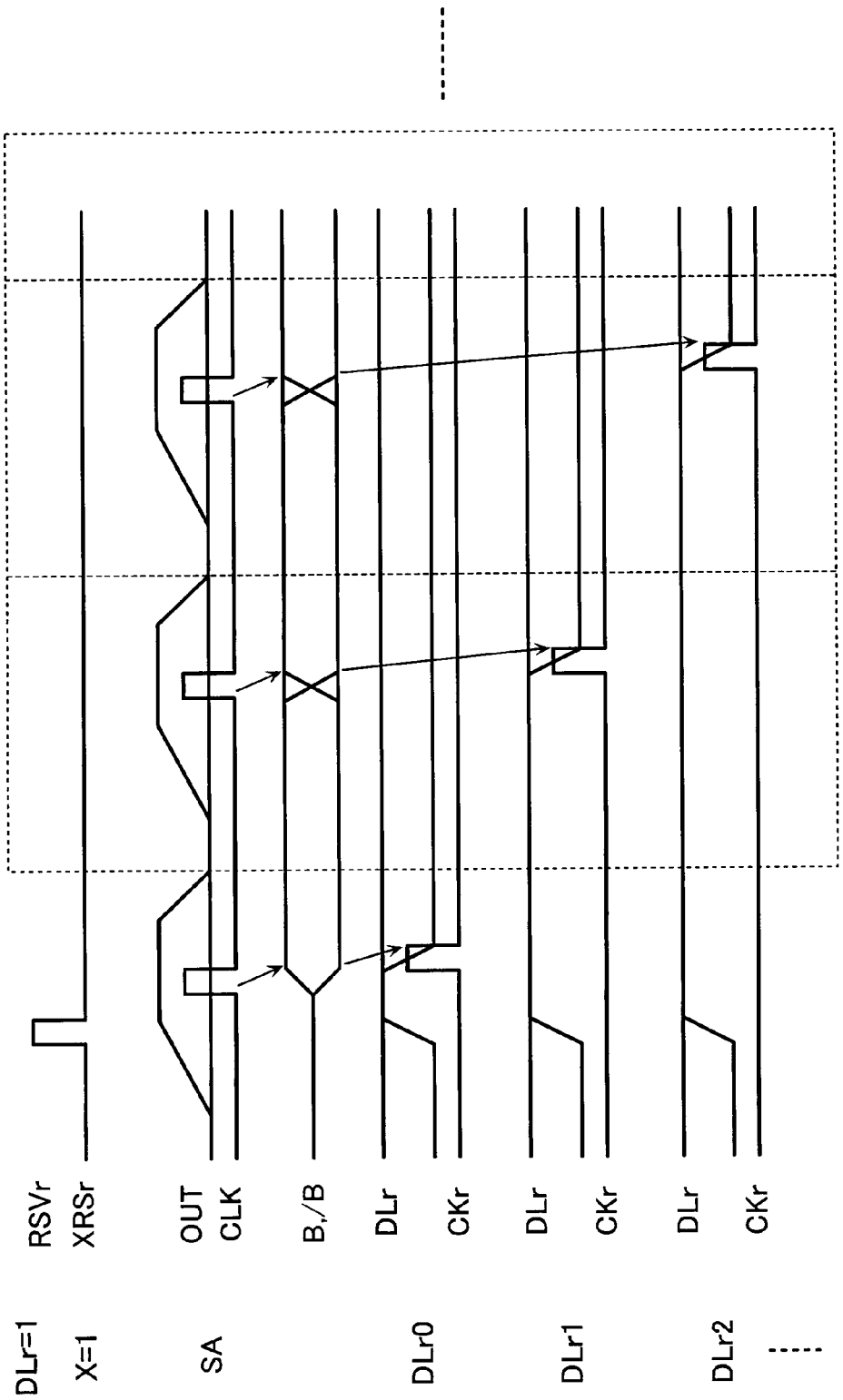
FIG. 35 shows operation waveforms of HB data reading to data latch DLr at an LB data write time.

FIG. 35 shows operation waveforms at the step S32, in which HB data are read out and transferred to data latches DLr. Data latch DLr is reset with signal RSVr, and data latch XL is set as X="1", whereby the following connection is achieved: OUT-/B and /OUT-B. The sensed data may be sequentially transferred to and latched in data latches DLr via node B, /B.

Figure 36:
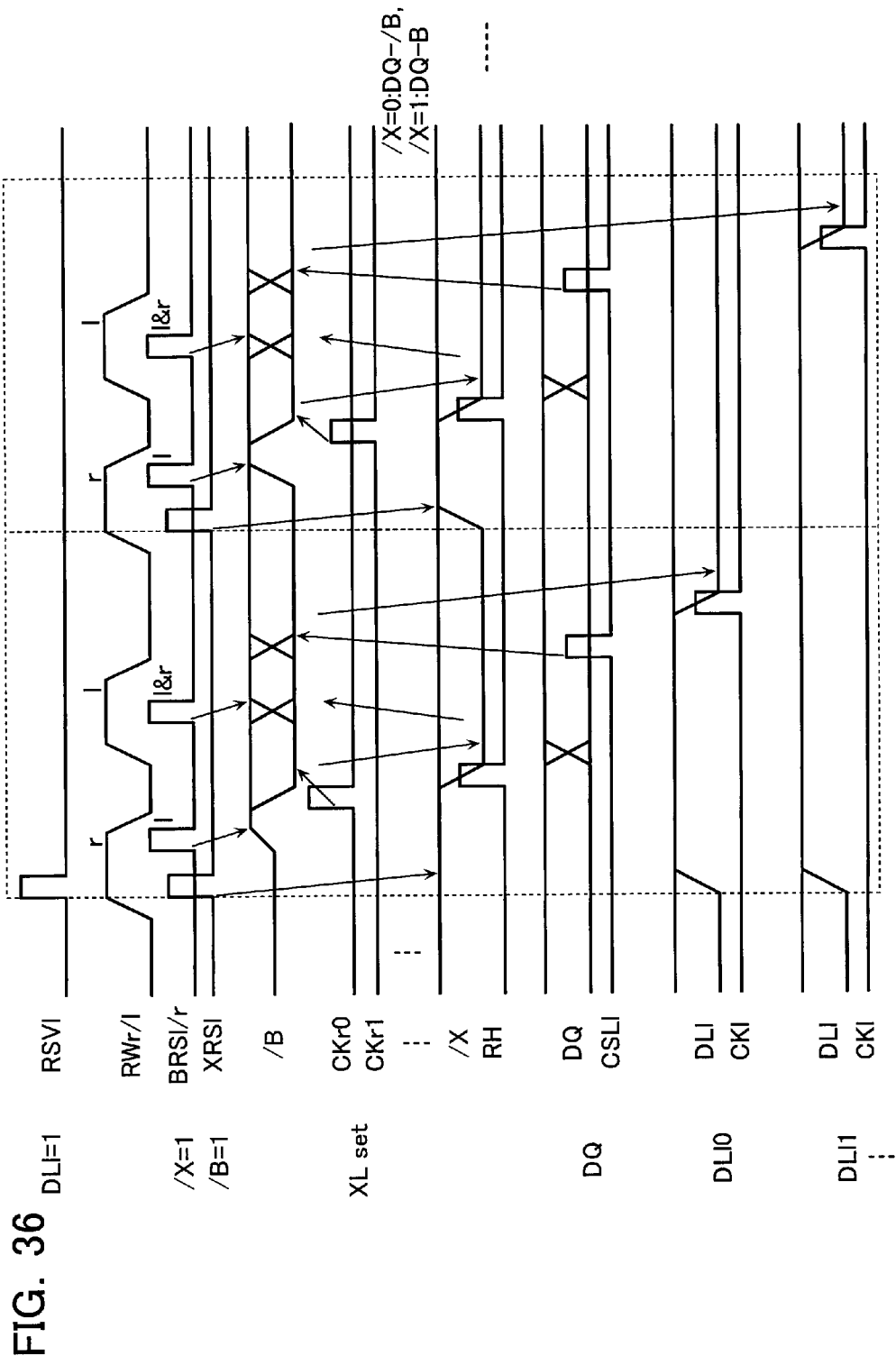
FIG. 36 shows operation waveforms of HB data transferring from data latch DLr to data latch XL.

FIG. 36 shows operation waveforms at the step S33, in which write LB data on data line DQ are transferred as it is or inverted to be transferred to data latches DL1 under the control of HB data in data latches DLr. Data latches DL1 are reset to be an all "1" state with reset signal RSVl. In addition, data latch XL is set at /X="1"; and nodes B and /B at /B="1".

With signals RWl/r, BRSl/r, XRSl and CKr, and based on HB data in data latch DLr, DQ-/B connection is formed in case of /X="0" while DQ-B connection is formed in case of /X="1". As a result, LB data supplied from the data line DQ are sequentially transferred as it is or inverted to be transferred in accordance with HB data, and latched in data latches DL1 with signal CK1.

Figure 37:
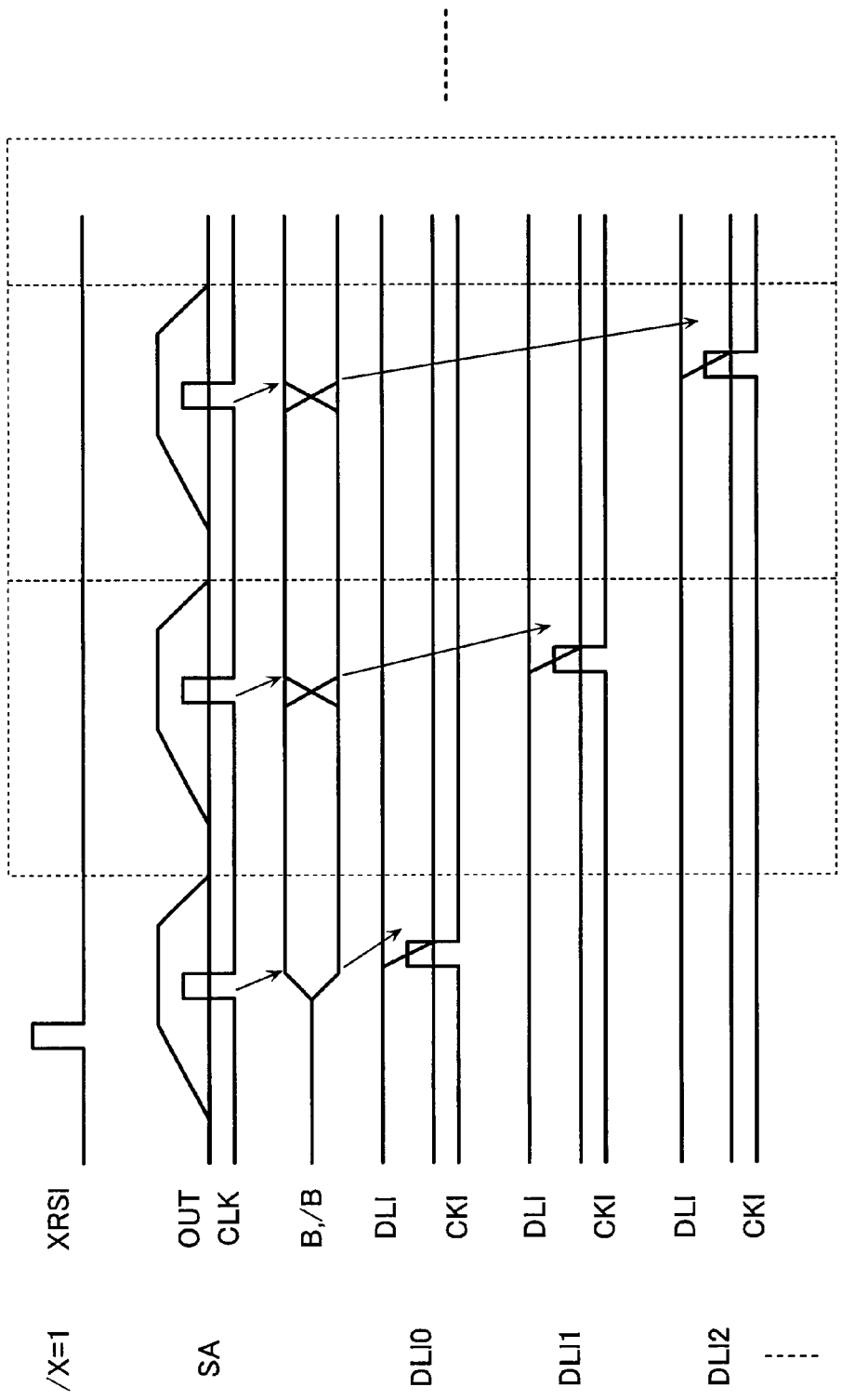
FIG. 37 shows operation waveforms of verify-read data transferring to data latch XL.

FIG. 37 shows operation waveforms at verify-read step S35. Similar to the upper bit (HB) write-verify, OUT-B connection and /OUT-/B connection are set with /X="1". Repeatedly sensing bit line data, the sensed data are sequentially transferred to and latched in data latches DL1 via nodes B, /B with clocks CLK and CK1.

Figure 38:
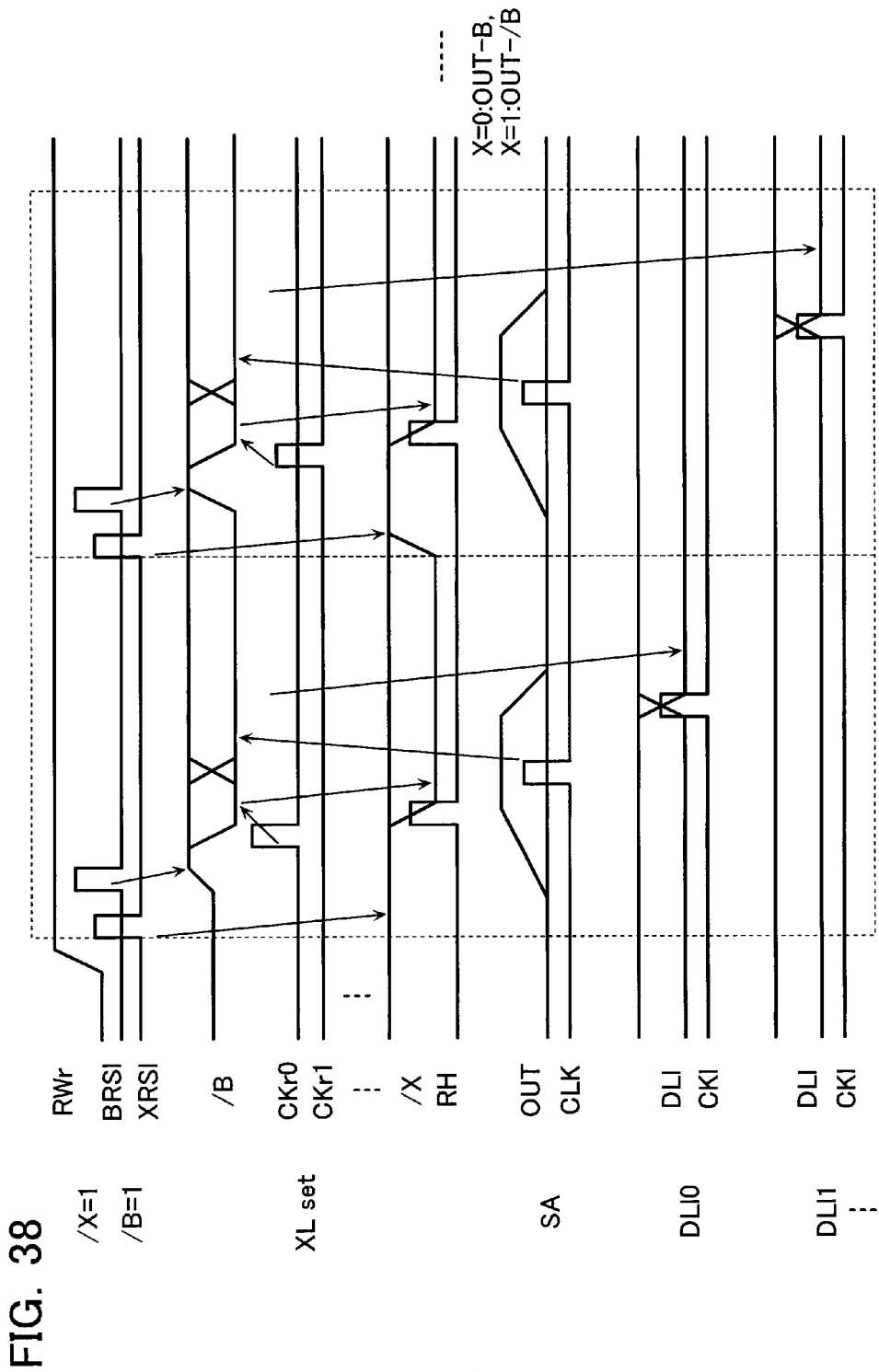
FIG. 38 shows operation waveforms of verify-read data transferring to data latch XL under the control of HB data.

FIG. 38 shows operation waveforms at verify-read step S37. /X="1" and /B="1" are initially set, and HB data in data latches DLr are sequentially transferred to node /B, and then stored at node /X with clock CKr. As a result, OUT-B connection is selected in case of X="0" whine OUT-/B connection is selected in case of X="1". Therefore, sensed data are transferred under the control of HB data and sequentially written into data latches DL1.

Sensed data corresponding to data levels L2 or L3 is defined as OUT="0". In this case, X="1" is obtained based on HB data in data latch DLr, so that OUT-/B connection is obtained. This results in B="1", and data latch DL1 is not rewritten.

FIG. 39 shows a data transition state of data latch DL1 and node B at the verify times with verify voltages P2 and P3 in the LB data write sequence. Data preset in data latch DL1 for "0" writing of data level L3 or L1 is "1". At the verify-read time with verify voltage P2, node B becomes "0" in case of level L3 writing while at the verify-read time with verify voltage P3, node B becomes "0" in case of level L1 writing. Based on these data, data latch DL1 is rewritten to have "0".

(QPW-Quick Pass Write)

So far, a normal LB data write has been explained. Next, LB data write with a quick pass write (QPW) scheme will be explained below. QPW is defied as a write scheme for achieving a high-speed performance and a narrow data threshold distribution as a whole in such a way that high-speed write is performed until the cell threshold level becomes near the target level; and the write condition is relaxed hereinafter (for example, under the condition of the bit line voltage).

With respect to the LB data write for 4-level data storage scheme in accordance with this embodiment, there are the following two cases: (a) QPW is adapted to data level L1, and data level L3 is subjected to a normal write (refer to as A-QPW, hereinafter), (b) QPW is adapted to data level L3, and data level L1 is subjected to a normal write (refer to as C-QPW, hereinafter).

Note here that A-QPW and C-QPW are based on the assumption that when data levels L0, L1, L2 and L3 are defined as levels A, B, C and D, respectively, (a) A-QPW means QPW for level L1 (i.e., A); and (b) C-QPW means QPW for level 3 (i.e., C).

To adapt QPW to both data levels L1 (=A) and L3 (=C), the number of data latches in the sense unit 20 shown in FIG. 20 is insufficient. Therefore, here is explained such a case that A-QPW and C-QPW may be achieved with different sequences each other with the sense unit 20 shown in FIG. 19.

In the QPW-LB data write sequence on the bit line BL side, write data is held in data latch DL1 on the bit line BL side; and discrimination data for designating a data level as a QPW target is held in data latch DLr. The discrimination data is obtained by reading out HB data from the cell array to data latch DLr, and over-writing "0" data in data latch DL1 to it.

Figure 40:
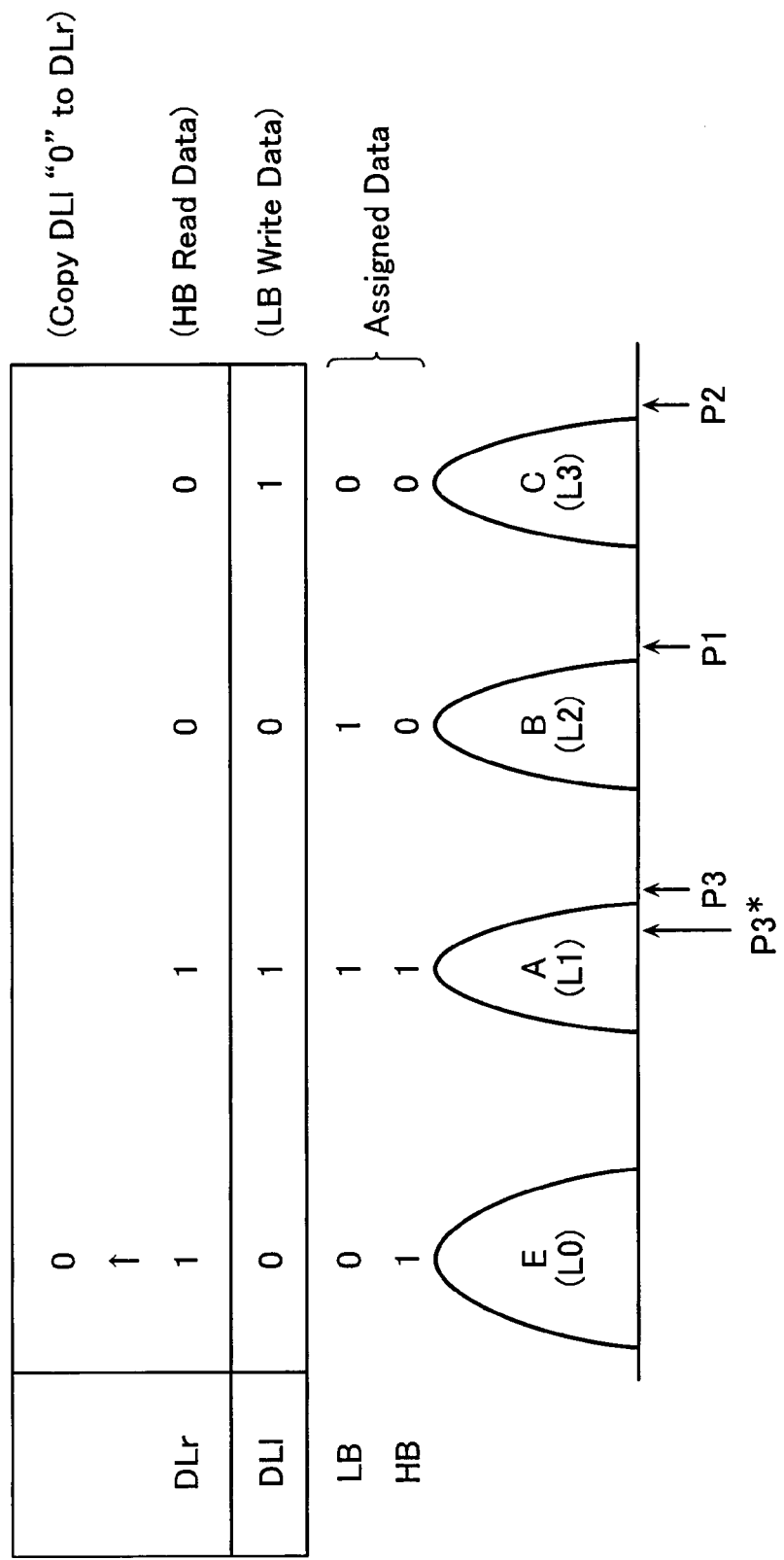
FIG. 40 shows data states of data latches DL1 and DLr when LB data write is performed by A-QPW.
Figure 41:
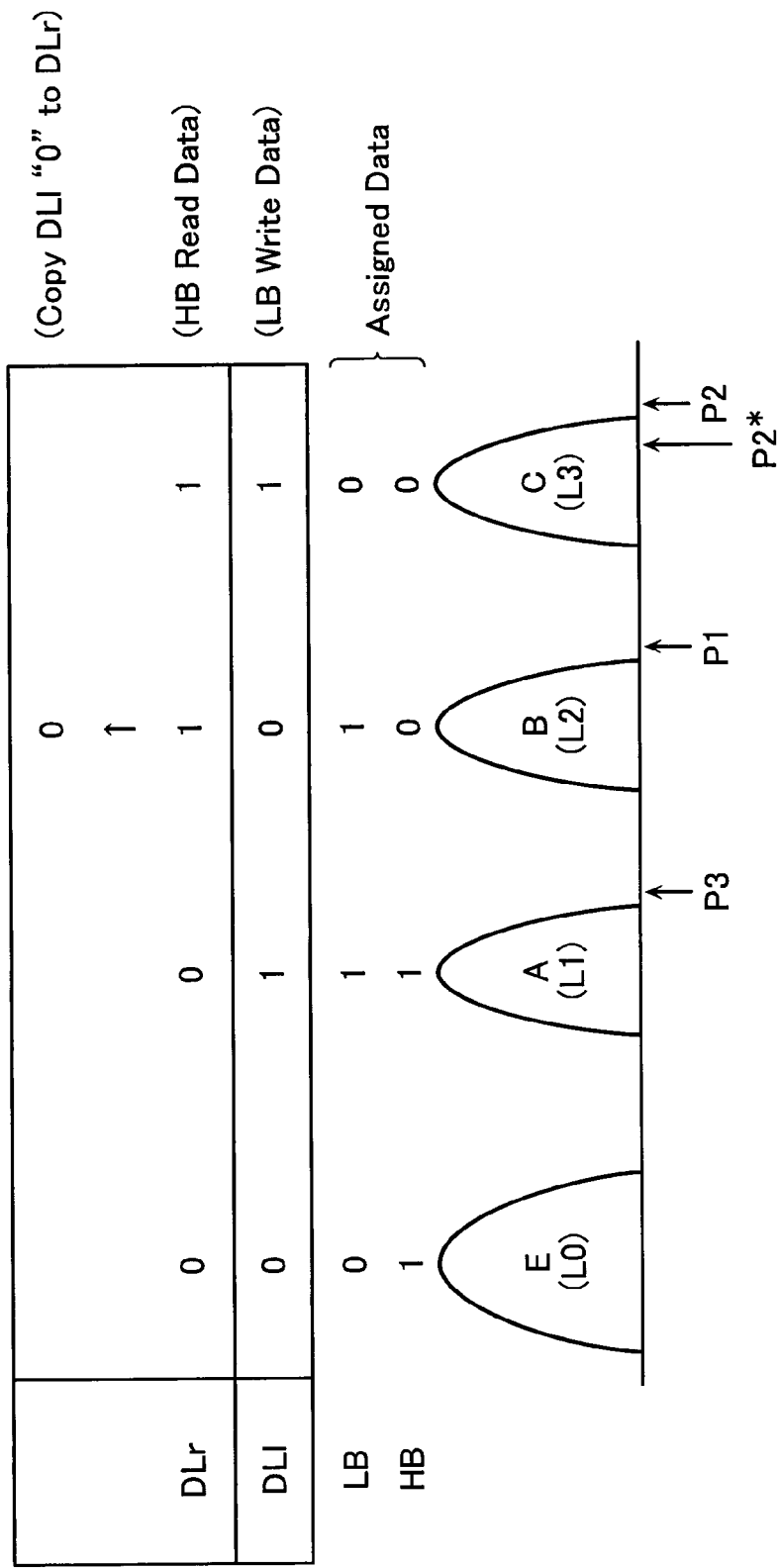
FIG. 41 shows data states of data latches DL1 and DLr when LB data write is performed by C-QPW.

FIGS. 40 and 41 show data states of data latches DL1 and DLr in case of A-QPW and C-QPW, respectively. In data latches DL1, LB data are inverted in part and loaded as similar to the normal LB data write.

In case of A-QPW, as shown in FIG. 40, HB data read out the cell array is stored in data latch DLr as it is, to which "0" data in data latch DL1 is over-written. As a result, in data latches DLr, only data corresponding to data level A, which is subjected to A-QPW, becomes "1".

In the sequence of writing data level A, verify voltage P3*(slightly lower than P3) is used until the data level becomes near the target value; and verify-write is performed hereinafter with the verify voltage P3 together with bit line voltage control for making the write speed reduced.

Next, LB data write with A-QPW and C-QPW will be explained in detail. In the following explanation, there is explained such a case that write data are held in data latches DL1, and cells on the bit line BL side are written.

(LB Data Write Based on A-QPW)

Figure 42:
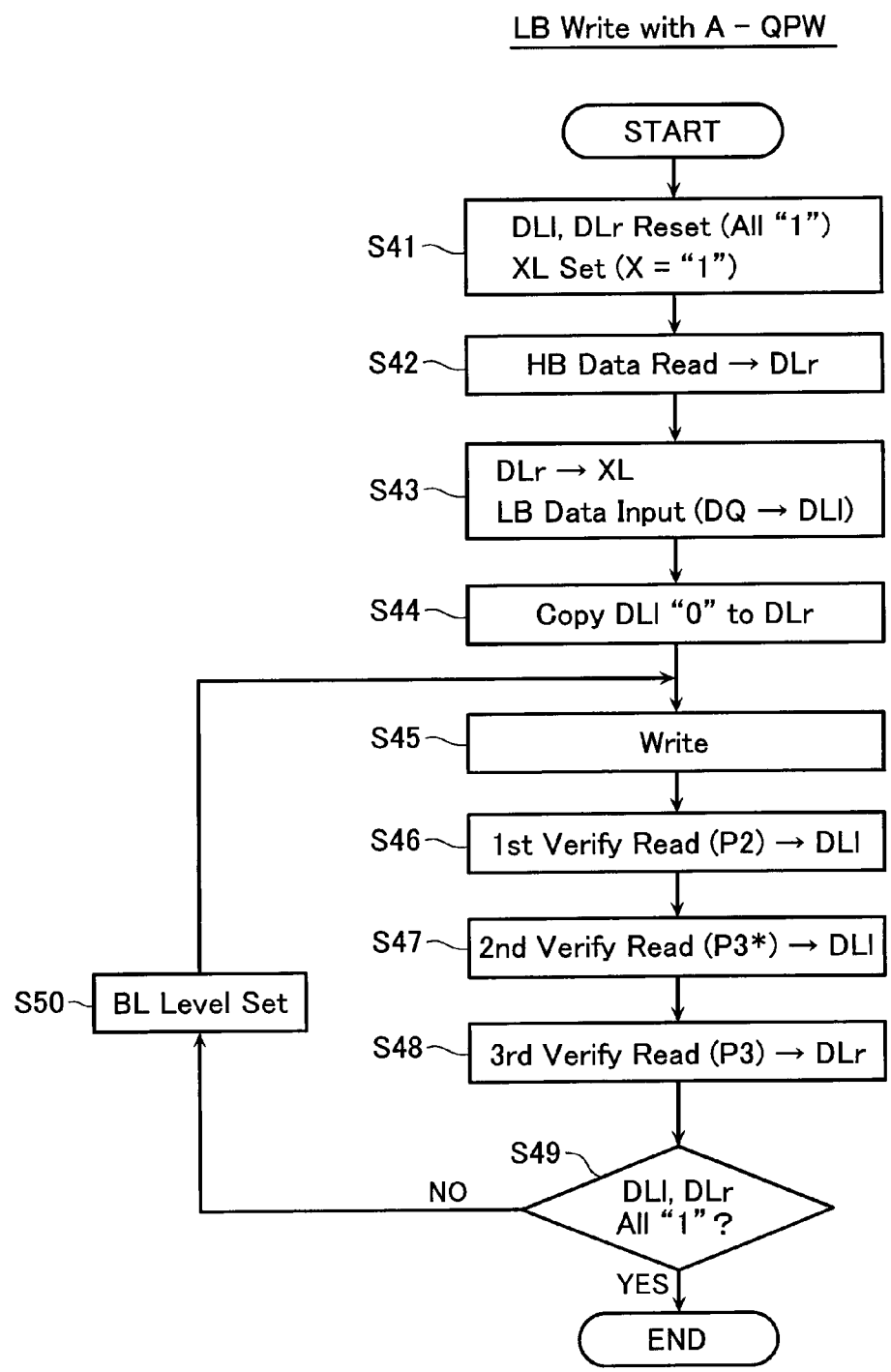
FIG. 42 shows an LB data write sequence with A-QPW.

FIG. 42 shows an LB data write sequence based on A-QPW.

In preparation for write, data latches DL1 and DLr are reset to be an all "1" state; and data latch XL is set at X="1" (step S41). X="1" designates such a condition that connections of OUT-/B and /OUT-B are selected during sensed data transferring.

Then, write destination HB data are read out the cell array to be stored in data latches DLr on the bit line /BL side (step S42). HB data in the sense amplifier sensed by selecting a bit line is inverted and stored in a corresponding data latch DLr with signal CKr. This operation will be repeated by sequentially selecting bit lines, HB data of the entire selected bit lines are stored in data latches DLr.

Next, HB data in data latch DLr is transferred to data latch XL, and under the control of this data, LB write data is transferred to and loaded in data latch DL1 (step S43).

Similar to the normal LB data write, LB data transferred from data line DQ is inverted in accordance with HB data. As a result, the data state of data latch DL1 shown in FIG. 40 is obtained. So far, the sequence is the same as the normal LB write described above.

Then, to store discrimination data in data latches DLr for discriminating cells of data level A, i.e., QPW target cells, "0" data in data latches DL1 are copy-written (over-written) in data latches DLr (step S44). As shown in FIG. 40, in data latches DLr, data corresponding to level E is "0"; and "1" data is set for a cell, in which data level A is to be written.

This copy operation is performed via relaying node B and data latch XL. Explaining in detail, data latch XL is set at X="1"; and node B is set at "1" with pulse BRSr applied under the condition of RWr="1". Following it, data in data latch DL1 is transferred to node B with CKl="1", and then transferred to node XL with pulse RH.

Pulses BRSl and BRSr being simultaneously applied with RWl="1", node B is discharged and /B becomes "1" in case of X="1"; and node /B is discharged to be "0" in case of X="0". As a result, data in data latch DL1 is transferred to node /B. Opening data latch DLr with clock CKr="1", only "0" data at node /B may be over-written to data latch DLr.

The above-described over-write operation will be repeated for all data latches DL1 and DLr. Note here that since this over-write is not related to write operation of the cell array, it may be performed in practice in parallel with the cell array write step S45.

Based on data in data latches DL1, collective write is performed (step S45). Following it first verify-read operations with verify voltage P2 are sequentially performed for verifying the data level C for the respective bit lines, and the verify results are subjected to feedback to data latches DL1 (step S46).

Next, with respect to data level A, second verify-read operations with verify voltage P3* that is lower than P3 are sequentially performed for the respective bit lines, and the verify results are subjected to feedback to data latches DL1 (step S47).

Following it, with respect to data level A, third verify-read operations with verify voltage P3 are sequentially performed for the respective bit lines, and the verify results are subjected to feedback to data latches DLr (step S48). In case the threshold has reached the target data level A, the corresponding data latch DLr is rewritten to "0" from "1".

If write has been completed, both data latches DL1 and DLr become an all "0" state. Under this condition, write completion is judged (step S49). If write is incomplete, bit line voltage control is performed (step S50), and write is performed again.

At the bit line voltage control step S50, the bit line voltage is controlled as follows: bit lines corresponding to cells with a suitable "0" written and "1" write cells are set at Vdd; cells written into a level defined by the verify voltage P3*, which is lower than the desirable level, are set at a medium voltage Vdd* set between Vss and Vdd hereinafter; other "0" write cells, which have not yet been written into such the level, are set at Vdd as similar to the normal case.

By use of this bit lien voltage control, the write condition of cells shifted to level A at a high rate may be relaxed. In addition, in this verify procedure, "1" is initially stored in data latch DLr only for a cell required to be based on QPW, and after detecting write completion such that it has reached level A, data in data latch DLr is rewritten to "0". That is, data in data latches DL1 and DLr are sequentially rewritten in accordance with verify result.

Next, the verify-read and bit line voltage control will be explained in detail below.

Verify-read step S46 is a normal one for level C. Data latch XL is set at /X="1", and the output connection of the sense amplifier, which has sensed a cell current, is controlled as follows: OUT-B; and /OUT-/B.

Figure 44:
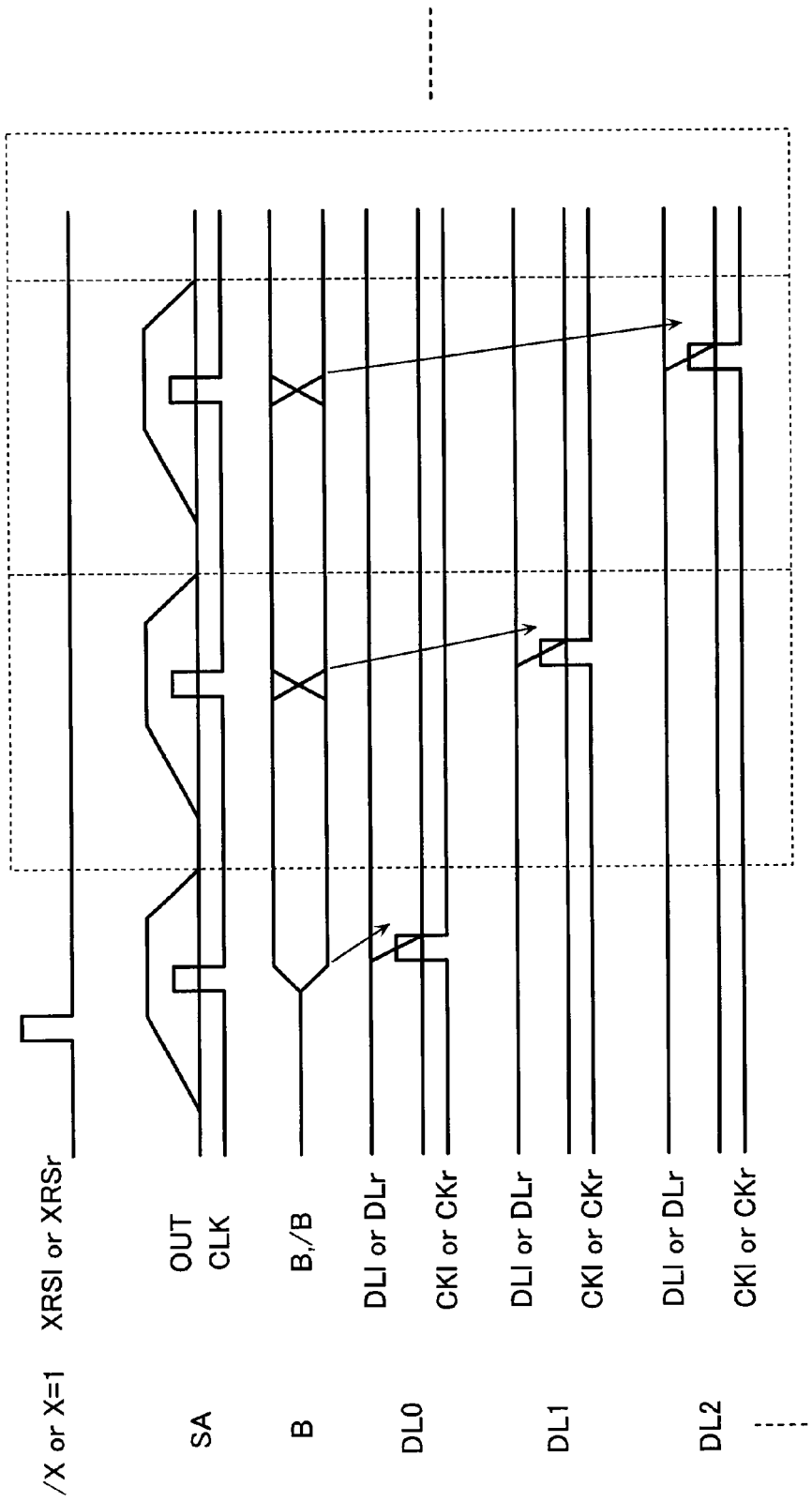
FIG. 44 shows operation waveforms at the first and third verify-read steps of the LB data write sequence with A-QPW.

After transferring the sense result to node B, /B, data latch DL1 is rewritten to "0" for a cell, level C write of which is completed. A cell with a level lower than level C is sensed as data "1", and node B becomes "1", so that data latch DL1 is not rewritten. As shown in FIG. 44, this procedure will be performed for all data latches DL1 by sequentially exchanging the bit lines.

At the verify-read step S47 with verify voltage P3*, verify result is also subjected to feed back to data latch DL1. At this time, level distribution higher than level A is detected as "0". Therefore, if leaving it as it is, data of data latch DL1 will be destroyed. Therefore, a write-insufficient one in cells to be written into level A is distinguished from others with "1" in data latch DLr.

Figure 45:
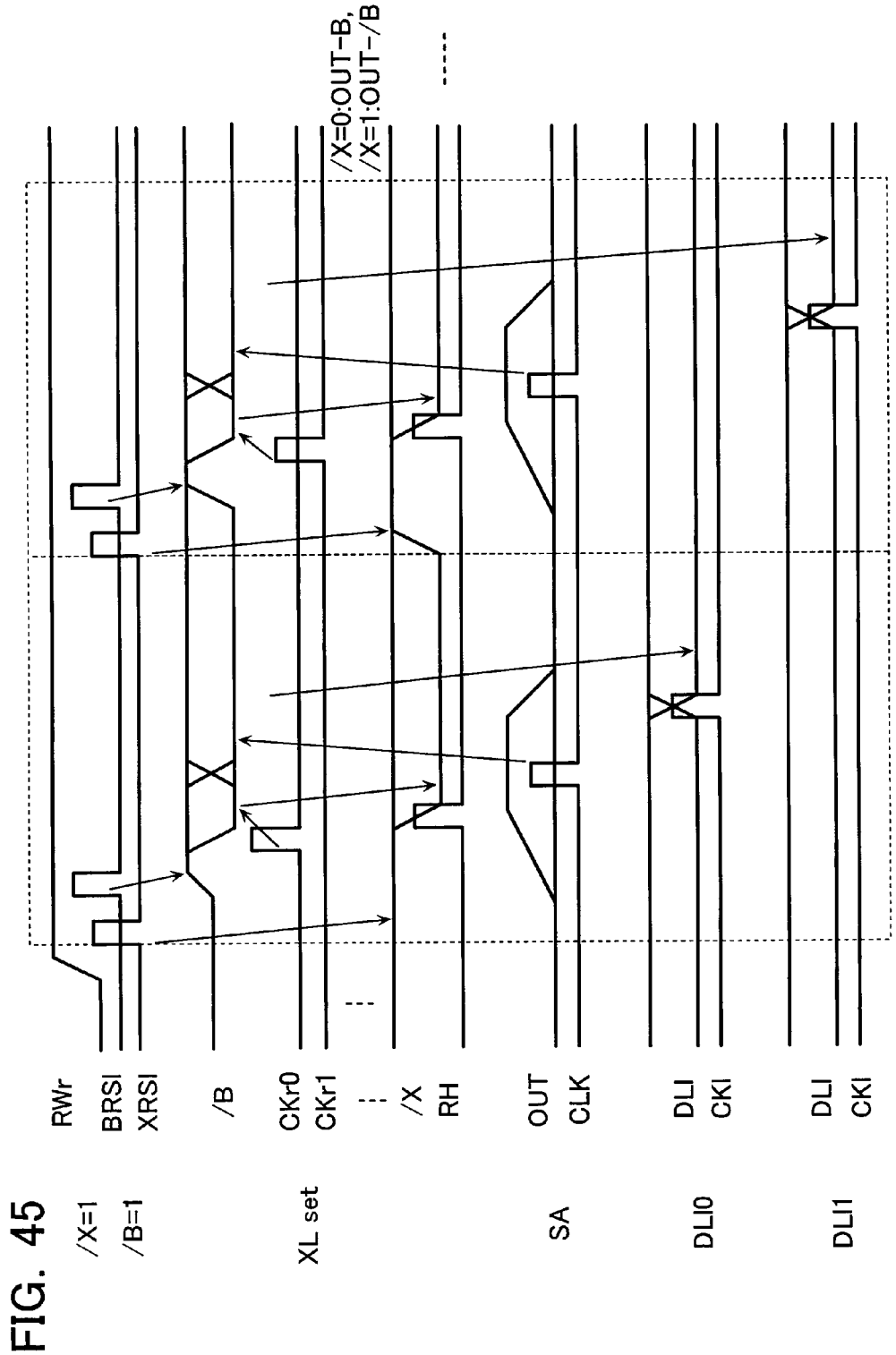
FIG. 45 shows operation waveforms at the second verify-read step under the control of data latch DLr.

For this purpose, data in data latch DLr is transferred to data latch XL via node /B. Explaining in detail, as shown in FIG. 45, /X being set at "1", and RWr being set at "1", node B is discharged with BRSl="1", so that node /B is set at "1". Then, data in data latch DLr is transferred to node /B with clock CKr="1".

Following it, apply pulse RH, and load the data stored in data latch to node /X. The sensed data is transferred to node B as it is in case data latch DLr is "1" while it is inverted to be transferred in case data latch DLr is "0". Therefore, only in a case where data latch DLr is "1", data in data latch DL1 is changed from "1" to "0" with CKl="1".

In case data latch DLr is "0", the sensed result is "0" for a cell between level B and C, and node B becomes "1" while the sensed result is "1" for a cell with level E, and node B becomes "0", i.e., "0" data state of data latch DL1 is kept as it is on the assumption that it is a write-completed cell. This procedure is repeated for all data latches DL1.

At the verify-read step S48 with verify voltage P3, read result is subjected to feedback to data latch DL1. At this time, as shown in FIG. 44, data latch XL is set at X="1", so that the sense amplifier output is inverted to be transferred to node B, /B. Applying CKr="1", with respect to a cell, in which level A has been completely written, data latch DLr is rewritten from "1" to "0" because sensed data thereof is "0", and /B="0".

With respect to a cell corresponding a write level higher than level A, sense amplifier output is "0", and /B="0". However, since the original data held in data latch DLr is "0", data latch DLr will not be rewritten. With respect to level E write cell, sensed data is "1". However, data latch DLr is not rewritten due to the asymmetric property of the data latch. This procedure is repeated for all data latch DLr.

If all data latches DLr and DL1 become "0" when the whole verify-read operations described above have been completed, all cells, in which levels A and C are to be written, have been write-verified, so that the write sequence ends. Write completion for all target cells will be judged with write completion judgment circuit 25 in such a way as to set signals "sell" and "selr" to be "1" simultaneously, and detect that signal line PROK is not discharged.

If write completion has not been judged, the following procedure, i.e., bit line voltage control setting procedure is performed. The bit line voltage setting procedure will be explained in detail with reference to data state transition diagrams shown in FIGS. 43A to 43H.

FIG. 43A shows a data state (A) of data latches DL1 and DLr at an initial setting time or as the last verify result. "0" in data latch DLr designates level C write; and "1" level A write. In accordance with data in data latch DLr, data latch DL1 stores "0" or "1".

FIG. 43B shows a data state (B) as a verify result where a part of level A write cells with data latch DLr="1" has been write-completed. That is, the following three data states with respect to level A write are shown: a state where verify-read with verify voltage P3 passed (DL1=DLr="0"); a state where verify-read with verify voltage P3* passed while that with verify voltage P3 failed (DL1="0", DLr="1"); and a state where verify-read with verify voltage P3* failed (DL1=DLr="1").

In the data state shown in FIG. 43B, transfer control signal PRG1 is set at a suitable value for transfer-controlling from data latch DL1 to bit line BL, so that bit line BL is charged up to the medium value Vdd* between Vdd and Vss. This results in the state shown in FIG. 43C. That is, all bit lines corresponding to DL1="0" becomes Vdd*; and the remaining Vss.

In case DL1 is "1" or DLr is "1", "0" write is continued on the condition that bit line BL is set at Vss (normal "0" write) or Vdd* (weak "0" write). It is required of other bit lines BL to be restored to Vdd from Vdd*.

For this purpose, an OR logic operation between data latches DL1 and DLr is performed by use of data latch XL. According to the result, such operations are performed that bit lines are sequentially charged up to Vdd when both data latches DL1 and DLr are "0". At this time, QPW-use bit line charging circuit 28t is used.

Firstly, to transfer data in data latch DL1 to data latch XL via node B, data latch XL is reset at X="1", and pulse BRSr is applied with RWr="1". As a result, node /B is discharged, thereby resulting in node B="1".

Opening data latch DL1 with CK="1" to transfer data thereof to node B; setting the data of data latch DL1 at node X with RH pulse; and applying BRSl pulse with RWl="1" for preparing data transfer of data latch DLr, node B is discharged and node /B is set at "1" in case of X="1" while node /B is set at "1" in case of X="0" because it has already been set at "1".

Next, open data latch DLr with CKr="1" to transfer data thereof to node /B, thereby setting B="1" in case of DLr="0". To over-write this state at node B to node /X of data latch XL, pulse RHRr is applied. As a result, only when B="0", node /X is discharged. That is, in case of DL1="1", node /X is originally set at "0"; and in case of DLr="1", /X becomes "0" because of B="0". Based on either one of these cases, node X is set at "1".

To set a level of node B by use of the state of data latch XL, apply pulse to BRSl and BRSr simultaneously with RWr="1". As a result, node /B is discharged, and node B becomes "1" in case of X="1"; and node B is discharged to be set at "0" in case of X="0".

Then, with respect to bit line charging circuit 28t on the bit line BL side, set /QWl=Vss. Only when B="0", bit line BL is coupled to Vdd and charged-up. That is, in case both data latches DL1 and DLr are "0", bit line BL is restored to Vdd from Vdd*.

FIG. 43D shows such a state where bit line BL is charged-up to Vdd from Vdd* as a result of OR logic operation described above when both data latches DL1 and DLr are "0". FIG. 43F shows another case where bit line BL is charged-up similarly under the same condition at another timing.

FIG. 43E shows a state where bit line BL is kept at Vss in case data latches DL1 and DLr are set at "1" and "0", respectively (level C write). FIG. 43H shows a state where bit line BL is also kept at Vss in case data latches DL1 and DLr are set at "1" and "1", respectively (level A write).

FIG. 43G shows a state where bit line BL is kept at Vdd* in case data latches DL1 and DLr are set at "0" and "1", respectively, and level A write has reached near level A, but it is insufficient.

Figure 46:
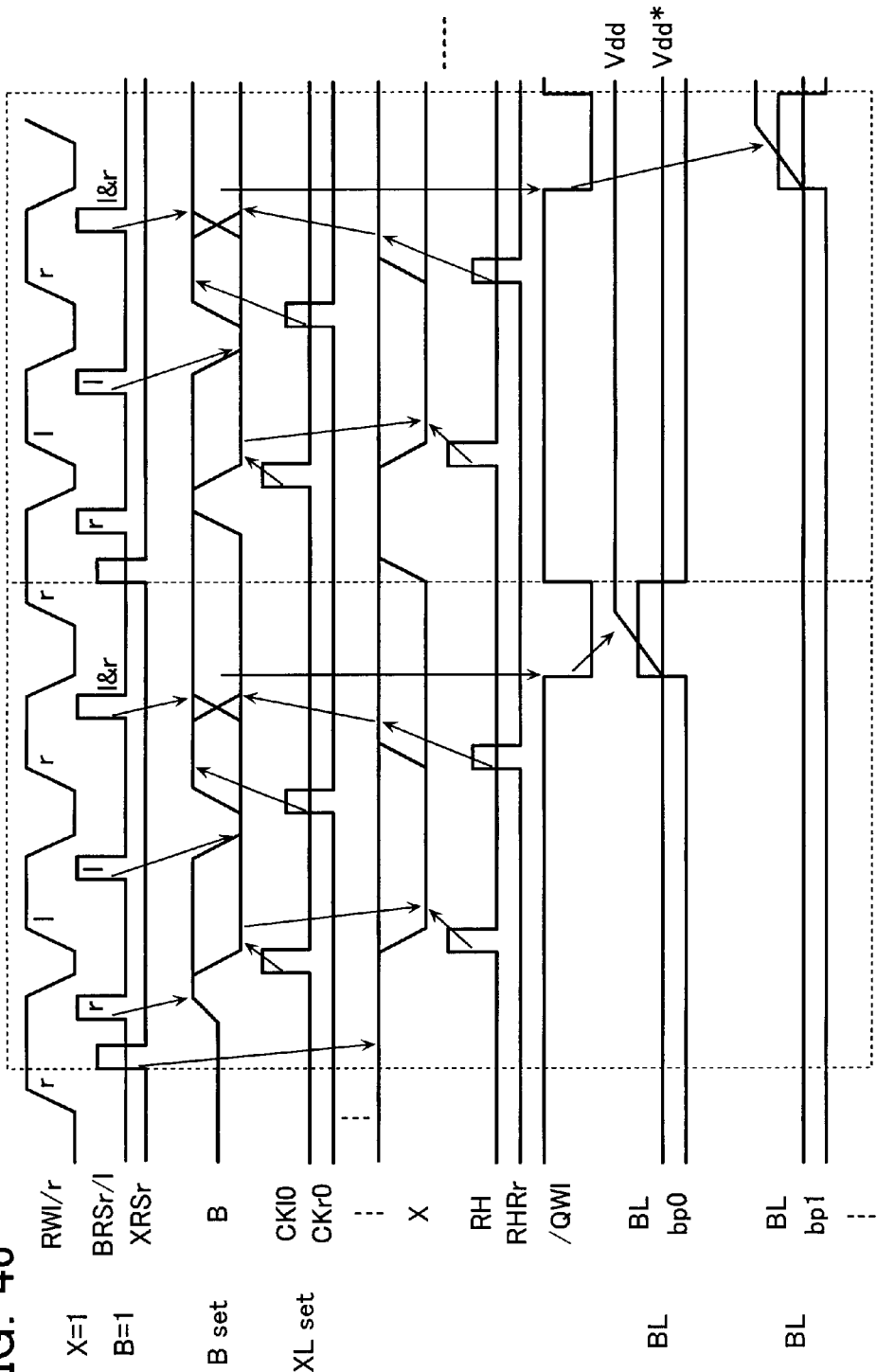
FIG. 46 shows operation waveforms of selectively Vdd charging bit lines BL set at Vdd*.

As described above, only a bit line(s) corresponding to a cell(s) near level A is set at Vdd*; and others at Vss or Vdd. By use of this bit line voltage control, it becomes possible to select a suitable write condition in accordance with write data and the threshold level shift situation. That is, with respect to a cell near the target threshold voltage, the write condition will be relaxed hereinafter FIG. 46 shows operation waveforms in which some bit lines are charged-up to Vdd in bit lines set at Vdd* except those near level A. Supposing that there are eight bit line pairs sharing a data latch XL, OR logic operation will be repeated eight cycles. As a result, it becomes possible to voltage-control all bit lines in accordance with data in data latches DL1 and DLr.

(LB Data Write with C-QPW)

Figure 47:
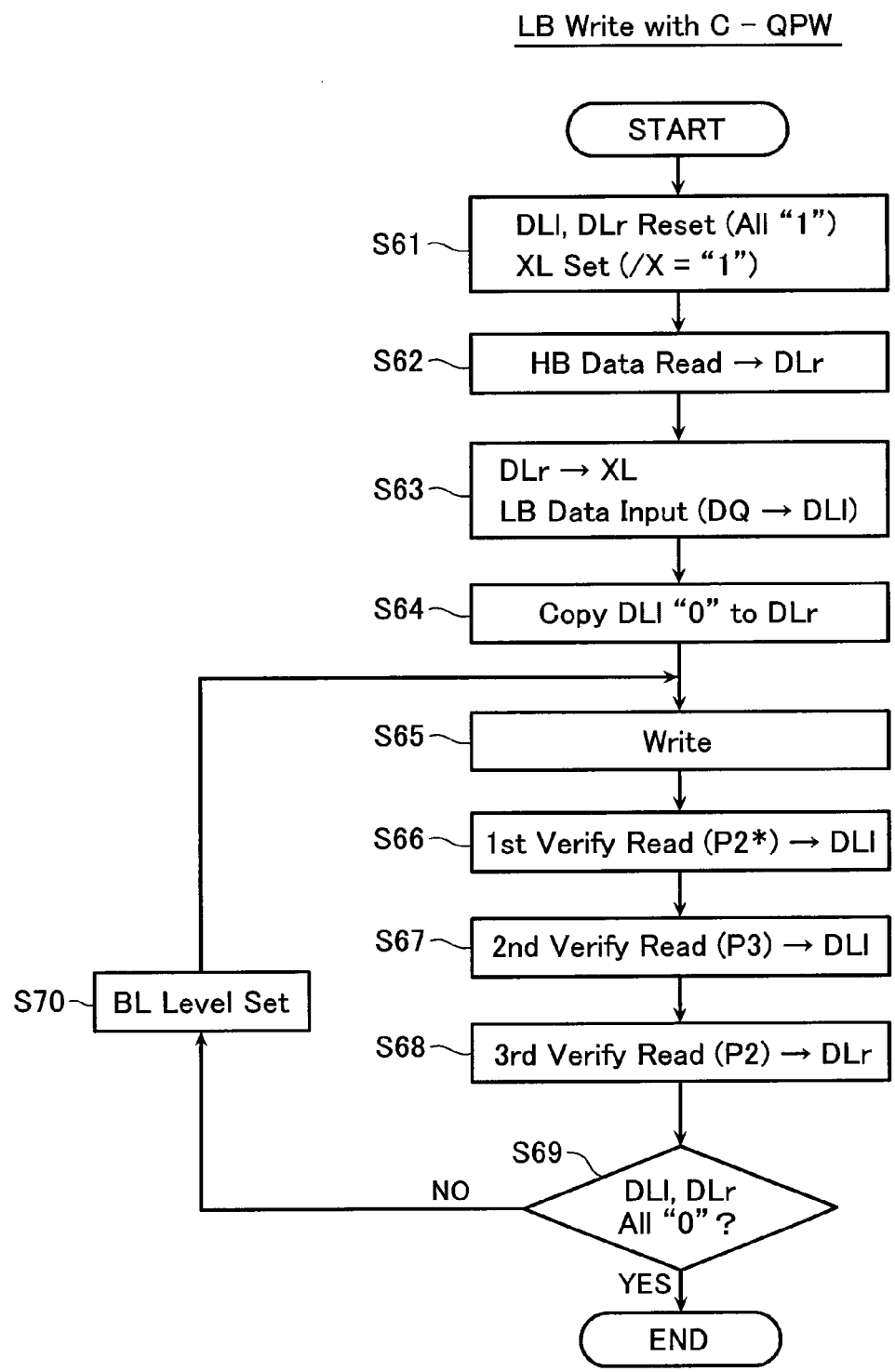
FIG. 47 shows an LB data write sequence with C-QPW.

FIG. 47 shows an LB write sequence with C-QPW with reference to that shown in FIG. 41. In preparation for writing, data latches DL1 and DLr are set in an all "1" state (step S61).

In the C-QPW mode, HB data is inverted and set in data latch DLr on the bit line /BL side; and write data is loaded in data latch DL1 on the bit line BL side. Therefore, By contrast to the A-QPW case, data latch XL is set at /X="1" (step S61).

HB data are read out cells on the bit line BL side and inverted to be stored in data latches DLr on the bit line /BL side. Explaining in detail, the connection situation between sense amplifier outputs and relaying nodes is set as: OUT-B; and /OUT-/B. After sensing write destination HB data, if data at node /B is decided, data state thereof will be transferred to data latch DLr with CKr="1". This procedure is repeated for all data latches DLr.

Next, data in data latches DLr are sequentially transferred to data latch XL, and under the control of these data, LB data are transferred to data latches DLl (step S63).

Explaining in detail, to transfer data in data latch DLr to data latch XL via node /B, set data latch XL at /X="1", and discharge node B with BRSl pulse in the state of RWl="1", thereby setting node /B at "1". Then, open data latch DLr with CKr="1", and transfer data thereof to node /B, further transfer it to node /X with RH pulse. As a result, data in data latch DLr is inverted and set in data latch XL (i.e., HB data is set in data latch XL as it is).

To load LB write data from data line DQ to data latches DLl, the connection between data line DQ and node B or /B selected by the data state of data latch XL. That is, apply simultaneously pulses to BRSl and BRSr with RWr="1". If /X="1", node B is discharged, and node /B becomes "1", whereby DQ is coupled to /B while if /X="0", node /B is discharged, and node B becomes "1", whereby DQ is coupled to B.

By use of this connection, when transferring "0" at DQ to node B or /B, and opening data latch DLl with CKl="1", inverted LB data is loaded in data latch DLl in case HB data is "1" while LB data is loaded in data latch DLl as write data in case HB data is "0".

This procedure is repeated for all data latched DLl. As a result, as shown in FIG. 41, HB data and LB data are loaded in data latches DLr and DLl, respectively.

After loading data in data latches, such a copy-write is performed that only "0" data in data latches DLl are over-written in data latches DLr (step S64). Since this copy-write operation is the same as in the A-QPW mode, the detailed explanation will be omitted. As a result, as shown in FIG. 41, data latch DLl becomes "1" only for a cell to be written into level C in the QPW mode.

Figure 48:
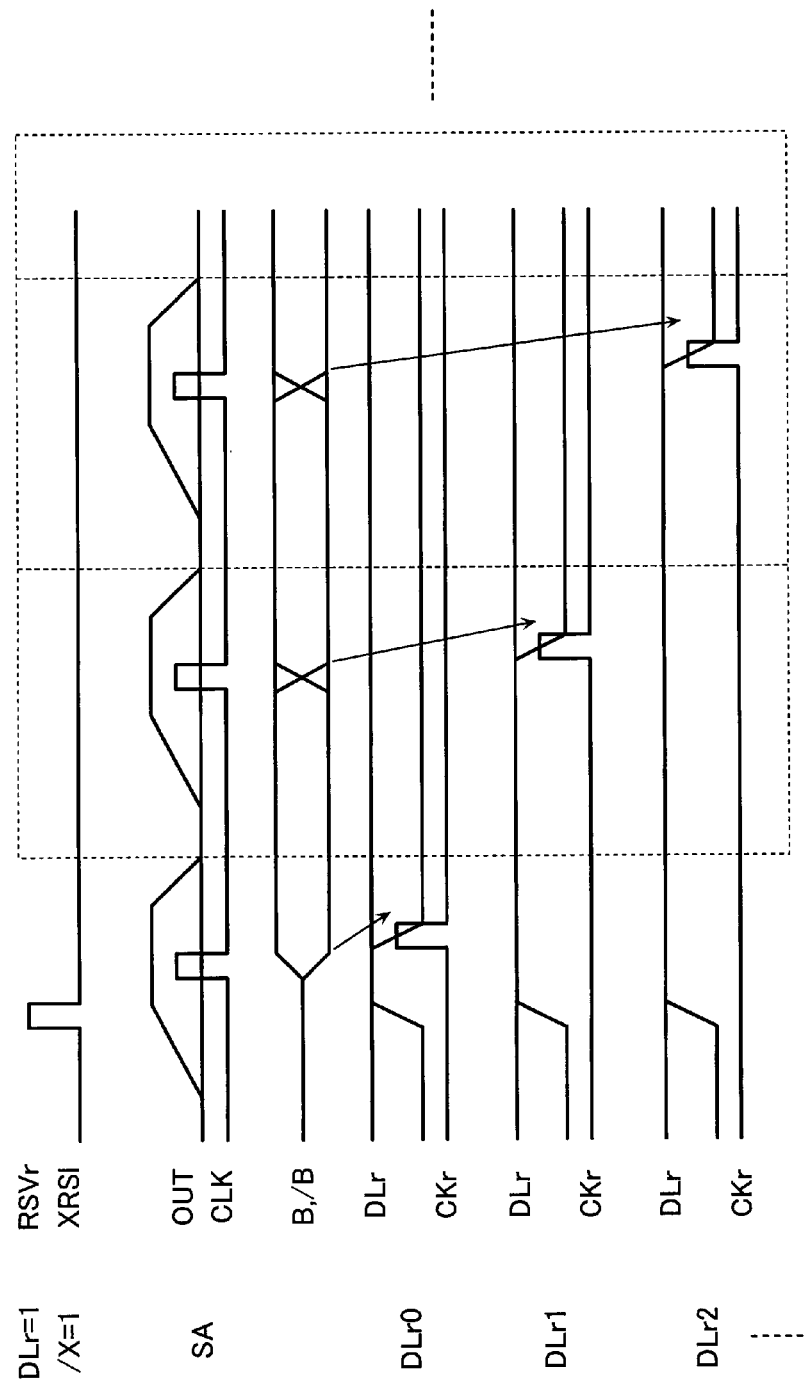
FIG. 48 shows operation waveforms of HB data reading to data latch DLr for C-QPW.
Figure 49:
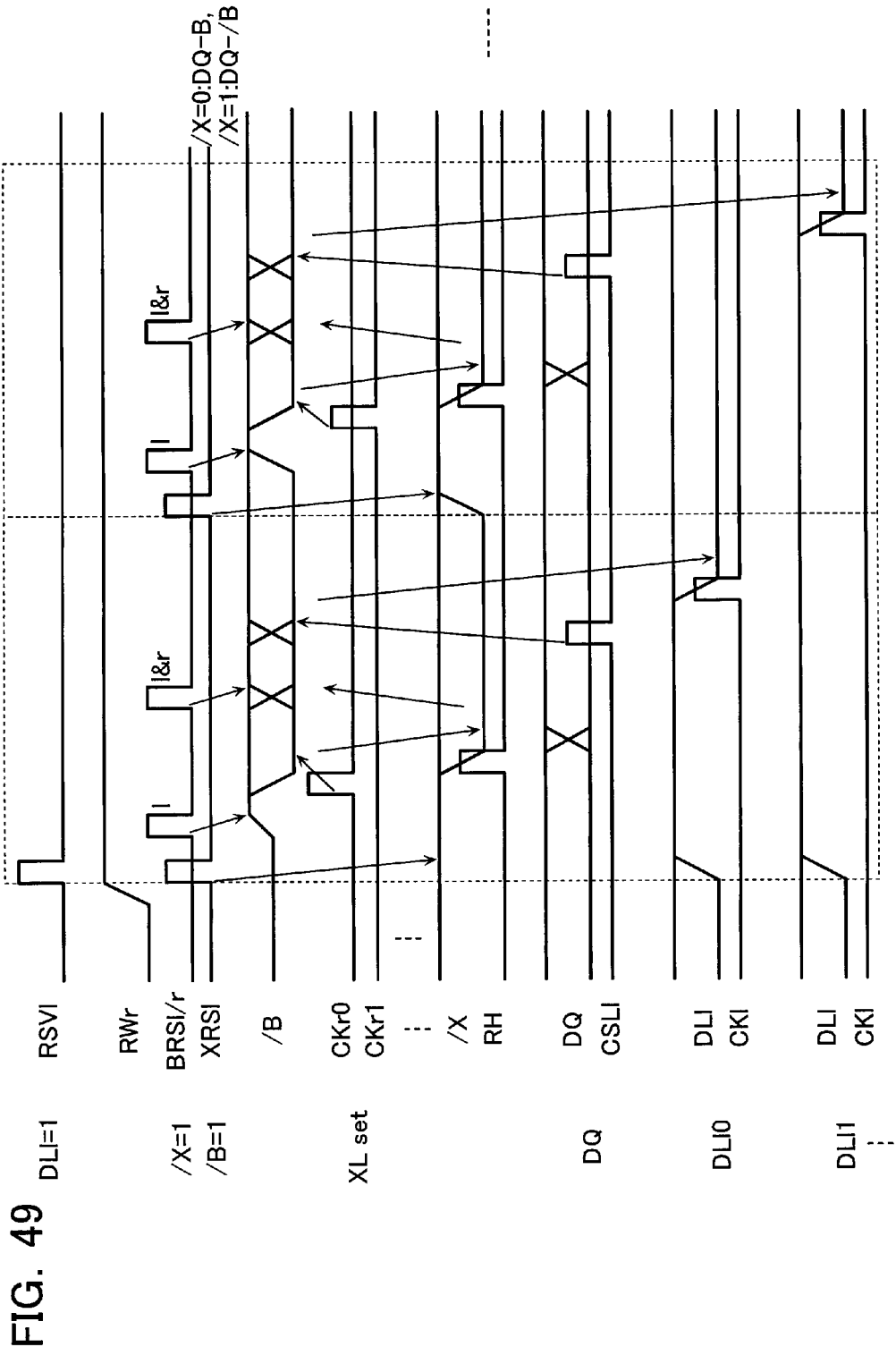
FIG. 49 shows operation waveforms of LB data transferring to data latch DLr under the control of HB data.
Figure 50:
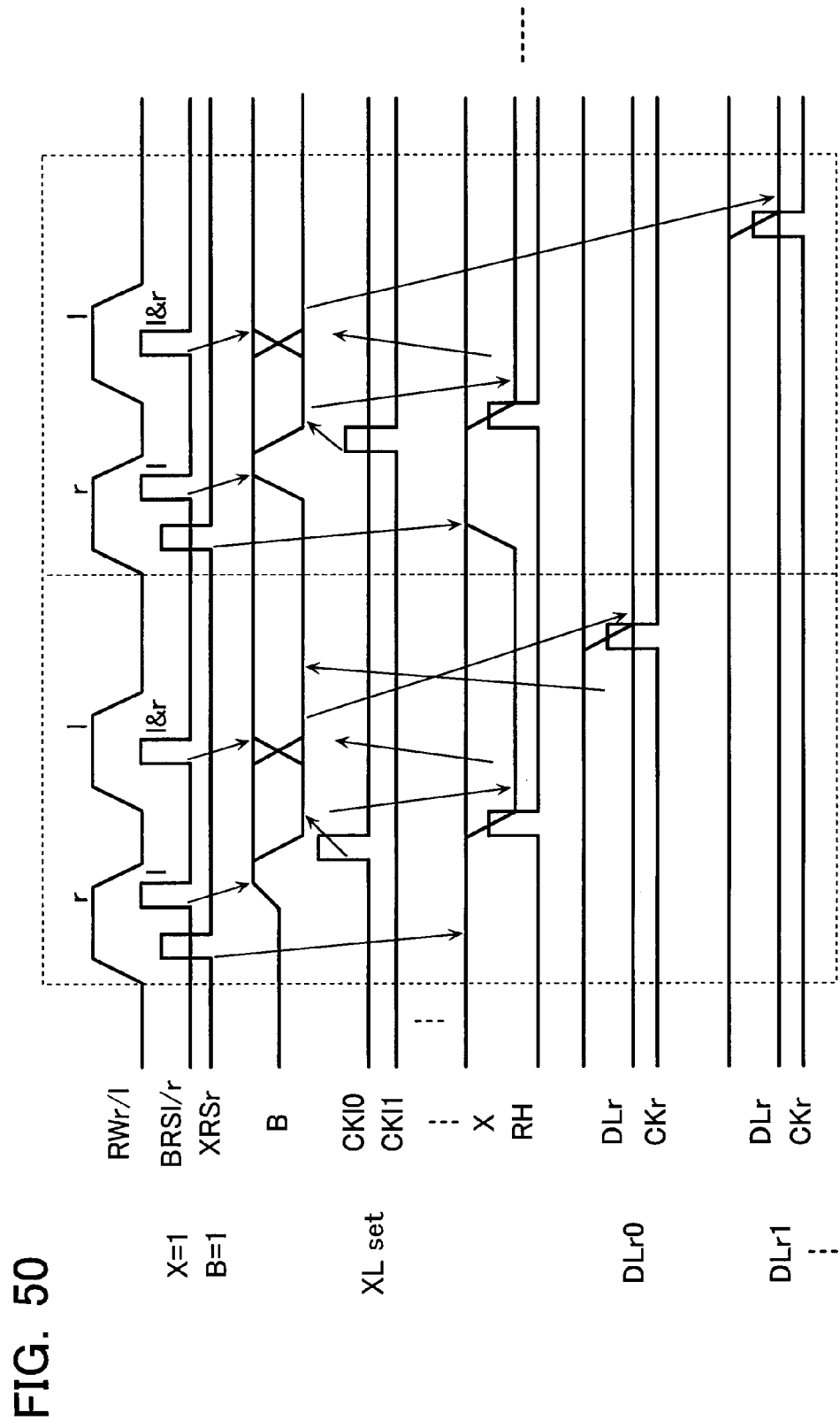
FIG. 50 shows operation waveforms of over-writing "0" data of data latch DL1 to data latch DLr.

The procedures described above and operation waveforms thereof are shown in FIGS. 48 to 50.

FIG. 48 shows such operation waveforms that data latch DLl is reset at "1"; connection states OUT-B and /OUT-/B are selected with /X="1"; and HB data are sequentially loaded in data latches DLr.

FIG. 49 shows such operation waveforms that after resetting data latches DLl at "1", write data on data line DQ are sequentially loaded in data latches DLl under the transfer-control of data latch XL, in which data in data latches DLr are sequentially set.

FIG. 50 shows such waveforms that data in data latches DLl are sequentially copy-written into data latches DLr under the transfer-control of data latch XL, whereby only "0" data are over-written.

Following data loading in data latches DLl and DLr described above, data write with data in data latches DLl is performed (step S65). That is, based on write data in data latches DLl, all bit lines are set at Vss ("0" write) or Vdd ("1" write), thereby controlling each NAND cell channel potential in accordance with write data; and a selected word line is applied with write voltage.

After writing, verify-read is performed with three steps as follows. Firstly, as shown in FIG. 41, verify-read is performed with verify voltage P2* that is slightly lower than the target verify voltage P2 for level C, and the verify results are subjected to feedback to data latches DLl (step S66).

Following it, verify-read is performed with verify voltage P3 for verifying level A, and the verify results are subjected to feedback to data latches DLl (step S67). Further, verify-read is performed with verify voltage P2 for verifying level C (step S68). The verify results obtained at this step S68 are subjected to feedback to data latches DLr.

Based on the verify-read results described above, write completion will be judged by detecting whether both data latches DLl and DLr have been set in an all "1" state or not (step S69). If write is incomplete, necessary bit line control is performed (step S70), and then write is repeated again.

Next, each verify-read step and the successive bit line control will be explained in detail.

First, verify-read at step S66 distinguishes a cell(s), which got near to data level C early, from others. That is, data latch XL is set at /X="1", thereby making the sense amplifier output transferred as it is to nodes B, /B. After transferring the sensed result with verify voltage P2* to nodes B, /B, the transferred data is written into data latch DLl with CKl="1".

With respect to a cell, in which level C has been written, data latch DLl is rewritten to "0". With respect to another cell, data of which is lower than level C, "1" data is sensed, and node B is set at "1", so that data latch DLl will not be rewritten.

Figure 52:
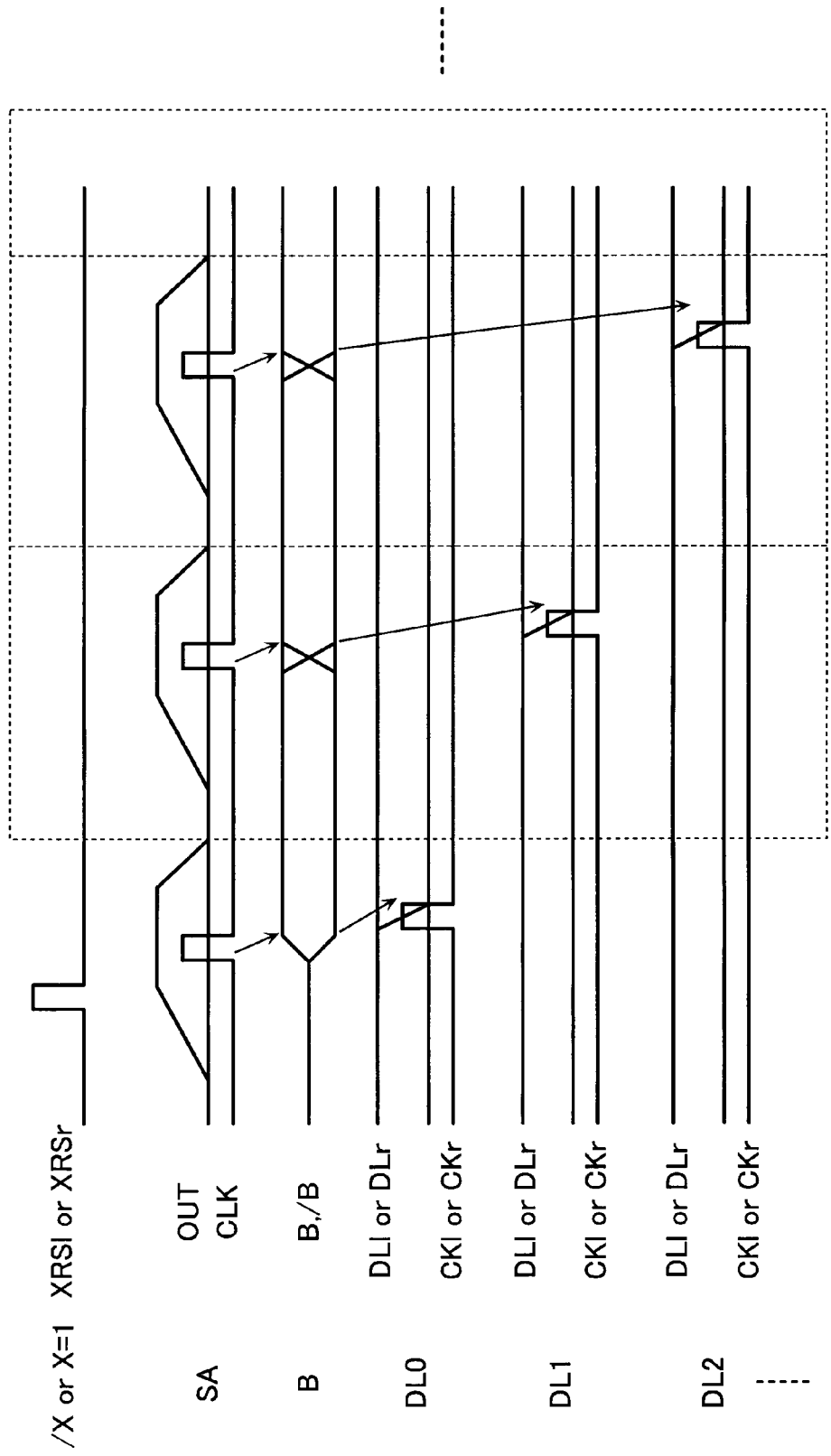
FIG. 52 shows operation waveforms of verify-read data transferring to data latch DL1 or DLr.

The above-described procedure is repeated for all data latches DLl. FIG. 52 shows operation waveforms of the verify-read with verify voltage P2* and feedback thereof to data latch DLl.

Next, at verify-read step S67 with verify voltage P3 for verifying level A write, sensed result is restored to data latch DLl. At this time, a data level higher than level A is sensed as "0", and if it is transferred to data latch DLl as it is, data therein will be destroyed. Therefore, based on data latch DLr, a write-insufficient cell, in which level A is to be written, and another cell, which is to keep data "1" in data latch DLl as it is, will be distinguished from each other.

For this purpose, to transfer data in data latch DLr to data latch XL via node /B, node /X is reset at "1", and BRSl pulse is applied with RWr="1". As a result, node B is discharged, and node /B is set at "1". Opening data latch DLr with CKr="1", data therein is transferred to node /B.

Then, applying RH pulse, data in data latch DLr is written at node /X. If data latch DLr is "1", /X is set at "1". Therefore, sensed result is transferred to node B. By contrast, if data latch DLr is "0", /X is set at "0", so that sensed result is inverted and transferred to node B.

After sensing data with verify voltage P3, with respect to a cell defined by data "1" in data latch DLr, the sensed data "0" (corresponding to a write-completion cell) is transferred to nodes B, and over-written in data latch DLl with clock CKl="1". Sensed data "0" corresponding to another cell defined by data "0" in data latch DLr does not change the state of data latch DLl because it is inverted and transferred to node B.

Figure 53:
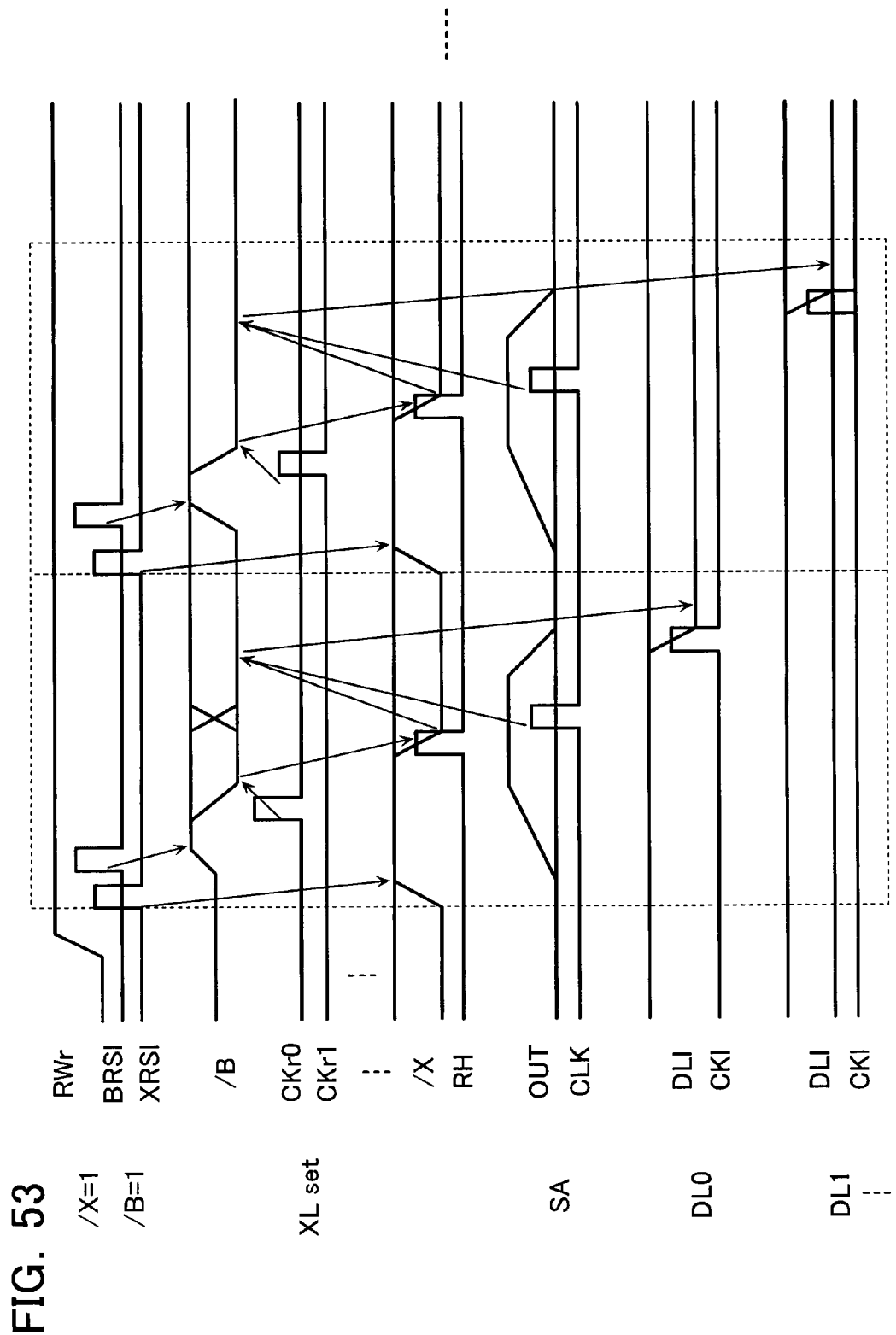
FIG. 53 shows feedback operation waveforms of feedback transferring data to data latch DL1 under the control of data latch DLr at the verify-read step.

This procedure may be repeated for all data latches DLl. FIG. 53 is a diagram for showing the feedback operation waveforms to data latches DLl, which are transfer-controlled by data latches DLr, at the verify-read step with verify voltage P3.

Next, at the verify-read step S68, level C is verified with verify voltage P2. In this case, data latch XL is set at /X="0", and sensed output is inverted and transferred to node B, /B. After transferring the sensed data to node B, /B, with respect to a cell, in which level C has been written, data latch DLr is rewritten to "0" with CKr="1".

Another cell with the threshold voltage being lower than level C is sensed as "1", and node /B becomes "1", resulting in that data latch DLr is not rewritten. This procedure may be repeated for all data latches DLr. Although it is different from the operation with verify voltage P2* described above that feedback destination is data latch DLr, the operation waveforms are shown in FIG. 52.

If all data latches DL1 and DLr are "0" when three verify-read steps end, both levels A and C have been write-completed in its entirety. Write completion for all target cells is judged by applying signals "sell" and "selr" set at "1" simultaneously to write-completion judgment circuit 25, and detecting that signal line PROK is not discharged. If there is at least one "1", the following bit line voltage control is performed.

The bit line voltage setting procedure will be explained in detail with reference to data state transition diagrams shown in FIGS. 51A to 51H.

FIG. 51A shows a data state (A) of data latches DL1 and DLr at an initial setting time or as the last verify result. "1" in data latch DLr designates level C write; and "0" level A write. In accordance with data in data latch DLr, data latch DL1 stores "0" or "1".

FIG. 51B shows a data state (B) as a verify result where a part of level C write cells with data latch DLr="1" has been write-completed. That is, the following three data states with respect to level C write are shown: a state where verify-read with verify voltage P2 passed (DL1=DLr="0"); a state where verify-read with verify voltage P2* passed while that with verify voltage P2 failed (DL1="0", DLr="1"); and a state where verify-read with verify voltage P2* failed (DL1=DLr="1").

In the data state shown in FIG. 51B, transfer control signal PRG1 is set at a suitable value for transfer-controlling from data latch DL1 to bit line BL, so that bit line BL is charged up to the medium value Vdd* between Vdd and Vss. This results in the state (C) shown in FIG. 51C. That is, all bit lines corresponding to DL1="0" becomes Vdd*; and the remaining Vss.

In case DL1 is "1" or DLr is "1", "0" write is continued on the condition that bit line BL is set at Vss (normal "0" write) or Vdd* (weak "0" write). It is required of other bit lines BL to be restored to Vdd from Vdd*.

For this purpose, an OR logic operation between data latches DL1 and DLr is performed by use of data latch XL. According to the result, such operations are performed that bit lines are sequentially charged up to Vdd when both data latches DL1 and DLr are "0". At this time, QPW-use bit line charging circuit 28t is used.

Initially, to transfer data in data latch DL1 to data latch XL via node B, data latch XL is reset at X="1", and pulse BRSr is applied with RWr="1". As a result, node /B is discharged, thereby resulting in node B="1".

Opening data latch DL1 with CK1="1" to transfer data thereof to node B; setting the data of data latch DL1 at node X with RH pulse; and applying BRS1 pulse with RW1="1" for preparing data transfer of data latch DLr, node B is discharged and node /B is set at "1" in case of X="1" while node /B is set at "1" in case of X="0" because it has already been set at "1".

Next, open data latch DLr with CKr="1" to transfer data thereof to node /B, thereby setting B="1" in case of DLr="0". To over-write this state at node B to node /X of data latch XL, pulse RHRr is applied. As a result, only when B="0", node /X is discharged. That is, in case of DL1="1", node /X is originally set at "0"; and in case of DLr="1", /X becomes "0" because of B="0". Based on either one of these cases, node X is set at "1".

To set a level of node B by use of the state of data latch XL, apply pulse to BRS1 and BRSr simultaneously with RWr="1". As a result, node /B is discharged, and node B becomes "1" in case of X="1"; and node B is discharged to be set at "0" in case of X="0".

Then, with respect to bit line charging circuit 28t on the bit line BL side, set /QW1=Vss. Only when B="0", bit line BL is coupled to Vdd and charged-up. That is, in case both data latches DL1 and DLr are "0", bit line BL is restored to Vdd from Vdd*.

FIG. 51D shows such a state where bit line BL is charged-up to Vdd from Vdd* as a result of OR logic operation described above when both data latches DL1 and DLr are "0". FIG. 51G shows another case where bit line BL is charged-up similarly under the same condition at another timing.

FIG. 51E shows that bit line BL is kept at Vdd in such a case where DL1 and DLr are "0" and "1", respectively, and level C write has become near level C, but insufficient.

FIG. 51F shows that bit line BL is kept at Vss in case both data latches DL1 and DLr are "1" (i.e., "1" write). FIG. 51H shows that bit line BL is also kept at Vss in case data latches DL1 and DLr are "1" and "0", respectively (i.e., level A write).

As described above, only a bit line(s) corresponding to a cell(s) near level C is set at Vdd*; and others at Vss or Vdd. By use of this bit line voltage control for all bit lines, it becomes possible to select a suitable write condition in accordance with write data and the threshold level shift situation.

Figure 54:
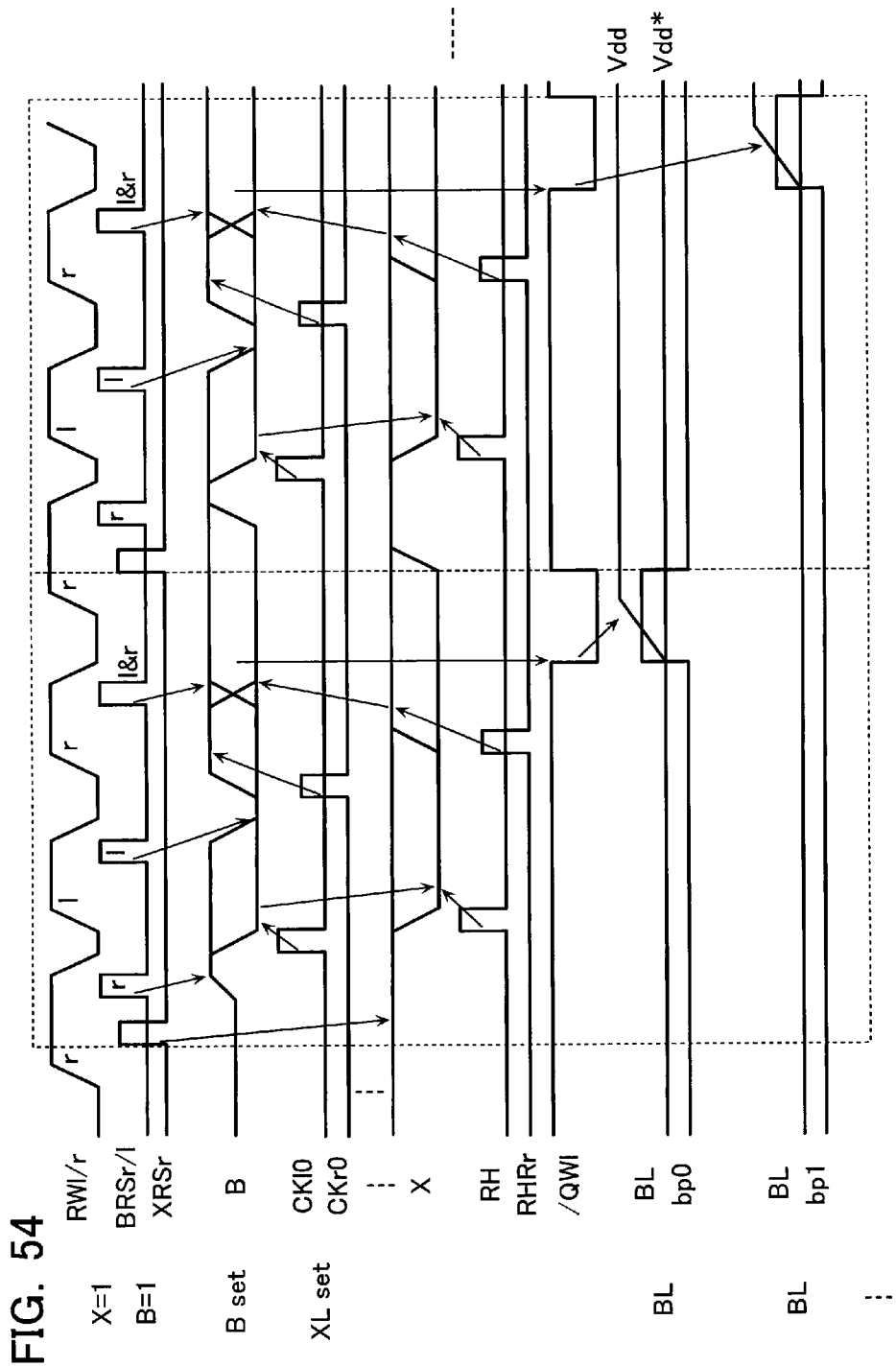
FIG. 54 shows operation waveforms of selectively Vdd charging bit lines BL set at Vdd*.

FIG. 54 shows operation waveforms in which some bit lines are charged-up to Vdd in bit lines set at Vdd* except those near level C. Supposing that there are eight bit line pairs sharing a data latch XL, OR logic operation will be repeated eight cycles. As a result, it becomes possible to voltage-control all bit lines in accordance with data in data latches DL1 and DLr.

(Data Read Procedure)

Next, the data read procedure will be explained in detail together with the operation of sense unit 20. HB data may be read out with one sense cycle. By contrast, LB data may be read out with two cycles by use of data latches DL1 and DLr disposed on the respective sides of bit lines BL and /BL.

Data read explained below is for the information cells disposed on the bit line BL side as well as the data write case described above.

In case of the higher bit (HB) data read, to read cell dada into data latches DL1, all data latches DL are reset at "1", and the sense output connection is selected as follows: OUT-B, /OUT-/B. The selected word line is set at the read voltage R1, and the cell current of the selected information cell is compared with the reference current of the reference cell, thereby sensing data.

The sense amplifier output is transferred to nodes B, /B, and then loaded in data latch DL1 with clock CK1="1". This read procedure will be repeated for all bit lines by switching them to load the respective sensed data in data latches DL1.

Figure 55:
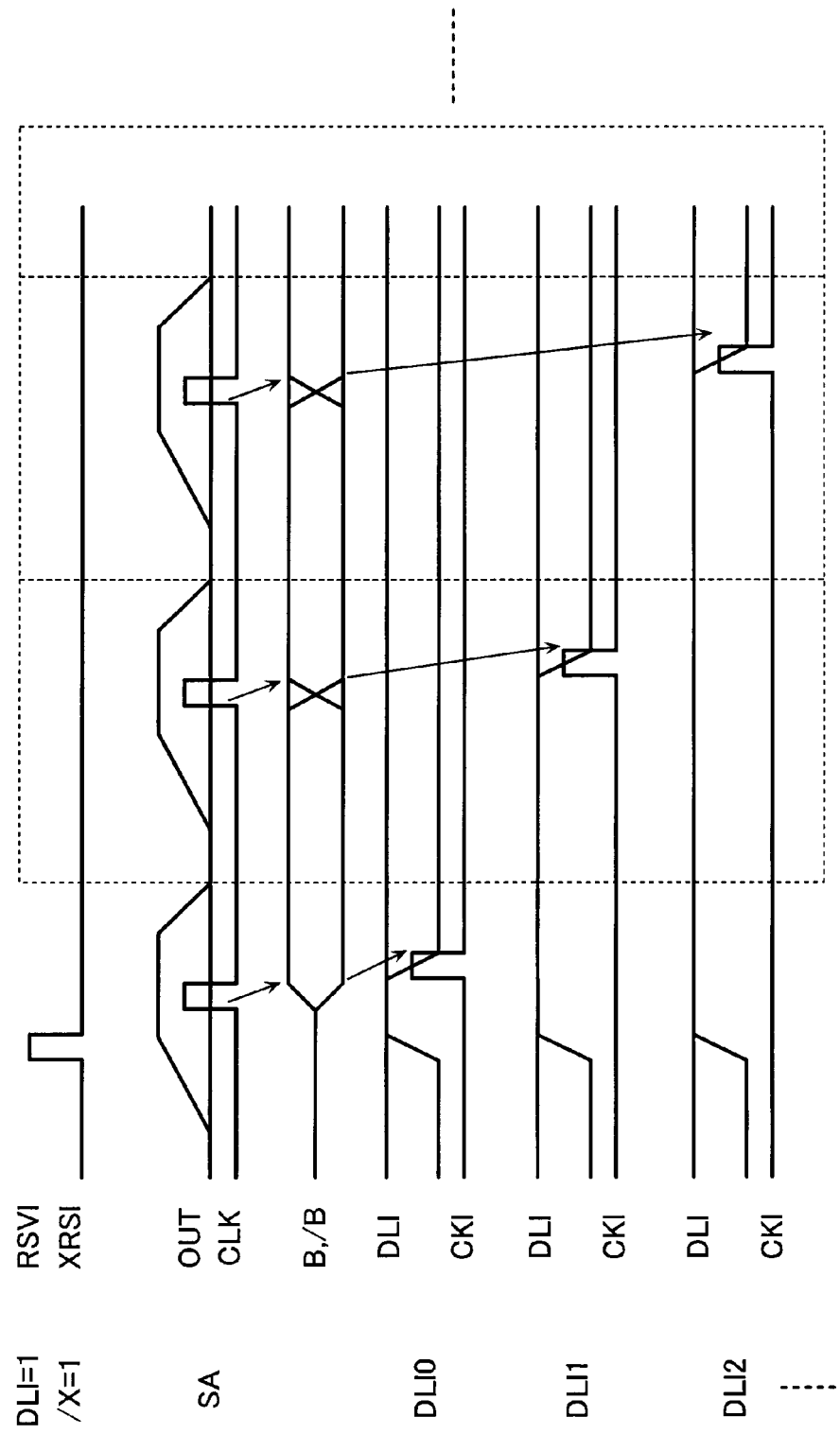
FIG. 55 shows operation waveforms of HB data reading to data latch DL1.

FIG. 55 shows waveforms of the HB data read operation. DL1 are reset at "1", and it is controlled that the sense amplifier output is transferred to nodes B, /B as it is with /X="1". The sensed data on the respective bit lines are sequentially transferred to data latches (DL10, DL11, DL12, . . . ) via node B with clock CLK.

Read data in data latches DL1 are output to the external via the data line DQ. That is, data line DQ is set at "1", and the read data in data latches DL1 are sequentially transferred to data line DQ via node B.

Explaining in detail, RW1 being set at "1", and BRSr pulse being applied in the I/O circuit 24, with /X="1", node /B is discharged while node B becomes "1". Following it, data latch DL1 being opened with CK1="1", data therein is transferred to node B. Since /X="1", and RW1="1", there is formed a data path between node B and data line DQ. Therefore, coupling the data line DQ with CSL, Xi and Xj, the data line DQ is discharged by node B, thereby outputting data to the external. This data transfer will be repeated for all data latches DL1.

Figure 56:
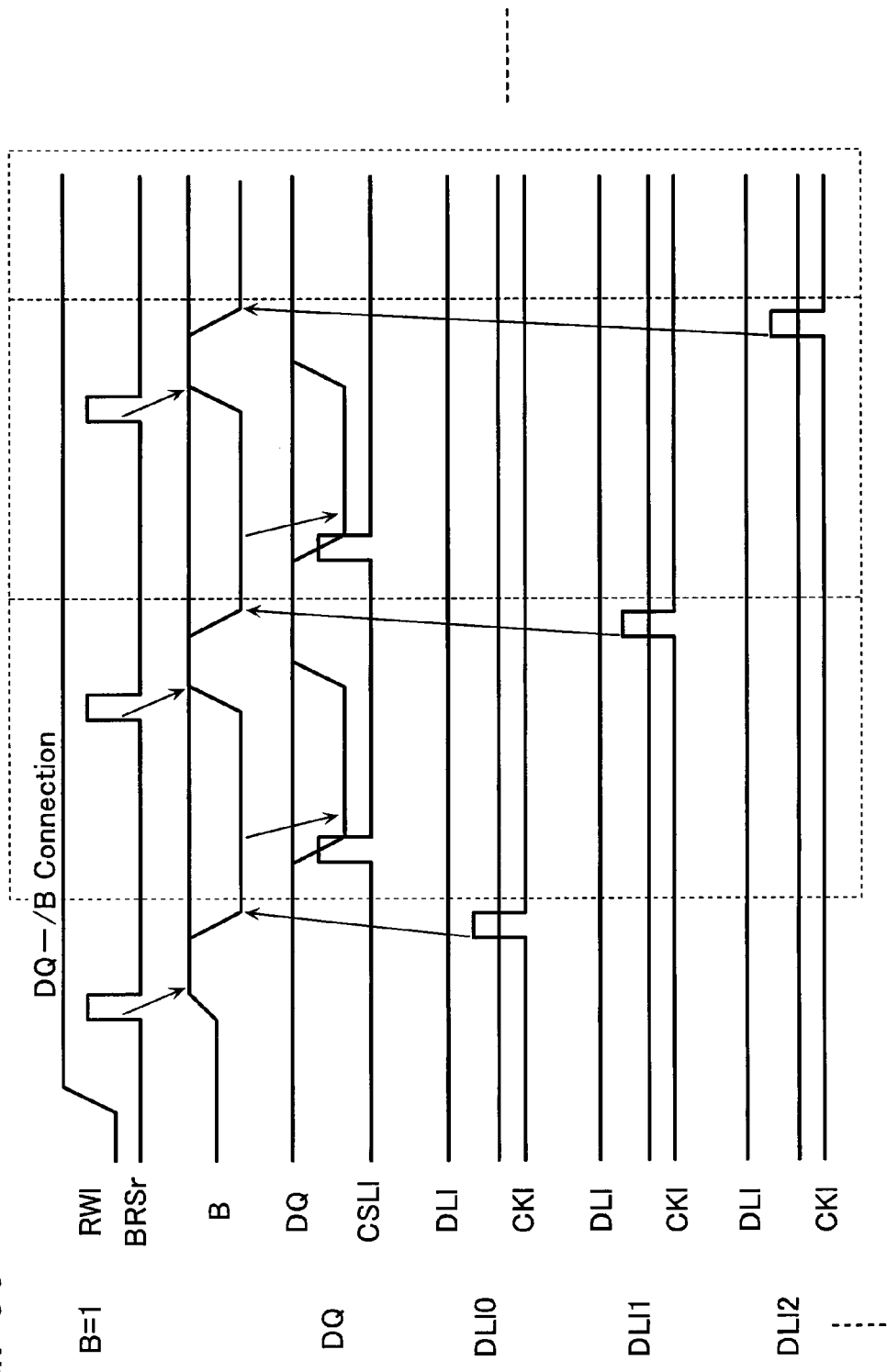
FIG. 56 shows operation waveforms of transferring LB data read in data latch DL1 to data line DQ.

FIG. 56 shows waveforms of the read data outputting operation from data latches DL1 to data line DQ. Data line DQ and node B is coupled to with RWl1="1", and data in data latches (DL10, DL11, DL12, . . . ) are sequentially transferred to data line DQ via node B under the control of CK1. Data line DQ will be reset at "1" at each data transfer time.

Next, the lower bit (LB) read procedure with read voltages R2 and R3 will be explained. In this case also, the information cell data on the bit line BL are read to data latches DL1. However, since LB data has been over-written on HB data, it is required of the send data to be subjected to a certain logic operation.

As understood from FIG. 16, performing XOR operation for sensed data at two sense cycles T2 and T3 with read voltages R2 and R3, respectively, the operation result "0" or "1" becomes LB data. Therefore, the first sense data is, for example, loaded in the right side data latch DLr. XOR operation will be performed between the second sense data and data stored in data latch DLr by use of data latch XL, and the operation result is loaded in the left side data latch DL1.

Note here that it does not matter which of the two LB data read cycles with read voltages R2 and R3 is advanced.

The LB data read operation will be explained below.

Figure 57:
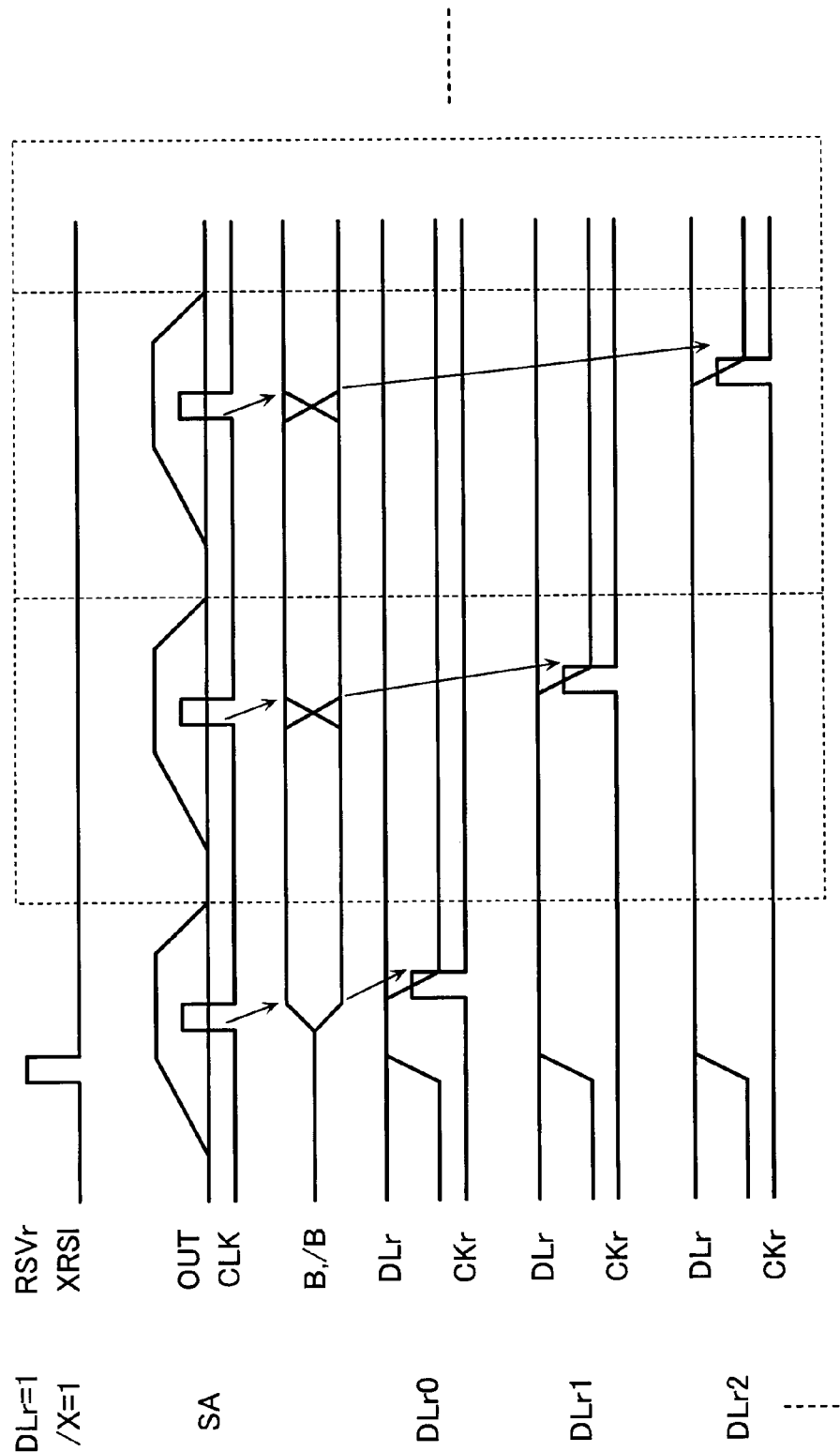
FIG. 57 shows operation waveforms of transferring LB data to data latch DLr.

As a first step, sensed data with either one of read voltages R2 and R3 are loaded in data latches DLr on the right side. FIG. 57 shows waveforms thereof. Firstly, all data latches DLr are reset at "1", and sense amplifier outputs OUT and /OUT are set to be coupled to nodes B and /B, respectively, with /X="1".

After the sensed data being transferred to node B, /B, data latch DLr is opened with CKr="1" to store the inverted sense data. This procedure is repeated for all bit lines, and all data latches (DLr0, DLr1, DLr2, . . . ) sequentially store sensed data.

Figure 58:
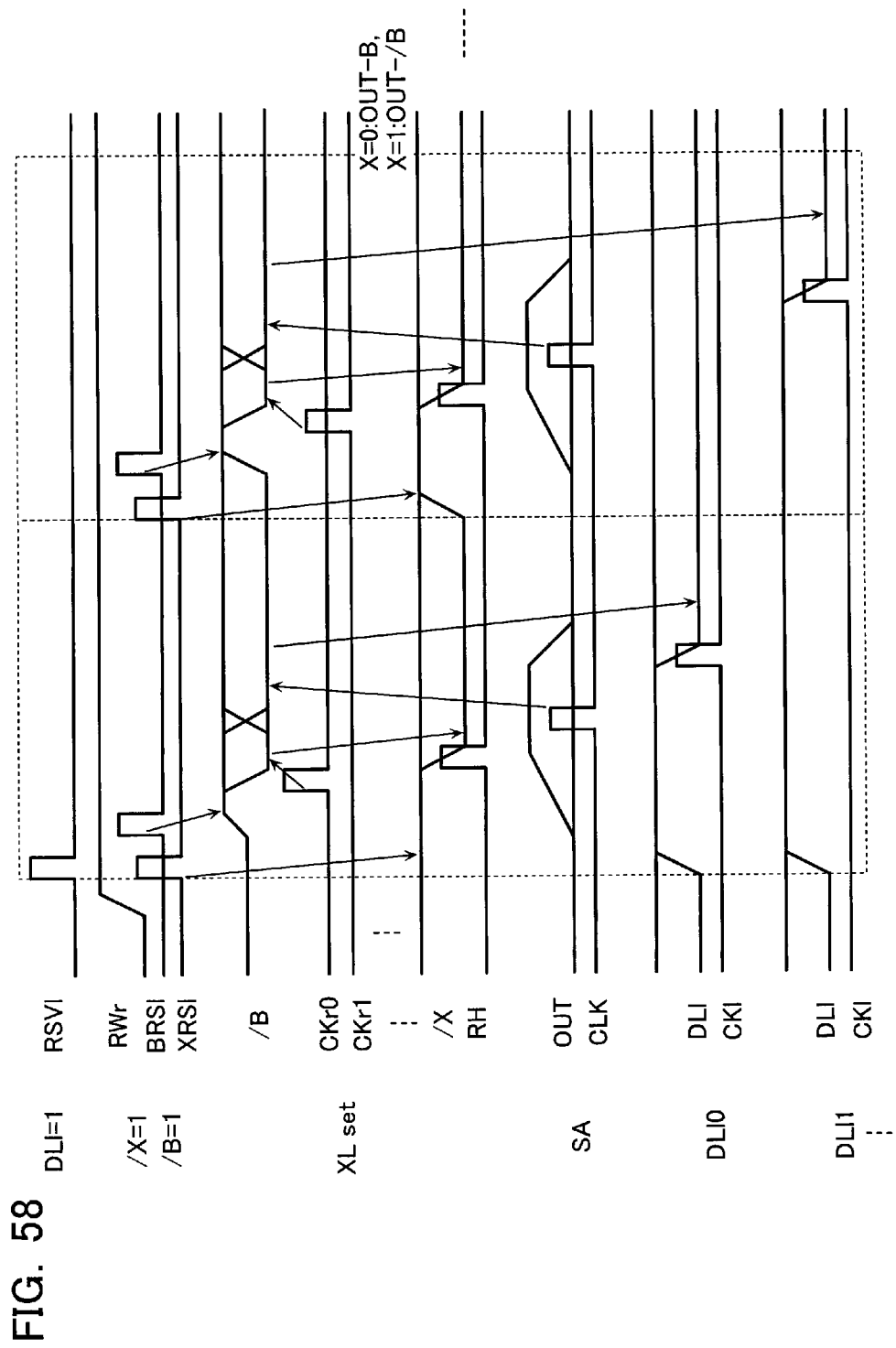
FIG. 58 shows operation waveforms of the second step for taking XOR operation and transferring the result to data latch DL1.

At the second step, data sense is performed with the other of read voltages R2 and R3. The operation waveforms are shown in FIG. 58. XOR logic operations are taken between the sensed data and that obtained at the first step and stored in data latches DLr. To load the operation results in data latches DL1, all data latches DL1 are reset at "1".

To transfer data in data latch DLr to data latch XL via node /B, BRS1 pulse is applied with /X="1" and RWr="1". As a result, node B is discharged while node /B is set at "1". Then data latch DLr is opened with CKr="1" to transfer data therein to node /B, and then it will be written in node /X with RH pulse.

At this time, the sensed data at the first step is stored in node X as one inverted to that in data latch DLr.

In case of X="1", OUT-/B connection is formed while in case of X="0", OUT-B connection is formed. Therefore, transferring the sensed data to node B, /B under the control of data latch XL with clock CLK, the XOR operation result between the sense data at the first and second steps will be obtained at node B, /B. It is repeated for all data latches DL1 such a procedure that data at the node B is loaded in data latch DL1 with CK1="1". Data in the data latches DL1 are output to the external via data line DQ as well as the HB data output described above.

FIG. 59 shows data transition states in the LB data read cycle described above in such a case where read voltage R2 is used at the first step while read voltage R3 is used at the second step. Data read into data latch DLr at the first step with read voltage R2 becomes "1" only when HB=LB="0".

This data in data latch DLr is inverted and transferred to node X. Then, XOR operation result between the sensed data SD at the second step with read voltage R3 and that in node X is loaded in data latch DL1 as LB data.

FIG. 60 shows data transition states in the LB data read cycle in such a case where read voltage R3 is used at the first step while read voltage R2 is used at the second step. Data read into data latch DLr at the first step with read voltage R3 becomes "0" only when HB="1" and LB="0".

This data in data latch DLr is inverted and transferred to node X. Then, XOR operation result between the sensed data SD at the second step with read voltage R2 and that in node X is loaded in data latch DL1 as LB data.

(Page Copy Operation)

It will be explained such a copy operation that data in a page is copy-written into another page. In the example described below, a page data on the bit line BL side cell array is read and copy-written into another page on the bit line /BL side cell array.

Note that a page used here is a physical page, for example, defined as a set of information cells selected with a word line and all bit lines crossing it. Alternatively, a page is defined as a set of information cells selected with a word line and all even numbered bit lines (or all odd numbered bit lines).

The higher bit (HB) data copy will be explained with respect to such a case where all cells in the copy destination page are set at data level L0 (=E). The lower bit (LB) data copy will be explained with respect to such a case that HB data is written in the copy destination page, i.e., cell therein is set at level L2 (=B) or L0 (=E). However, the copy operation is not limited to the above described cases. For example, changing the procedure, it is possible to copy HB data as LB data, or copy LB data as HB data.

In a basic page copy operation, page data is read from a copy source page to be loaded in data latch DL1 on the bit line BL side as write data, and it is written into a copy destination page.

First, an HB data copy operation will be explained below. Since HB data read out the copy source page with read voltage R1 is inverted to be write data, read data is inverted and transferred to data latch DL1.

Figure 61:
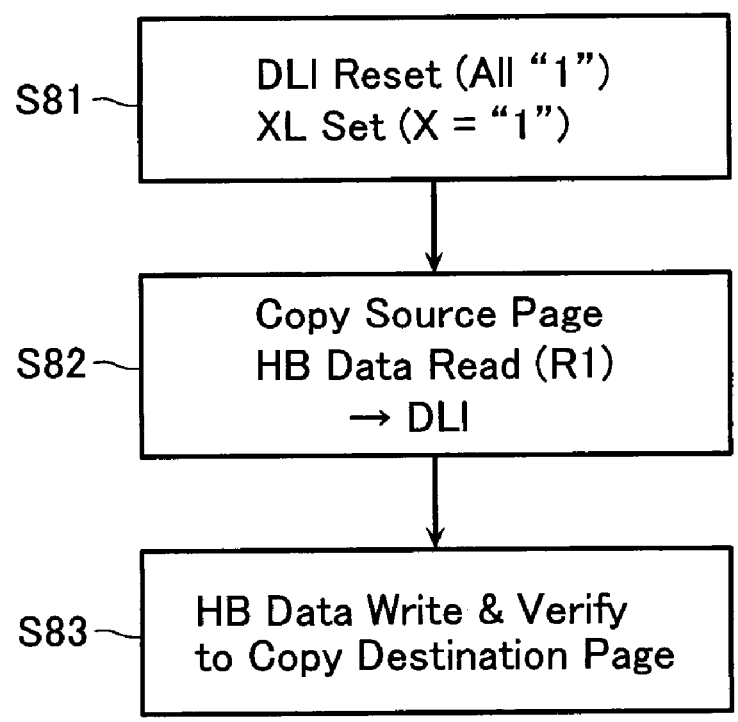
FIG. 61 shows an HB data copy sequence in case of page copy.

Explaining it with reference to FIG. 61, as a preparation for the copy operation, data latches DL1 are reset in an all "1" state. Data latch XL is set at X="1", and it will be set at such a state that the sense amplifier output is inverted and transferred to relaying node B, /B (step S81).

Then, HB data is read from a copy source page with read voltage R1 (step S82). The sensed data is loaded in data latch DL1 with CK1="1" (step S82). Performing this procedure is repeated for all bit lines in the selected page (i.e. for all data latches DL1), copy write data is obtained in data latches DL1.

Then, the write data in data latches is written into a copy destination page, and write-verify is performed (step S83).

Figure 62:
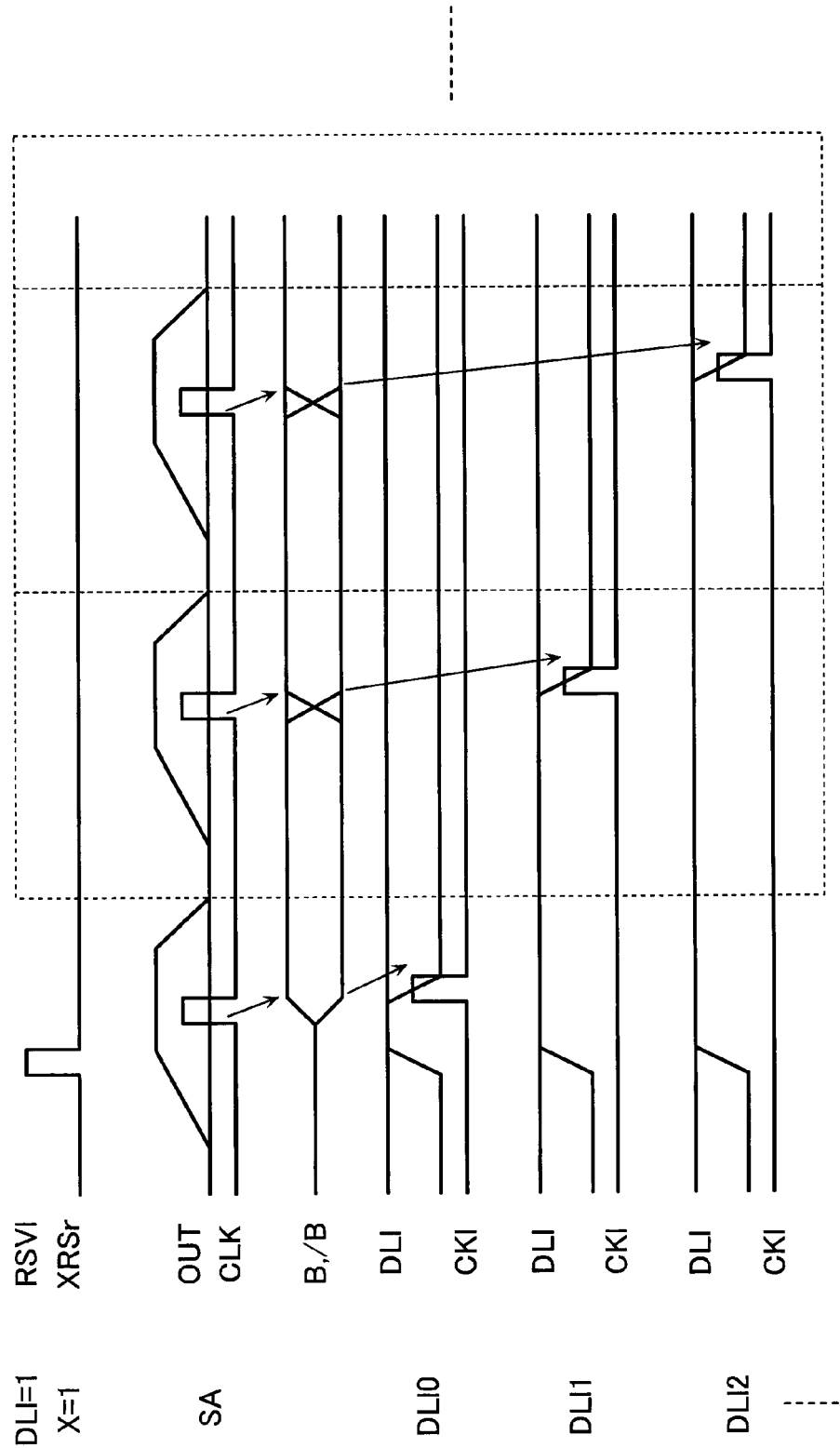
FIG. 62 shows operation waveforms of reading copy source page for HB data copying.

FIG. 62 shows operation waveforms of transferring copy source read data. Sense amplifier outputs OUT and /OUT are coupled to nodes /B and B, respectively, which serve for transferring data together with inverting, with X="1". The sensed data are sequentially transferred to node B, /B with clock CLK, and loaded in data latches DL1 (DL10, DL11, DL12, . . . ).

Next, LB data page copy operation will be explained below. In this case, since LB data in a copy source page is written into a copy destination page with HB data different from that in the copy source page, to obtain write data, it is in need of using HB data of the copy destination page in addition to LB data of the copy source page. LB data will be obtained trough two steps of sense operations and XOR operation like the above-described LB data read operation, and stored in data latches DLr on the right side. Based on data in data latches DLr, write data corresponding to HB data in the copy destination page are stored in data latches DL1 on the left side.

Figure 63:
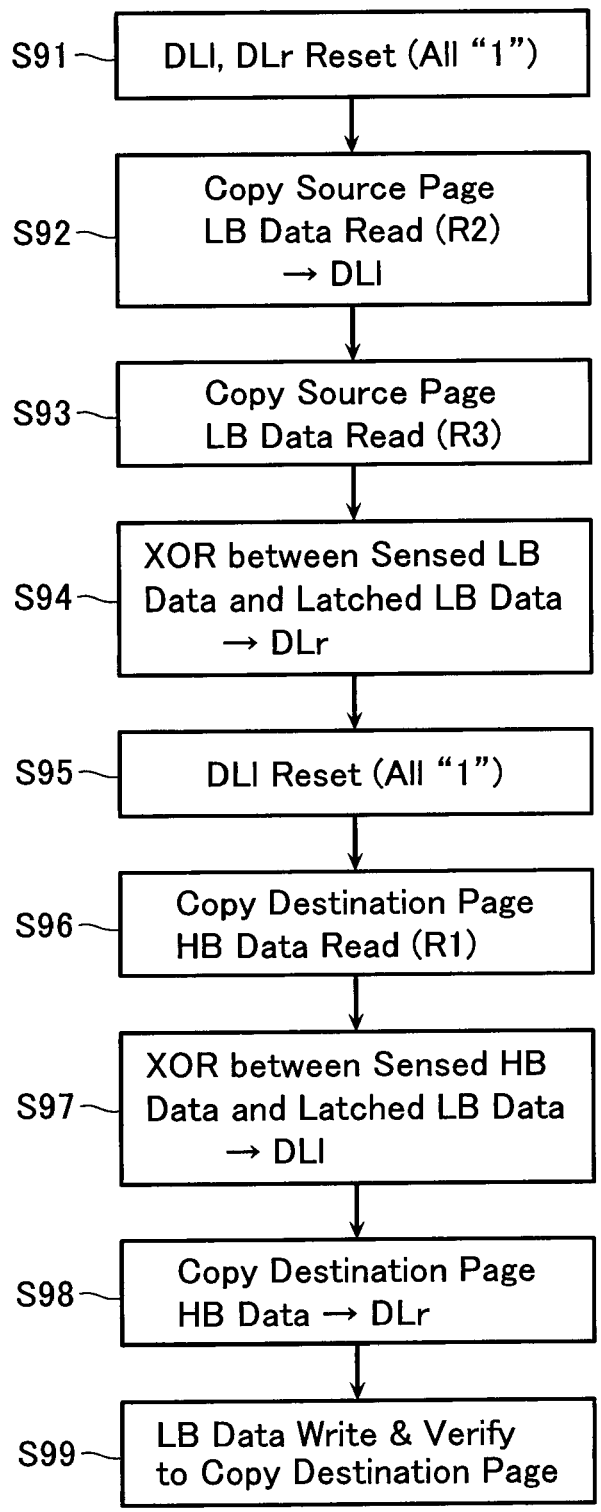
FIG. 63 shows an LB data copy sequence in case of page copy.

It will be explained in detail with reference to FIG. 63. At the copy source LB data read time, data latches DLl and DLr are used as reversed to the case where the normal LB data read is performed.

Initially, data latches DLl and DLr are reset at an all "1" state (step S91). It is required of LB data read to take two steps with read voltages R2 and R3. Here, read voltage R2 is used at the first step. That is, LB data read is performed for the copy source page, and read data will be loaded in data latches DLl (step S92).

Data latch XL is set at X="1", and it will be set at such a state that the sense amplifier output is inverted and transferred to relaying node B, /B. The sensed data is loaded in data latch DLl with CKl="1". Performing this procedure is repeated for all bit lines.

Figure 64:
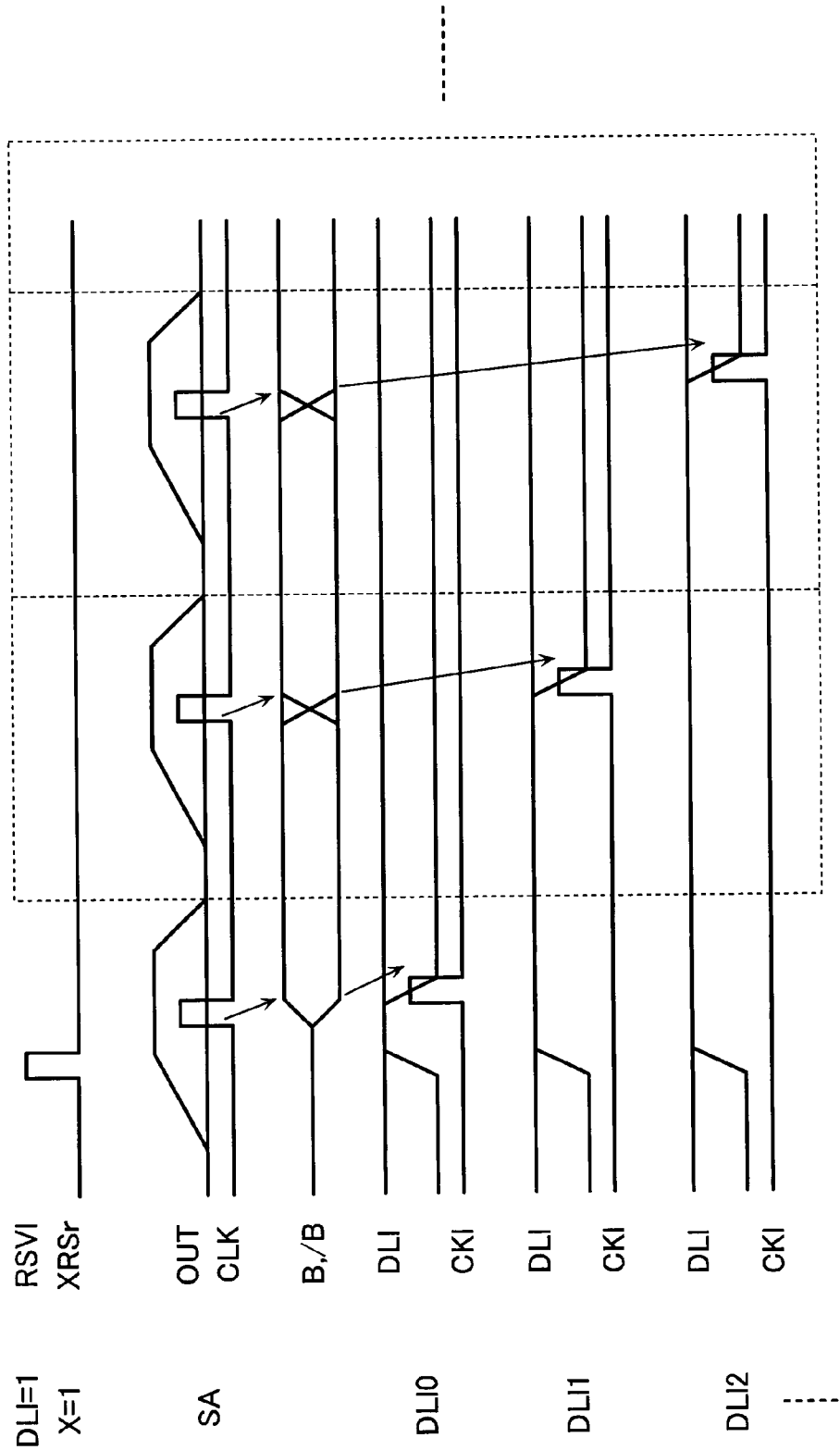
FIG. 64 shows operation waveforms of reading copy source LB data to data latch DL1 at the first read step.

FIG. 64 shows operation waveforms of the LB data read at the first step. Read LB data are sequentially inverted and transferred to data latches DLl (DLl0, DLl1, DLl2, . . . ).

At the second step, LB data read of the copy source page is performed with read voltage R3 (step S93). The sensed data are loaded in data latches DLr. In this case, XOR operation is taken between the sensed data and data inverted to those stored in data latches DLl, and the operation results are loaded in data latches DLr (step S94).

For this purpose, to transfer data in data latch DLl to data latch XL via node B, X is set at "1", and RWl="1" is set, and BRSl pulse is applied. As a result, node /B is discharged while node B is set at "1". Opening data latch DLl with CKl="1", data therein will be transferred to node B, and written in node X with RH pulse.

At this time, the sensed data at the first step is present at node /X. If X="1", sense amplifier output is inverted and transferred to node B, /B while if X="0", as it is, and LB data as a result of the XOR operation is present at node /B. The LB data is loaded in data latch DLr with clock CKr="1". This procedure is repeated for all data latches DLr.

Figure 65:
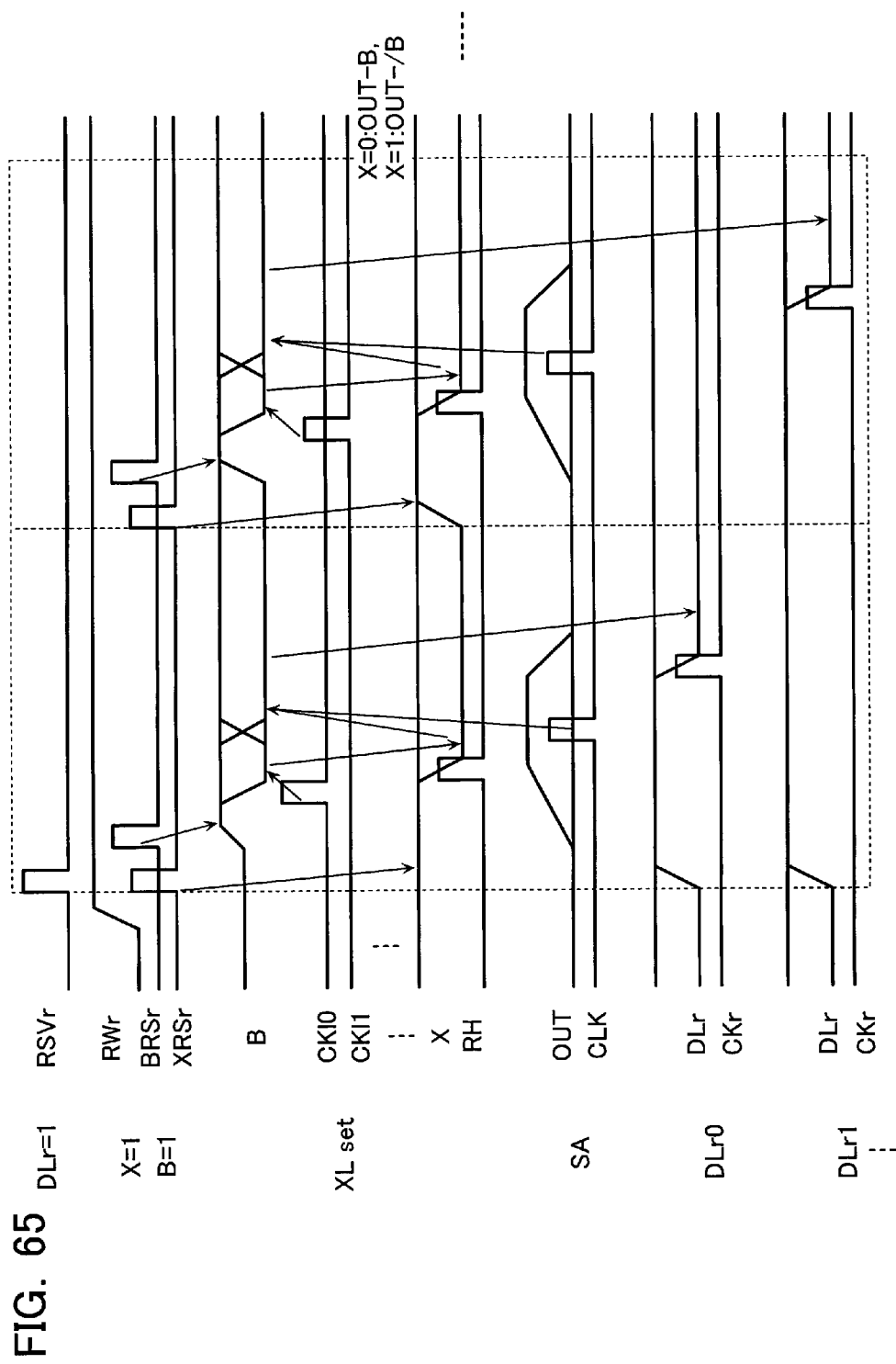
FIG. 65 shows operation waveforms of taking XOR operation and transferring the result to data latch DLr at the second read step.

FIG. 65 shows waveforms of the XOR operation of two sense data and transferring the operation result to data latches DLr. Data in data latches are sequentially transferred to data latch XL, which controls the sequentially sensed data transferring, so that the XOR operation results are stored in data latches DLr (DLr0, DLr1, DLr2, . . . ).

Next, data latches DLl are reset at an all "1" state (step S95), and then HB data of the copy destination page is read out with read voltage R3 (step S96). These read data and data in data latches DLr are subjected to XOR operation to generate write data, which are stored in data latches DLl (step S97).

Figure 66:
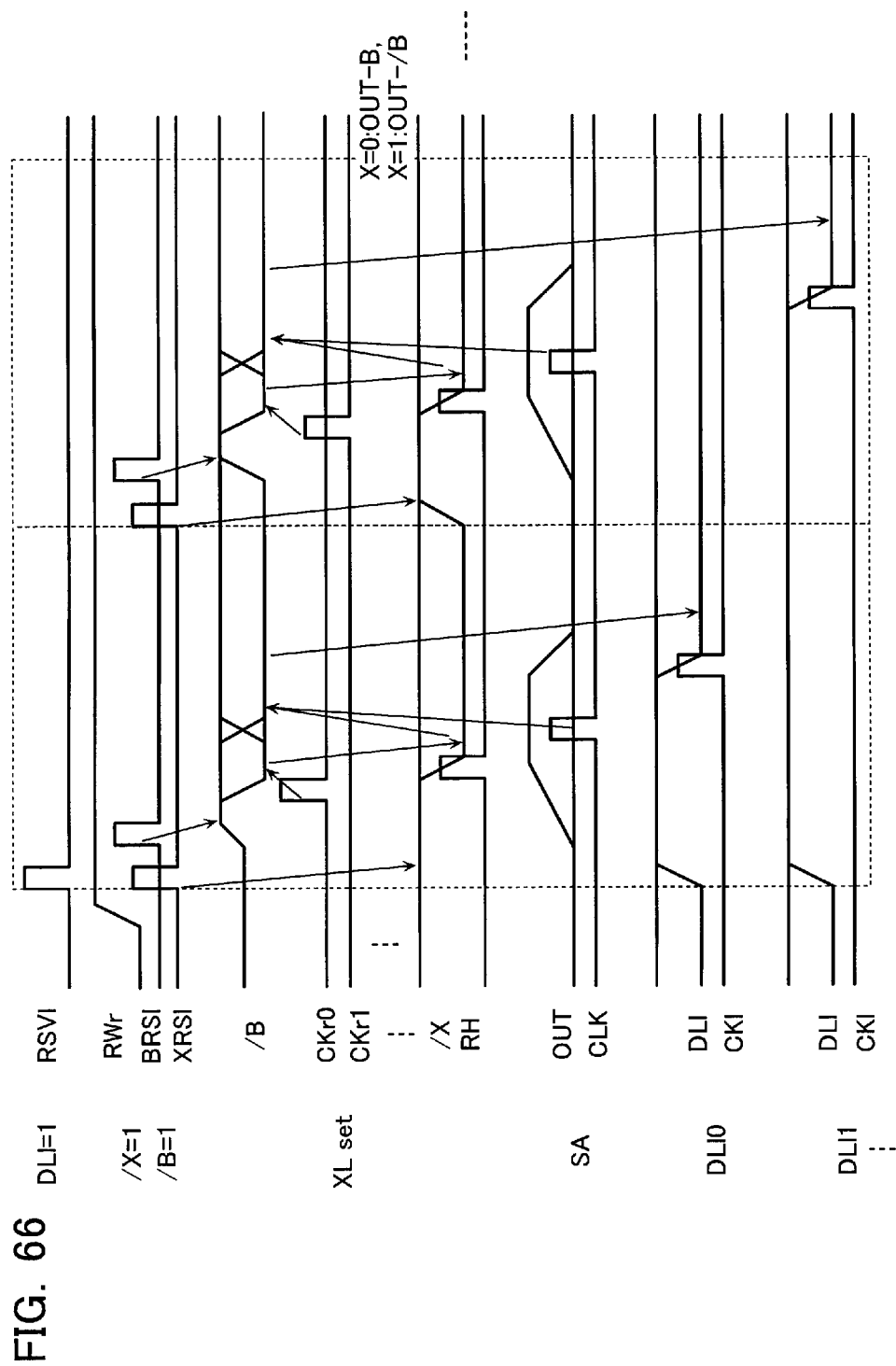
FIG. 66 shows operation waveforms of transferring copy-write data to data latch DL1 under the control of HB data.

Explaining it with reference to FIG. 66, which shows waveforms, to transfer data in data latch DLr to data latch XL via node /B, /X is set at "1". Applying BRSl pulse with RWr="1", node B is discharged while node /B is set at "1".

Here, opening data latch DLr with CKr="1", data therein is transferred to node /B. Applying RH pulse, LB data of data latch DLr is written into node /X.

At this state, if /X="1", sense amplifier output is coupled to node B, /B as it is while if /X="0", the sense data is inverted and transferred to node B, /B. Therefore, the XOR operation result between sensed data and that in node X is obtained at node B.

Then, transferring HB data of the copy destination page to node B, /B, write data is obtained at node B, which is an XOR operation result between inverted LB data and HB data. That is, if HB="1", LB "1" is such a case that shifts the threshold voltage to level A, so that data latch DLl becomes "1". By contrast, if HB="0", LB "0" is such a case that shifts the threshold voltage to level C, so that data latch DLl becomes "1".

Applying sequentially CKl="1", write data are written into all data latches DLl (step S97).

Since LB data of the copy source are held in data latches DLr, HB data of the copy destination page will be written into them (step S98). At this time, to-be-written HB data states in data latches DLr are different in accordance with how write-verify is performed.

For example, to perform a normal LB data write or A-QPW, HB data is stored as it is in data latch DLr. For the purpose, sense amplifier outputs are coupled to node B and /B with X="1", so that sensed data is transferred as it is. In case of C-QPW, HB data is inverted and transferred to data latch DLr with X="0".

Figure 67:
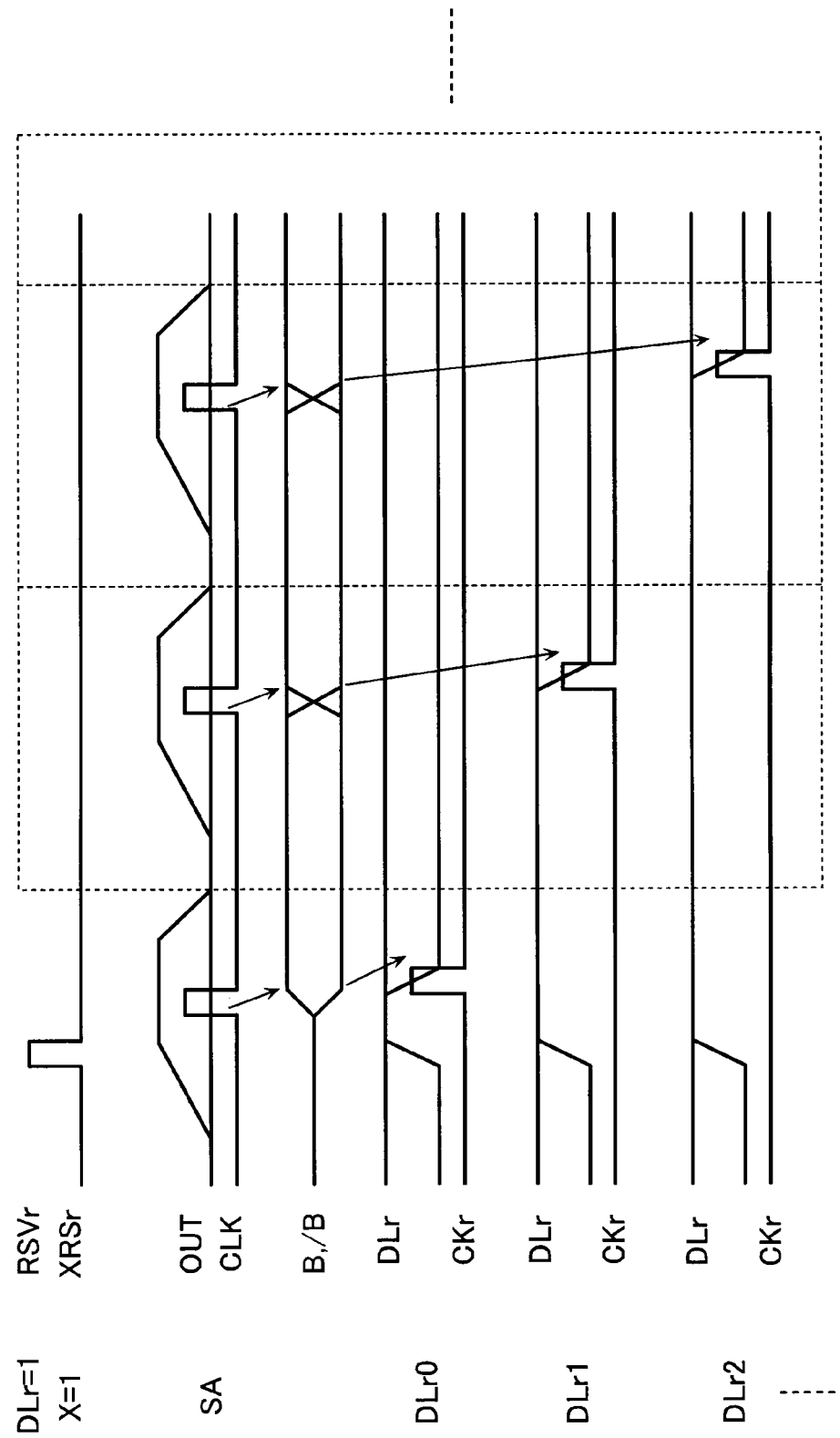
FIG. 67 shows operation waveforms of transferring HB data to data latch DLr.
Figures 68, 69:
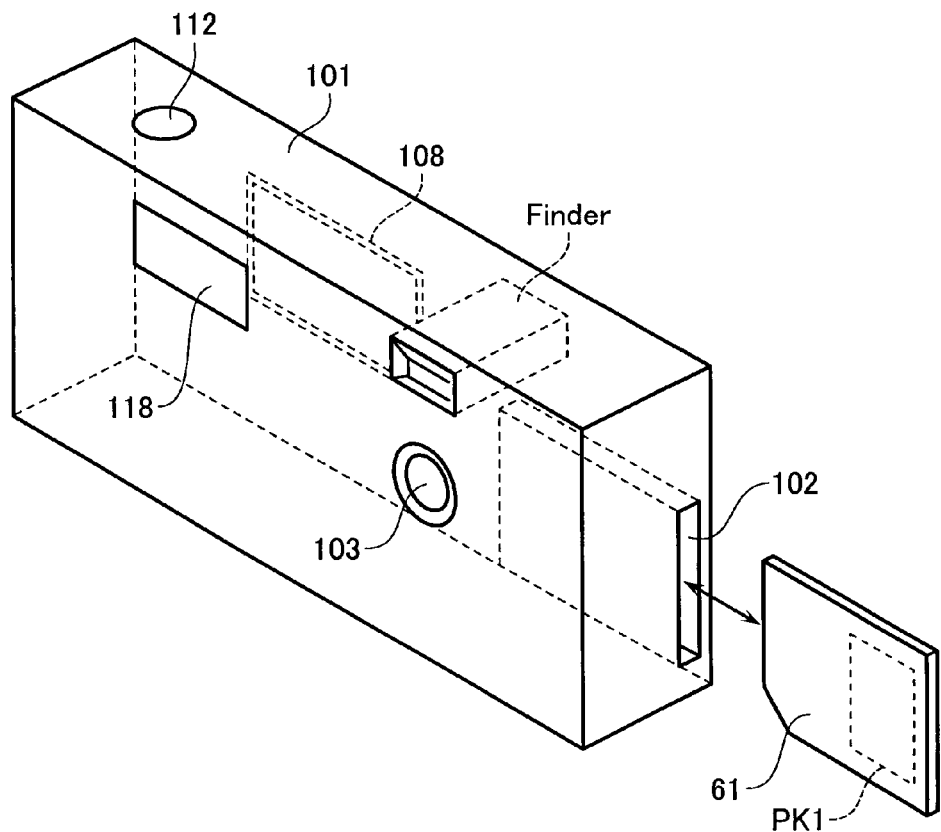
FIG. 68 shows a situation where copy source LB data are inverted in part and written in data latch DL1 as write data.
FIG. 69 shows another embodiment applied to a digital still camera.

FIG. 67 shows waveforms of sequentially loading HB data of the copy destination page into data latches DLr. In addition, FIG. 68 shows a situation where LB data of the copy source are inverted in part and written into data latches DLl as write data.

After that, write and write-verify are performed for the copy destination page (step S99).

(Application Devices)

As an embodiment, an electric card using the non-volatile semiconductor memory devices according to the above-described embodiments of the present invention and an electric device using the card will be described bellow.

FIG. 69 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PKl in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 70:
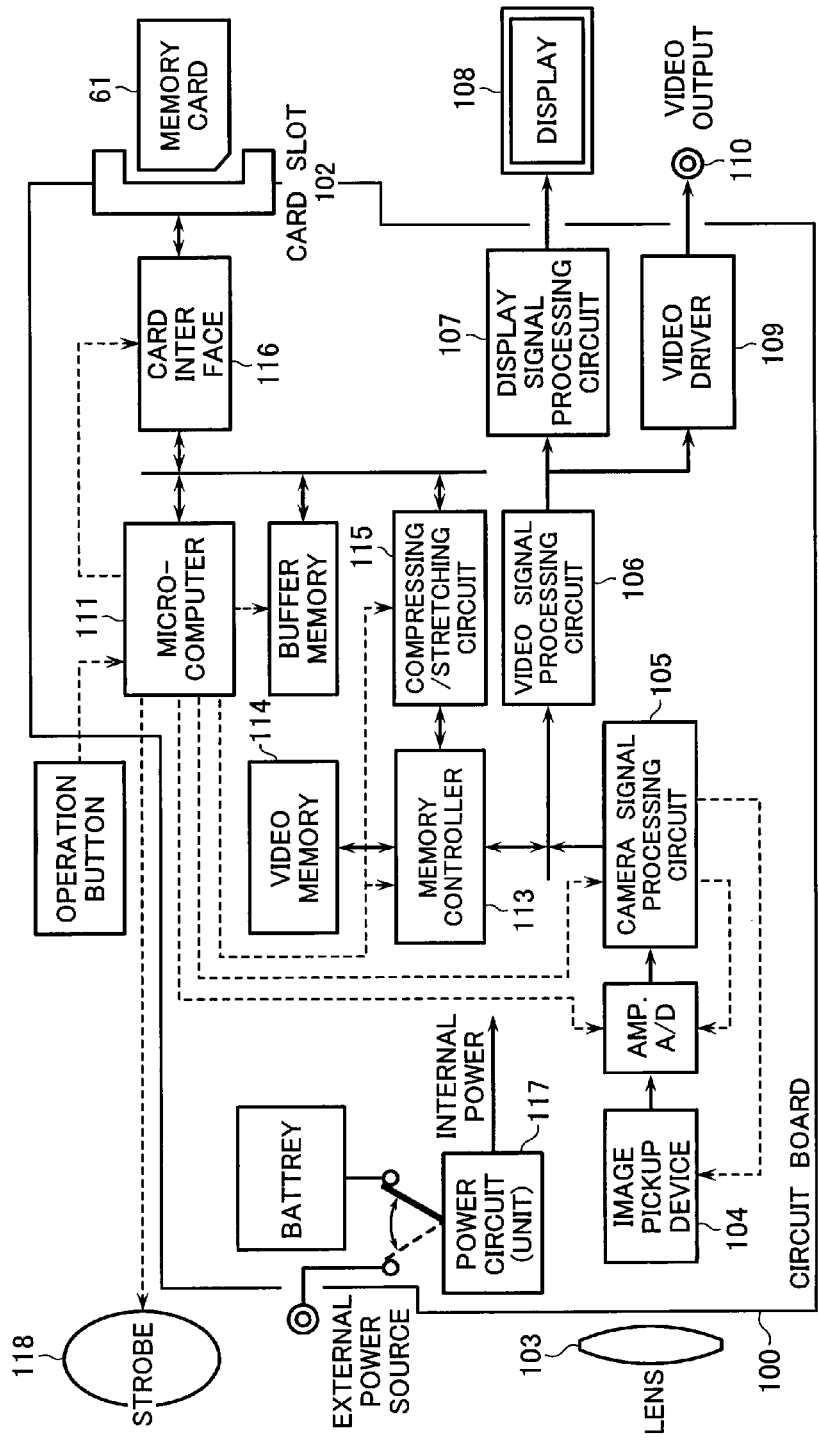
FIG. 70 shows the internal configuration of the digital still camera.

FIG. 70 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

Figure 71A:
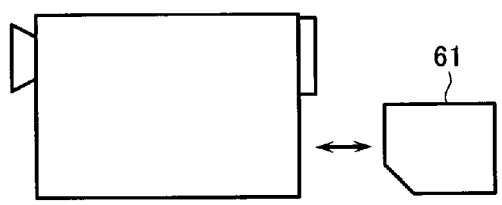
FIGS. 71A to 71J show other electric devices to which the embodiment is applied.
Figure 71F:
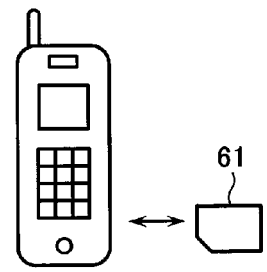
Figure 71B:
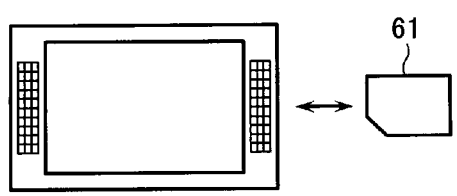
Figure 71G:
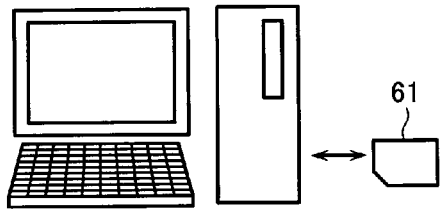
Figure 71C:
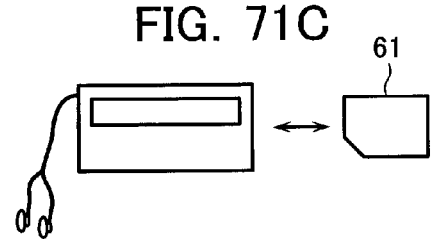
Figure 71H:
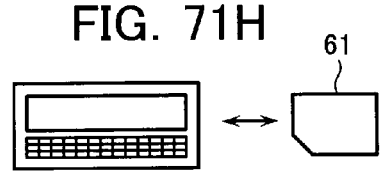
Figure 71D:
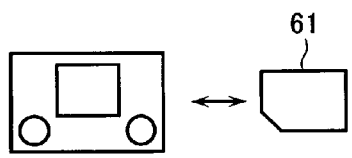
Figure 71I:
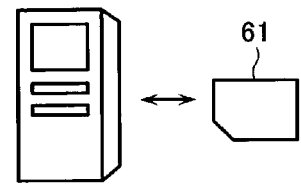
Figure 71E:
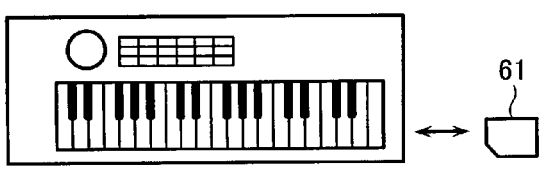
Figure 71J:
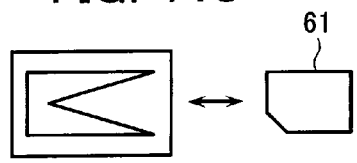

As described above, the electric card according to this embodiment can be used in portable electric devices such as the digital still camera explained above. However, the electric card can also be used in various apparatus such as shown in FIGS. 19A to 19J, as well as in portable electric devices. That is, the electric card can also be used in a video camera shown in FIG. 71A, a television set shown in FIG. 71B, an audio apparatus shown in FIG. 71C, a game apparatus shown in FIG. 71D, an electric musical instrument shown in FIG. 71E, a cell phone shown in FIG. 71F, a personal computer shown in FIG. 71G, a personal digital assistant (PDA) shown in FIG. 71H, a voice recorder shown in FIG. 71I, and a PC card shown in FIG. 71J.

The present invention is not limited to the above-described embodiments. It will be understood by those skilled in the art that various changes in form and detail may be made without departing from the spirit, scope, and teaching of the invention.

What is claimed is:

1. A semiconductor memory device comprising: a memory cell array with electrically rewritable memory cells arranged therein, the memory cells being defined as information cells and reference cells in which a data level and a reference level are set, respectively; and a sense amplifier configured to sense data stored in the memory cell array, wherein the sense amplifier comprises:
   a latch-type of differential amplifier configured to detect a current difference between a selected information cell and a selected reference cell in the memory cell array;
   a pair of transistors attached to the differential amplifier, the pair of transistors being on-driven to keep the differential amplifier inactive in a stationary state and off-driven to make the differential amplifier active at a sensing time, whereby the current difference is amplified as a drain voltage difference of the pair of transistors; and
   a pair of capacitors coupled to the pair of transistors to hold voltages corresponding to the respective currents of two current paths of the differential amplifier prior to inputting the current difference, and apply a certain offset voltage to the pair of transistors at the sensing time.

2. The semiconductor memory device according to claim 1, wherein
   the memory cell array comprises first and second cell arrays, in each of which main parts and others are defined as the information cells and the reference cells, respectively, and wherein
   cell currents of an information cell and a reference cell, which are selected from one of the first and second cell arrays and the other, respectively, are input to the sense amplifier.

3. The semiconductor memory device according to claim 2, wherein
   the first and second cell arrays have a plurality of first bit lines and second bit lines arranged therein, respectively, and the first and second bit lines constitute a plurality of bit line pairs, which share the sense amplifier, and wherein
   the bit line pairs are sequentially selected to be coupled to the sense amplifier at a data read time.

4. The semiconductor memory device according to claim 1, wherein
   the differential amplifier comprises:
   a CMOS latch formed of two CMOS inverters with input and output nodes thereof being cross-coupled to each other, each of which has two PMOS transistors on the side of the power supply node;
   a pair of activation PMOS transistors each disposed in series to the two PMOS transistors in the CMOS inverters; and
   a pair of transferring transistors coupled to the connection nodes between the two PMOS transistors in the CMOS inverters for supplying an information cell current and a reference cell current to the CMOS latch, and wherein
   the pair of transistors are formed of first NMOS transistors with a common gate coupled to a sense signal input node, the drains of which are coupled to the respective input nodes of the CMOS inverters, the first NMOS transistors being turned off after the activation PMOS transistors are turned on, and the pair of capacitors are disposed between the sources of the first NMOS transistors and the sense signal input node, and wherein
   the sense amplifier further comprises a pair of second NMOS transistors disposed between the sources of the first NMOS transistors and the ground potential node to be driven simultaneously with the first NMOS transistors.

5. The semiconductor memory device according to claim 4, wherein
   the sense amplifier further comprises a pair of conductance controlling transistors disposed between the activation PMOS transistors and the CMOS inverters.

6. The semiconductor memory device according to claim 3 further comprising:
- first and second data relaying nodes disposed corresponding to the sense amplifier;
- first and second data registers disposed corresponding to the first and second bit lines, respectively, write data sequentially supplied via the first and second data relaying nodes being loaded in the first data registers or the second data registers;
- a transfer control circuit configured to transfer the output of the sense amplifier to the first or second data relaying node as it is or as inverted; and
- an input/output circuit configured to receive/transmit data between the first or second data relaying node and a data line.

7. The semiconductor memory device according to claim 6, wherein
- at a data write time with respect to a plurality of the information cells selected in the first or second cell array, write data supplied serially via the input/output circuit are sequentially loaded in the first or second data registers via the first or second data relaying node, and the write data are collectively transferred to the first bit lines or the second bit lines and then written into the plurality of the information cells simultaneously; and
- at a verify-read time after data writing, data on the bit line pairs are sequentially sensed by the sense amplifier, and sensed results thereof are fed back to the first or second data registers via the first or second data relaying node.

8. The semiconductor memory device according to claim 6, wherein
- the memory device is defined by such a four-level data storage scheme that an information cell stores either one of four data levels L0, L1, L2 and L3 (where L0<L1<L2<L3), and wherein
- an upper bit write sequence of four-level data includes write and verify-read cycles repeatedly performed based on write data stored in the first or second data resisters, the write data being subjected to feedback control in such a manner that the write data are rewritten in accordance with the verify-read result to become finally a data state designating a write completion.

9. The semiconductor memory device according to claim 6, wherein
- the memory device is defined by such a four-level data storage scheme that an information cell stores either one of four data levels L0, L1, L2 and L3 (where L0<L1<L2<L3), and wherein
- a lower bit write sequence of four-level data includes write and verify-read cycles repeatedly performed based on to-be-written lower bit data stored in one of the first or second data resisters and upper bit data stored in the other, and wherein
- the verify-read cycle includes a first verify step, in which verify-read voltage P2 is used for verifying data level L3 and the to-be-written lower bit data stored in one of the first and second data registers are rewritten in accordance with verify-read result, and a second verify step, in which verify-read voltage P3 is used for verifying data level L1 and the to-be-written lower bit data stored in one of the first and second data registers are rewritten in accordance with verify-read result and the upper bit data, the to-be-written lower bit data in the data registers being subjected to feedback control in such a manner that they are rewritten to become finally a data state designating a write completion.

10. The semiconductor memory device according to claim 6, wherein
- each of the first and second data registers is so formed that first and second data nodes thereof have an asymmetric property for receiving/transmitting data.

11. The semiconductor memory device according to claim 9, wherein
- the verify-read cycle further includes a third verify step, in which verify-read voltage P2* or P3* set to be lower than the target verify-read voltage P2 or P3 is used for verifying a data level near data level L3 or L1, and wherein
- bit line voltage control is performed in accordance with the verify-read result obtained through the first to third verify-steps in such a manner that the write condition of an information cell near the target data level is relaxed hereinafter.

12. The semiconductor memory device according to claim 2, wherein
- a plurality of the information cells and a plurality of the reference cells are connected in series to constitute NAND cell strings, respectively, in each the first and second cell array, and
- a plurality of information cell blocks and at least one reference cell block are disposed in each of the first and second cell arrays, each cell block including multiple NAND strings arranged therein.

13. A semiconductor memory device comprising: a first and second cell arrays with electrically rewritable memory cells arranged therein, main parts of each cell array being defined as information cells and others as reference cells; a sense amplifier disposed for plural bit line pairs of first and second bit lines in the first and second cell arrays to sequentially sense data of the bit line pairs; first and second data registers configured to store write data to be written into the first and second cell array; and first and second data relaying nodes disposed for serially transferring write data to the first or second data registers from the external, and for serially transferring data sequentially read in the sense amplifier from the bit line pairs to the external, wherein
the sense amplifier comprises:
- a latch-type of differential amplifier configured to detect a current difference between a selected information cell and a selected reference cell in the memory cell array;
- a pair of transistors attached to the differential amplifier, the pair of transistors being on-driven to keep the differential amplifier inactive in a stationary state and off-driven to make the differential amplifier active at a sensing time, whereby the current difference is amplified as a drain voltage difference of the pair of transistors; and
- a pair of capacitors coupled to the pair of transistors to hold voltages corresponding to the respective currents of two current paths of the differential amplifier prior to inputting the current difference, and apply a certain offset voltage to the pair of transistors at the sensing time.

14. The semiconductor memory device according to claim 13, wherein
the differential amplifier comprises:
- a CMOS latch formed of two CMOS inverters with input and output nodes thereof being cross-coupled to each other, each of which has two PMOS transistors on the side of the power supply node;
- a pair of activation PMOS transistors each disposed in series to the two PMOS transistors in the CMOS inverters; and
- a pair of transferring transistors coupled to the connection nodes between the two PMOS transistors in the CMOS inverters for supplying an information cell current and a reference cell current to the CMOS latch, and wherein the pair of transistors are formed of first NMOS transistors with a common gate coupled to a sense signal input node, the drains of which are coupled to the respective input nodes of the CMOS inverters, the first NMOS transistors being turned off after the activation PMOS transistors are turned on, and the pair of capacitors are disposed between the sources of the first NMOS transistors and the sense signal input node, and wherein the sense amplifier further comprises a pair of second NMOS transistors disposed between the sources of the first NMOS transistors and the ground potential node to be driven simultaneously with the first NMOS transistors.

15. The semiconductor memory device according to claim 14, wherein the sense amplifier further comprises a pair of conductance controlling transistors disposed between the activation PMOS transistors and the CMOS inverters.

16. The semiconductor memory device according to claim 13 further comprising:

a transfer control circuit configured to transfer the output of the sense amplifier to the first or second data relaying node as it is or as inverted; and an input/output circuit configured to receive/transmit data between the first or second data relaying node and a data line.

17. The semiconductor memory device according to claim 16, wherein at a data write time with respect to a plurality of the information cells selected in the first or second cell array, write data supplied serially via the input/output circuit are sequentially loaded in the first or second data registers via the first or second data relaying node, and the write data are collectively transferred to the first bit lines or the second bit lines and then written into the plurality of the information cells simultaneously; and at a verify-read time after data writing, data on the bit line pairs are sequentially sensed by the sense amplifier, sensed results thereof being fed back to the first or second data registers via the first or second data relaying node.

18. The semiconductor memory device according to claim 13, wherein the memory device is defined by such a four-level data storage scheme that an information cell stores either one of four data levels L0, L1, L2 and L3 (where L0<L1<L2<L3), and wherein an upper bit write sequence of four-level data includes write and verify-read cycles repeatedly performed based on write data stored in the first or second data resisters, the write data being subjected to feedback control in such a manner that the write data are rewritten in accordance with the verify-read result to become finally a data state designating a write completion.

19. The semiconductor memory device according to claim 13, wherein the memory device is defined by such a four-level data storage scheme that an information cell stores either one of four data levels L0, L1, L2 and L3 (where L0<L1<L2<L3), and wherein a lower bit write sequence of four-level data includes write and verify-read cycles repeatedly performed based on to-be-written lower bit data stored in one of the first or second data resisters and upper bit data stored in the other, and wherein the verify-read cycle includes a first verify step, in which verify-read voltage P2 is used for verifying data level L3 and the to-be-written lower bit data stored in one of the first and second data registers are rewritten in accordance with verify-read result, and a second verify step, in which verify-read voltage P3 is used for verifying data level L1 and the to-be-written lower bit data stored in one of the first and second data registers are rewritten in accordance with verify-read result and the upper bit data, the to-be-written lower bit data in the data registers being subjected to feedback control in such a manner that they are rewritten to become finally a data state designating a write completion.

20. The semiconductor memory device according to claim 13, wherein each of the first and second data registers is so formed that first and second data nodes thereof have an asymmetric property for receiving/transmitting data.

* * * * *